(12) United States Patent
Kurokawa et al.

(10) Patent No.: US 12,068,339 B2
(45) Date of Patent: Aug. 20, 2024

(54) IMAGING DEVICE AND ELECTRONIC DEVICE

(71) Applicant: Semiconductor Energy Laboratory Co., Ltd., Atsugi (JP)

(72) Inventors: Yoshiyuki Kurokawa, Sagamihara (JP); Tatsunori Inoue, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 363 days.

(21) Appl. No.: 16/606,906

(22) PCT Filed: Apr. 20, 2018

(86) PCT No.: PCT/IB2018/052743
§ 371 (c)(1),
(2) Date: Oct. 21, 2019

(87) PCT Pub. No.: WO2018/203169
PCT Pub. Date: Nov. 8, 2018

(65) Prior Publication Data
US 2020/0382730 A1 Dec. 3, 2020

(30) Foreign Application Priority Data

May 2, 2017 (JP) ................. 2017-091864

(51) Int. Cl.
*H01L 27/146* (2006.01)
*G06N 3/045* (2023.01)
(Continued)

(52) U.S. Cl.
CPC ....... *H01L 27/14609* (2013.01); *G06N 3/045* (2023.01); *G06N 3/088* (2013.01);
(Continued)

(58) Field of Classification Search
CPC ........ G06N 3/0454; G06N 3/08; G06N 3/063; G06N 3/04; G06N 3/0635
See application file for complete search history.

(56) References Cited

U.S. PATENT DOCUMENTS

| 5,815,608 | A | 9/1998 | Lange et al. |
| 7,369,162 | B2 | 5/2008 | Yagi et al. |

(Continued)

FOREIGN PATENT DOCUMENTS

| CA | 2459220 | 3/2003 |
| EP | 1435588 A | 7/2004 |

(Continued)

OTHER PUBLICATIONS

International Search Report (Application No. PCT/IB2018/052743) Dated Jun. 19, 2018.

(Continued)

*Primary Examiner* — Tony Tran
(74) *Attorney, Agent, or Firm* — Eric J. Robinson; Robinson Intellectual Property Law Office, P.C.

(57) ABSTRACT

An imaging device with reduced power consumption is provided.
The imaging device includes an imaging portion and an encoder. First image data obtained by the imaging portion is transmitted to the encoder. The encoder includes a first circuit that forms a neural network, and the first circuit conducts feature extraction by the neural network on a first image to generate second image data. Note that since the first circuit has a function of performing convolution processing using a weight filter, the encoder can perform computation with a convolutional neural network.

9 Claims, 38 Drawing Sheets

(51) Int. Cl.
  *G06N 3/088* (2023.01)
  *G06V 10/44* (2022.01)
  *H01L 27/12* (2006.01)
  *H01L 29/786* (2006.01)
  *H04N 25/76* (2023.01)
  *H10B 99/00* (2023.01)

(52) U.S. Cl.
  CPC ........ *G06V 10/454* (2022.01); *H01L 27/1207* (2013.01); *H01L 27/1211* (2013.01); *H01L 27/1225* (2013.01); *H01L 27/124* (2013.01); *H01L 27/1255* (2013.01); *H01L 29/78648* (2013.01); *H01L 29/7869* (2013.01); *H04N 25/76* (2023.01); *H10B 99/00* (2023.02)

(56) References Cited

U.S. PATENT DOCUMENTS

| | | | |
|---|---|---|---|
| 8,378,391 | B2 | 2/2013 | Koyama et al. |
| 8,916,869 | B2 | 12/2014 | Koyama et al. |
| 9,331,112 | B2 | 5/2016 | Koyama et al. |
| 9,773,814 | B2 | 9/2017 | Koyama et al. |
| 9,876,946 | B2 | 1/2018 | Ikeda |
| 10,141,069 | B2 | 11/2018 | Ikeda et al. |
| 2005/0062853 | A1 | 3/2005 | Yagi et al. |
| 2015/0324685 | A1 | 11/2015 | Bohn et al. |
| 2016/0343452 | A1* | 11/2016 | Ikeda ................... G11C 27/024 |
| 2017/0118479 | A1* | 4/2017 | Kurokawa ............. H04N 19/43 |
| 2017/0337466 | A1* | 11/2017 | Bayat ..................... G06F 3/0655 |
| 2019/0164620 | A1 | 5/2019 | Ikeda et al. |

FOREIGN PATENT DOCUMENTS

| | | |
|---|---|---|
| EP | 2497111 B | 3/2016 |
| EP | 3051588 A | 8/2016 |
| JP | 02-141087 A | 5/1990 |
| JP | 02-202777 A | 8/1990 |
| JP | 02-280589 A | 11/1990 |
| JP | 09-282466 A | 10/1997 |
| JP | 10-294899 A | 11/1998 |
| JP | 2003-078829 A | 3/2003 |
| JP | 2007-276052 A | 10/2007 |
| JP | 2011-119711 | 6/2011 |
| JP | 2016-219011 A | 12/2016 |
| JP | 2017-034677 A | 2/2017 |
| JP | 2017-130195 A | 7/2017 |
| WO | WO-2003/023712 | 3/2003 |
| WO | WO-2011/055626 | 5/2011 |

OTHER PUBLICATIONS

Written Opinion (Application No. PCT/IB2018/052743) Dated Jun. 19, 2018.

* cited by examiner

90

200

200

200

FIG. 37A1
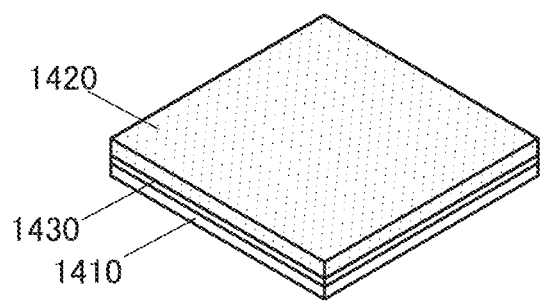
FIG. 37B1
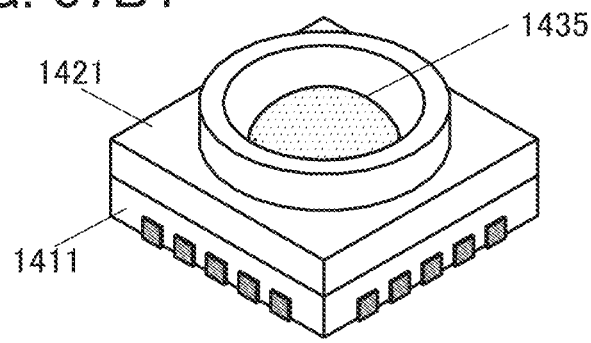
FIG. 37A2
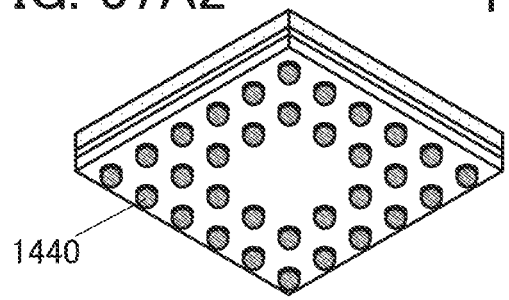
FIG. 37B2
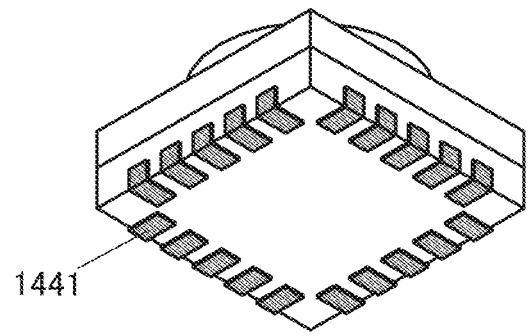
FIG. 37A3
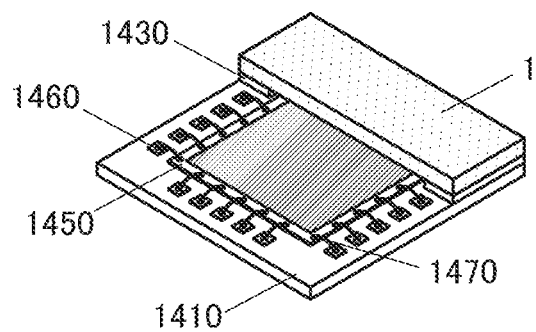
FIG. 37B3
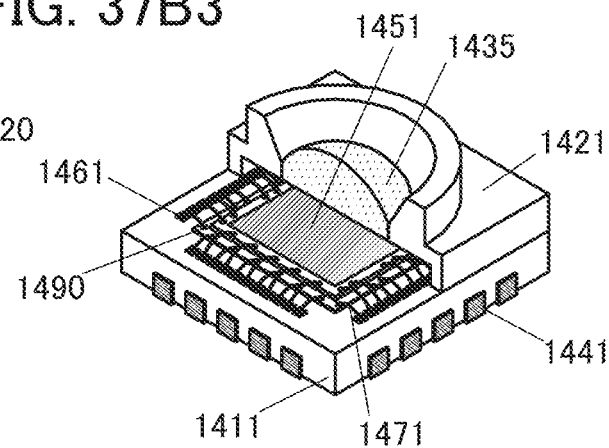

IMAGING DEVICE AND ELECTRONIC DEVICE

TECHNICAL FIELD

One embodiment of the present invention relates to an imaging device and an electronic device.

Note that one embodiment of the present invention is not limited to the above technical field. The technical field of the invention disclosed in this specification and the like relates to an object, a method, or a manufacturing method. Alternatively, one embodiment of the present invention relates to a process, a machine, manufacture, or a composition of matter. Therefore, more specifically, examples of the technical field of one embodiment of the present invention disclosed in this specification include a semiconductor device, a display device, a liquid crystal display device, a light-emitting device, a power storage device, an imaging device, a memory device, a processor, an electronic device, a method for driving them, a method for manufacturing them, a method for inspecting them, and a system thereof.

BACKGROUND ART

The performance of imaging devices using solid-state image sensors has been improved, and adequate image quality has been becoming available even in a low illuminance environment as in the case of using highly sensitive silver salt films. In addition, a technique for forming a transistor by using an oxide semiconductor thin film formed over a substrate has attracted attention. For example, an imaging device with a structure in which a transistor including an oxide semiconductor is used in a pixel circuit is disclosed in Patent Document 1.

Moreover, development of adding artificial intelligence utilizing artificial neural networks to semiconductor devices and electronic devices including the solid-state image sensors has been proceeding. Artificial neural networks are data processing systems modeled after neural networks; it is expected that computers with higher performance than conventional Neumann computers can be provided by utilizing artificial neural networks.

In particular, Patent Document 2 discloses an invention in which weight data used for computation with artificial neural networks is retained by a memory device including a transistor that includes an oxide semiconductor in a channel formation region.

REFERENCES

Patent Documents

[Patent Document 1] Japanese Published Patent Application No. 2011-119711
[Patent Document 2] United States Patent Application Publication No. 2016/0343452

SUMMARY OF THE INVENTION

Problems to be Solved by the Invention

By the way, with an increase in definition of display devices included in televisions (TVs) and the like, image data displayed on the display devices is demanded to have high definition. High-definition imaging devices need to be used to obtain high-definition image data.

However, while size reduction of imaging devices and electronic devices including the imaging devices progresses, the amount of data of image data to be obtained tends to become larger as the definition of display devices is increased. In particular, the numbers of circuits and wirings need to be increased to transfer image data with a large amount of data; this is a factor in preventing size reduction of the imaging devices and the electronic devices.

An object of one embodiment of the present invention is to provide a novel imaging device. Alternatively, an object of one embodiment of the present invention is to provide an electronic device including a novel imaging device.

Alternatively, an object of one embodiment of the present invention is to provide an imaging device with a small circuit area. Alternatively, an object of one embodiment of the present invention is to provide an imaging device with reduced power consumption.

Note that the objects of one embodiment of the present invention are not limited to the objects listed above. The objects listed above do not disturb the existence of other objects. Note that the other objects are objects that are not described in this section and will be described in the following description. The objects that are not described in this section will be derived from the description of the specification, the drawings, or the like and can be extracted from the description as appropriate by those skilled in the art. Note that one embodiment of the present invention solves at least one of the objects listed above and the other objects. Note that one embodiment of the present invention does not necessarily solve all the objects listed above and the other objects.

Means for Solving the Problems (1)
One embodiment of the present invention is an imaging device including an imaging portion and an encoder; the imaging device is characterized in that the imaging portion has a function of generating first image data by imaging, the encoder includes a first circuit that forms a first neural network, and the first circuit has a function of conducting feature extraction by the first neural network on the first image data to generate second image data.

(2)
Alternatively, one embodiment of the present invention is, in the structure described in (1), the imaging device characterized in that the first neural network has a function of performing convolution processing using a weight filter.

(3)
Alternatively, one embodiment of the present invention is, in the structure described in (2), the imaging device characterized in that a shift register is included, the encoder includes a memory cell array, an input terminal of the shift register is electrically connected to the imaging portion, an output terminal of the shift register is electrically connected to the memory cell array, the memory cell array has a function of storing a filter value of the weight filter, the shift register has a function of outputting the first image data to the memory cell array sequentially for every pixel region of the imaging portion, and the convolution processing includes product-sum operation using the first image data and the filter value.

(4)
Alternatively, one embodiment of the present invention is, in the structure described in (3), the imaging device characterized in that the imaging portion includes pixels arranged in n rows and m columns (n and m are each an integer greater than or equal to 1), the imaging portion has a function of generating the first image data when the pixels obtain pixel data by the imaging, the pixel region includes pixels arranged in t rows and s columns (t is an integer greater than or equal to 1 and less than or equal to n, and s is an integer greater than or equal to 1 and less than or equal to m), the shift register includes t×m stages of retention circuits, and the shift register has a function of outputting t×s pixel data included in the pixel region to the memory cell array at a time.

(5)

Alternatively, one embodiment of the present invention is, in the structure described in (3) or (4), the imaging device characterized in that the memory cell array includes a first transistor and the first transistor includes a metal oxide in a channel formation region.

(6)

Alternatively, one embodiment of the present invention is an electronic device including the imaging device described in any one of (1) to (5) and a decoder; the electronic device is characterized in that the decoder includes a second circuit that forms a second neural network, the second circuit is electrically connected to the first circuit, and the second circuit has a function of conducting decompression processing by the second neural network on the second image data to generate third image data.

(7)

Alternatively, one embodiment of the present invention is, in the structure described in (6), the electronic device characterized by including a display device.

Effect of the Invention

According to one embodiment of the present invention, a novel imaging device can be provided. Alternatively, according to one embodiment of the present invention, an electronic device including a novel imaging device can be provided.

Alternatively, according to one embodiment of the present invention, an imaging device with a small circuit area can be provided. Alternatively, according to one embodiment of the present invention, an imaging device with reduced power consumption can be provided.

Note that the effects of one embodiment of the present invention are not limited to the effects listed above. The effects listed above do not disturb the existence of other effects. Note that the other effects are effects that are not described in this section and will be described in the following description. The effects that are not described in this section will be derived from the description of the specification, the drawings, or the like and can be extracted from the description as appropriate by those skilled in the art. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIG. 37 Perspective views of packages including imaging devices.

MODE FOR CARRYING OUT THE INVENTION

In this specification and the like, an artificial neural network (ANN, hereinafter referred to as a neural network) generally means a model that imitates a biological neural network. In general, a neural network has a structure in which units that imitate neurons are connected to each other through a unit that imitates a synapse.

The connection strength of the synapse (also referred to as the connection strength of neurons or a weight coefficient) can be changed by providing the neural network with existing data. The processing for determining a connection strength by providing a neural network with existing data in such a manner is called "learning" in some cases.

Furthermore, when a neural network in which "learning" has been performed (a connection strength has been determined) is provided with some type of data, new data can be output on the basis of the connection strength. The processing for outputting new data on the basis of provided data and a connection strength in a neural network in such a manner is called "inference" or "recognition" in some cases.

Examples of the model of a neural network include a hopfield type and a hierarchical type. In particular, a neural network with a multilayer structure is called a "deep neural network" (DNN), and machine learning using a deep neural network is called "deep learning."

In this specification and the like, a metal oxide is an oxide of metal in a broad expression. Metal oxides are classified into an oxide insulator, an oxide conductor (including a transparent oxide conductor), an oxide semiconductor (also simply referred to as OS), and the like. For example, when a metal oxide is used in an active layer of a transistor, the metal oxide is called an oxide semiconductor in some cases. That is, when a metal oxide can form a channel formation region of a transistor that has at least one of an amplifying function, a rectifying function, and a switching function, the metal oxide can be referred to as a metal oxide semiconductor or shortly as an OS. Moreover, when an OS FET (or an OS transistor) is described, it can also be referred to as a transistor including a metal oxide or an oxide semiconductor.

Embodiment 1

In this embodiment, a semiconductor device and an electronic device of one embodiment of the present invention will be described.

Figure 1:
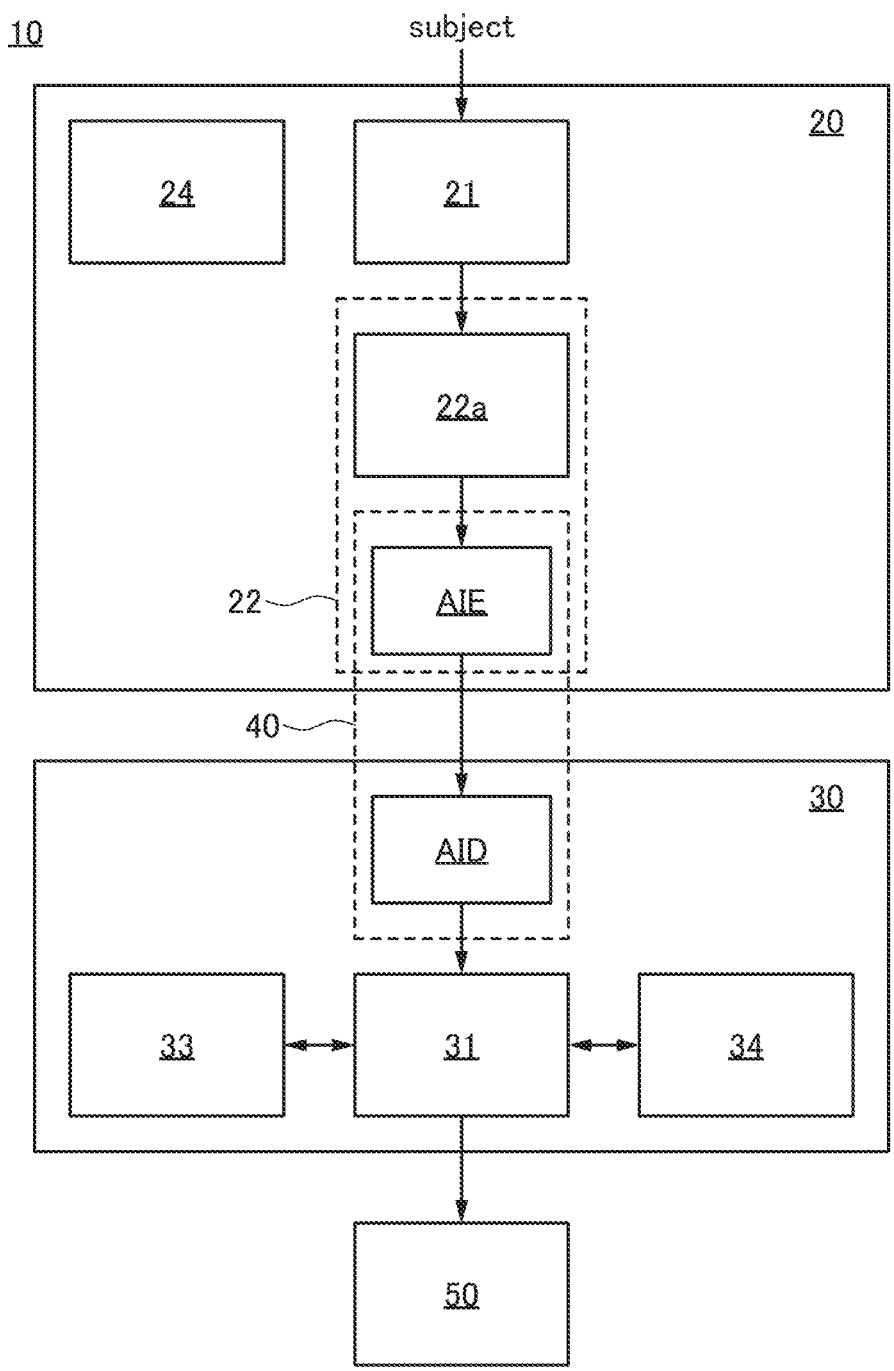
FIG. 1 A block diagram illustrating a structure example of an electronic device.

FIG. 1 is a block diagram illustrating a structure example of an electronic device of one embodiment of the present invention. An electronic device 10 includes an imaging device 20 that is the semiconductor device of one embodiment of the present invention, a peripheral circuit 30, and a display device 50.

The imaging device 20 includes an imaging portion 21, an interface 22, and a control portion 24. The interface 22 includes a circuit 22a and an encoder AIE.

The peripheral circuit 30 includes a decoder AID, a GPU (Graphics Processing Unit) 31, a memory portion 33, and a memory portion 34.

The electronic device includes components of an NN (Neural Network) circuit 40; the encoder AIE included in the imaging device 20 and the decoder AID included in the peripheral circuit 30 are included in the NN circuit 40. The details of the encoder AIE and the decoder AID will be described later with the NN circuit 40.

The imaging portion 21 is electrically connected to the circuit 22a, and the circuit 22a is electrically connected to the encoder AIE. The encoder AIE is electrically connected to the decoder AID. The decoder AID is electrically connected to the GPU 31, and the GPU 31 is electrically connected to the display device 50. The memory portion 33 is electrically connected to the GPU 31, and the memory portion 34 is electrically connected to the GPU 31.

<Imaging Device 20>

The components included in the imaging device 20 are described here.

The imaging portion 21 has a function of imaging outside background, a subject, or the like, converting the imaging object (subject) into image data, and taking the image data into the electronic device 10. Note that a pixel included in the imaging portion 21 will be described in detail in Embodiment 6.

The circuit 22a is a circuit that performs processing of inputting image data taken by the imaging portion 21 to the encoder AIE. Note that the structure example of the circuit 22a will be described in Embodiment 2.

The control portion 24 has a function of controlling the imaging portion 21, the circuit 22a, and the encoder AIE that are included in the imaging device 20.

<Peripheral Circuit 30>

Next, each circuit included in the peripheral circuit 30 is described.

The GPU 31 has a function of performing image processing on image data transmitted from the decoder AID. Examples of the image processing include dimming treatment and toning treatment. Dimming treatment is treatment for adjusting the brightness of image data, and toning treatment is treatment for adjusting the color of image data. In the case where image data is displayed on the display device 50, the GPU 31 may perform gamma correction processing as image processing on the image data.

The memory portion 33 has a function of storing programs and setting items related to the operation of the imaging device 20 and/or the peripheral circuit 30. At least part of the memory portion 33 is preferably a rewritable memory.

The memory portion 34 is a memory for storing image data taken by the imaging portion 21. Note that the memory portion 34 may be a detachable storage medium.

The display device 50 has a function of displaying image data or the like taken by the imaging device 20. As the display device 50, for example, a display device including a liquid crystal element, a light-emitting device including a light-emitting element, or the like can be used.

<NN Circuit 40>

Next, the NN circuit 40 is described.

Figure 2:
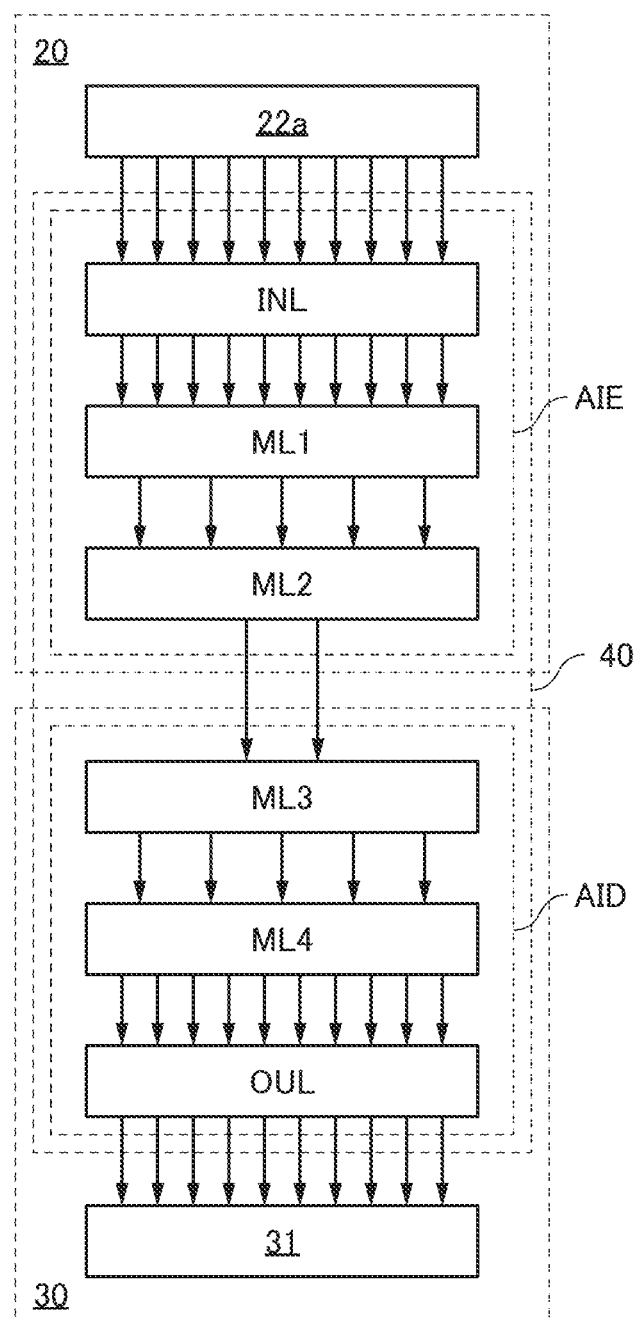
FIG. 2 A block diagram illustrating a structure example of a circuit.

The NN circuit 40 is a circuit utilizing a neural network, and FIG. 2 illustrates an example thereof. Note that in addition to the NN circuit 40, the circuit 22a and the GPU 31 are illustrated in FIG. 2.

The encoder AIE included in the NN circuit 40 includes an input layer INL, an intermediate layer ML1, and an intermediate layer ML2, and the decoder AID included in the NN circuit 40 includes an intermediate layer ML3, an intermediate layer ML4, and an output layer OUL. In other words, the input layer INL, the intermediate layer ML1 to the intermediate layer ML4, and the output layer OUL constitute a hierarchical neural network in the NN circuit 40.

Image data transmitted from the circuit 22a is input to the input layer INL of the encoder AIE included in the NN circuit 40. This means that the image data is handled as input data of the hierarchical neural network. The hierarchical neural network will be described in Embodiment 3.

The object of the hierarchical neural network in the encoder AIE is to compress the input data by feature extraction. Thus, it is preferable to employ a structure in which the number of neurons included in the intermediate layer ML2 is smaller than the number of neurons included in the input layer INL. Note that the hierarchical neural network in the encoder AIE illustrated in FIG. 2 has a structure in which the number of neurons decreases as the depth of the hierarchy becomes deeper. That is, the number of neurons included in the intermediate layer ML1 is smaller than the number of neurons included in the input layer INL, and the number of neurons included in the intermediate layer ML2 is smaller than the number of neurons included in the intermediate layer ML1. Note that the number of neurons in the intermediate layer ML1 may be larger than or smaller than the number of neurons in each of the input layer INL and the intermediate layer ML2.

The object of the hierarchical neural network in the decoder AID is to decompress the feature-extracted data. Thus, it is preferable to employ a structure in which the number of neurons included in the output layer OUL is larger than the number of neurons included in the intermediate layer ML3. Note that the hierarchical neural network in the decoder AID illustrated in FIG. 2 has a structure in which the number of neurons increases as the depth of the hierarchy becomes deeper. That is, the number of neurons included in the intermediate layer ML4 is larger than the number of neurons included in the intermediate layer ML3, and the number of neurons included in the output layer OUL is larger than the number of neurons included in the intermediate layer ML4. Note that the number of neurons in the intermediate layer ML4 may be larger than or smaller than the number of neurons in each of the intermediate layer ML3 and the output layer OUL.

In the above structure, the number of neurons included in the intermediate layer ML2 is the smallest in the encoder AIE, and the number of neurons included in the intermediate layer ML3 is the smallest in the decoder AID. Thus, the number of wirings that connect the neurons in the intermediate layer ML2 and the neurons in the intermediate layer ML3 to each other can be small. In other words, the number of wirings that electrically connect the decoder AID of the peripheral circuit 30 and the encoder AIE of the imaging device 20 to each other can be small.

In the encoder AIE of the NN circuit 40, when an analog signal corresponding to image data is transmitted from the imaging portion 21 to the encoder AIE through the circuit 22a, processing for converting the image data into feature-extracted image data is performed. In the decoder AID of the NN circuit 40, processing for decompressing the feature-extracted image data to the original image data and outputting the original image data as an analog signal from the output layer OUL is performed.

The decompressed image data output from the output layer OUL of the decoder AID in the NN circuit 40 is transmitted to the GPU 31.

In the hierarchical neural network formed of the NN circuit 40, the connection between layers can be a full connection or can be a partial connection.

Note that although the hierarchical neural network in the NN circuit 40 illustrated in FIG. 2 is formed of the input layer INL, the intermediate layer ML1 to the intermediate layer ML4, and the output layer OUL, one embodiment of the present invention is not limited thereto. For example, the structure of the hierarchical neural network may be a structure in which the number of intermediate layers of the NN circuit 40 illustrated in FIG. 2 is changed.

The imaging device 20 illustrated in FIG. 1 can function as an image sensor chip described later in Embodiment 6. By the way, the encoder AIE included in the imaging device 20 and the decoder AID included in the peripheral circuit 30 can form the NN circuit in the electronic device 10 as illustrated in FIG. 1. Since the number of wirings that electrically connect the encoder AIE and the decoder AID in the NN circuit 40 can be small as described above, in the case where the imaging device 20 is mounted as a chip on an electronic substrate, the number of wirings that electrically connect the chip and the electronic substrate to each other can be small. That is, the structure described in this embodiment enables high-resolution image data obtained by the imaging portion 21 to be transmitted to the peripheral circuit 30 through a small number of wirings.

Note that one embodiment of the present invention is not limited to the structure of the electronic device 10 illustrated in FIG. 1. Although the electronic device 10 illustrated in FIG. 1 has a structure in which the imaging device 20 includes the encoder AIE and the peripheral circuit 30 includes the decoder AID, the input layer, the intermediate layers, and the output layer constituting the neural network need not have the structure illustrated in FIG. 2. For example, the input layer INL and the intermediate layer ML1 may constitute the encoder AIE in the imaging device 20, and the intermediate layer ML2 and the output layer OUL may constitute the decoder AID in the peripheral circuit 30. Alternatively, for example, the input layer INL and the intermediate layer ML3 may constitute the encoder AIE in the imaging device 20, and the intermediate layer ML4 and the output layer OUL may constitute the decoder AID in the peripheral circuit 30.

Furthermore, although the electronic device 10 illustrated in FIG. 1 includes the display device 50, the display device 50 is not necessarily included depending on the mode of the electronic device. The same applies to other components included in the electronic device 10.

Note that although the NN circuit 40 illustrated in FIG. 2 is described as one neural network in this embodiment, one embodiment of the present invention is not limited thereto. For example, each of the encoder AIE that performs feature extraction and the decoder AID that performs decompression can be independently described as a neural network in this embodiment. That is, a neural network consisting of the encoder AIE and that consisting of the decoder AID can be referred to as a first neural network and a second neural network, respectively.

Note that this embodiment can be combined with the other embodiment described in this specification as appropriate.

Embodiment 2

In this embodiment, a structure example in which a convolutional neural network (CNN) is used as the NN circuit 40 described in the above embodiment will be described.

<Convolutional Neural Network>

Figure 3:
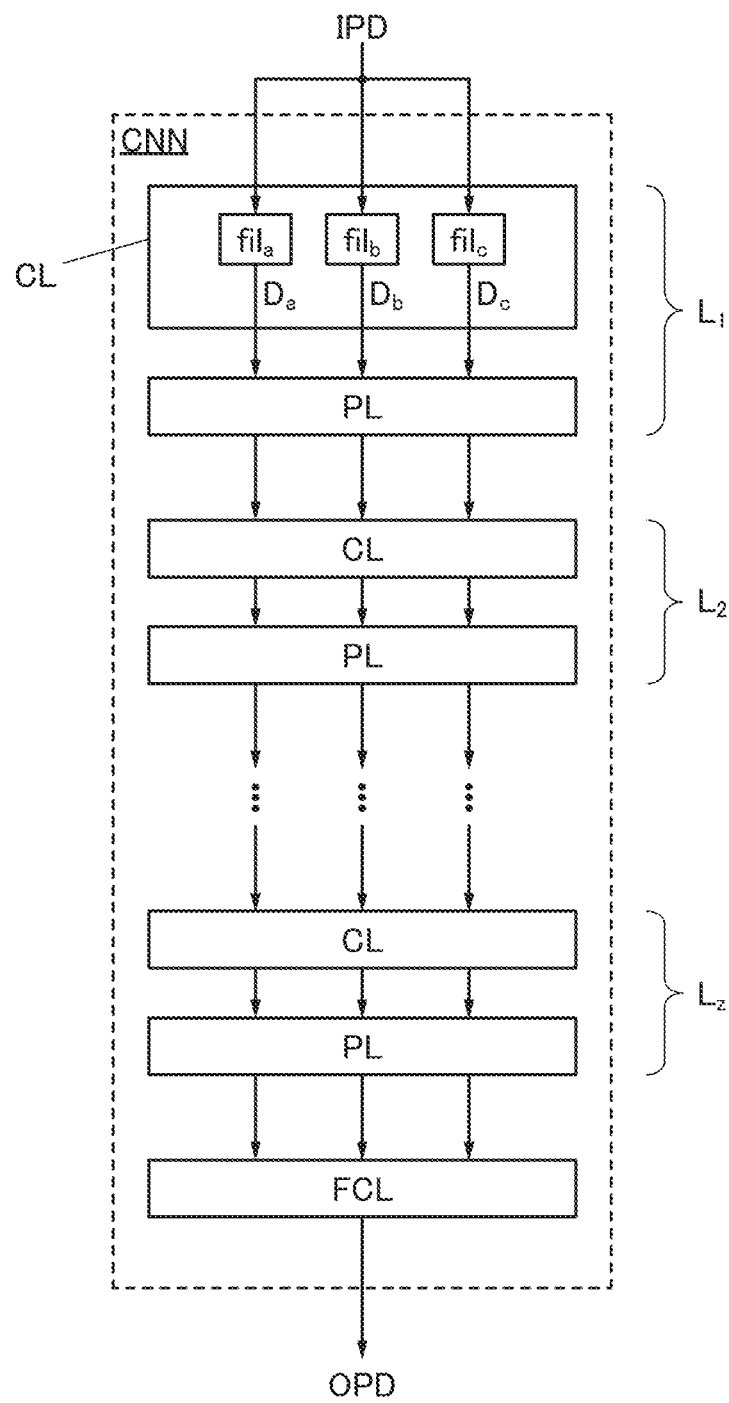
FIG. 3 A diagram illustrating a structure example of a CNN.

A CNN is one of computational models used when feature extraction of an image or the like is performed. FIG. 3 illustrates a structure example of the CNN. The CNN is formed of a convolution layer CL, a pooling layer PL, and a fully connected layer FCL. In the case of using the CNN in the encoder AIE, image data IPD output from the imaging portion 21 is input to the CNN and then feature extraction is performed.

The convolution layer CL has a function of performing convolution processing on the image data. The convolution processing is performed by repeating the product-sum operation using part of the image data and the filter value of a weight filter. As a result of the convolution processing in the convolution layer CL, feature extraction of an image is performed.

For the convolution processing, one or a plurality of weight filters can be used. In the case of using a plurality of weight filters, a plurality of features of the image data can be extracted. FIG. 3 illustrates an example in which three filters (filters $fil_a$, $fil_b$, and $fil_c$) are used as weight filters. The image data input to the convolution layer CL is subjected to filter processing using the filters $fil_a$, $fil_b$, and $fil_c$, so that data $D_a$, $D_b$, and $D_c$ are generated.

The data $D_a$, $D_b$, and $D_c$ subjected to the convolution processing are converted using an activation function, and then output to the pooling layer PL. As the activation function, a ReLU (Rectified Linear Units) or the like can be used. The ReLU is a function that outputs "0" when an input value is negative and outputs the input value as it is when the input value is greater than or equal to "0." As the activation function, a sigmoid function, a tanh function, or the like can also be used.

The pooling layer PL has a function of performing pooling processing on the image data input from the convolution layer CL. The pooling processing is processing in which the image data is partitioned into a plurality of regions, and predetermined data is extracted from each of the regions and the data are arranged in a matrix. The pooling processing enables image data to be compressed while the feature extracted in the convolution layer CL remains. As the pooling processing, max pooling, average pooling, Lp pooling, or the like can be used.

In the CNN, the feature extraction is performed using the above convolution processing and pooling processing. Note that the CNN can be formed of a plurality of convolution layers CL and pooling layers PL. A structure is illustrated in which z layers L (a layer $L_1$ to a layer $L_z$) (here, z is an integer greater than or equal to 1) each of which consists of the convolution layer CL and the pooling layer PL are provided and the convolution processing and the pooling processing are performed z times. In this case, feature extraction can be performed in each layer L, which enables more advanced feature extraction. Note that FIG. 3 illustrates the layer $L_1$, the layer $L_2$, and the layer $L_z$, and the other layers L are omitted.

The fully connected layer FCL has a function of determining an image using the image data subjected to the convolution processing and the pooling processing. The fully connected layer FCL has a configuration in which all nodes in one layer are connected to all nodes in the following layer. The image data output from the convolution layer CL or the pooling layer PL is a two-dimensional feature map and is unfolded into a one-dimensional feature map when input to the fully connected layer FCL. Then, image data OPD obtained as a result of the inference by the fully connected layer FCL is output.

Note that the structure of the CNN is not limited to the structure in FIG. 3. For example, the pooling layer PL may be provided for a plurality of convolution layers CL. Moreover, in the case where the positional information of the extracted feature is desired to be left as much as possible, the pooling layer PL may be omitted.

Furthermore, in the case of classifying images using the output data from the fully connected layer FCL, an output layer electrically connected to the fully connected layer FCL may be provided. The output layer can output a classification class using a softmax function or the like as a likelihood function.

In addition, the CNN can perform supervised learning using image data as training data and teacher data. In the supervised learning, a backpropagation method can be used, for example. Owing to the learning in the CNN, the filter value of the weight filter, the weight coefficient of the fully connected layer, or the like can be optimized.

<Convolution Processing>

Next, a specific example of the convolution processing performed in the convolution layer CL will be described.

Figure 4A:
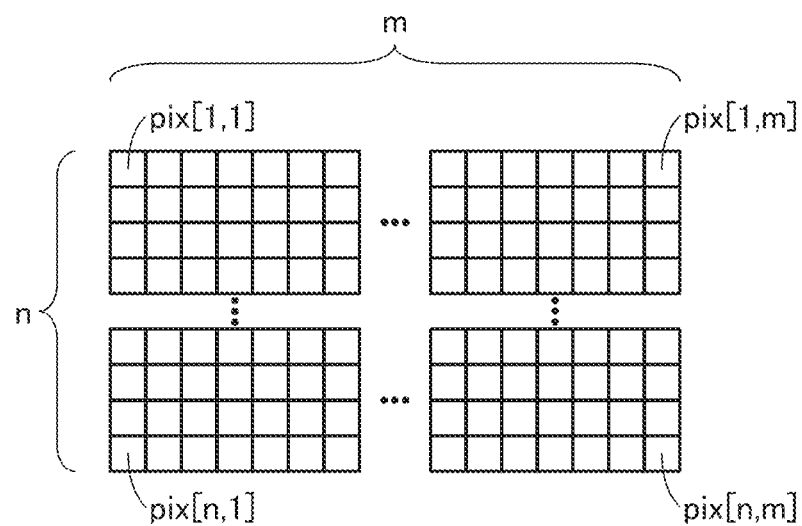
FIG. 4 Diagrams illustrating structure examples of a pixel and a filter.

FIG. 4(A) illustrates a plurality of pixels pix arranged in a matrix of n rows and m columns (here, n and m are each an integer greater than or equal to 1) in the imaging portion 21. Pixel data corresponding to an imaging subject is taken by each of the plurality of pixels pix by imaging. In this embodiment, pixel data g[1, 1] to pixel data g[n, m] are described to be taken by a pixel pix[1, 1] to a pixel pix[n, m], respectively.

Figure 4B:
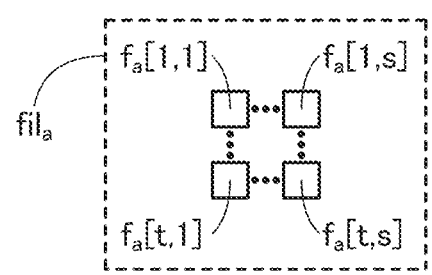

The convolution is performed by the product-sum operation using the pixel data g and the filter value of a weight filter. FIG. 4(B) illustrates the filter $fil_a$ composed of addresses in t rows and s columns (here, t is an integer greater than or equal to 1 and less than or equal to n, and s is an integer greater than or equal to 1 and less than or equal to m). A filter value $f_a[1, 1]$ to a filter value $f_a[t, s]$ are assigned to their respective addresses of the filter $fil_a$.

In the case of performing feature extraction using the convolution processing, data showing certain features (referred to as feature data) can be stored in the filter value $f_a[1, 1]$ to the filter value $f_a[t, s]$. Then, in the feature extraction, the feature data and image data are compared with each other. In addition, in the case of performing image processing such as edge processing or blurring processing using the convolution processing, parameters necessary for the image processing can be stored in the filter value $f_a[1, 1]$ to the filter value $f_a[s, t]$. As an example, the operation in the case of performing feature extraction will be described in detail below.

Figure 5A:
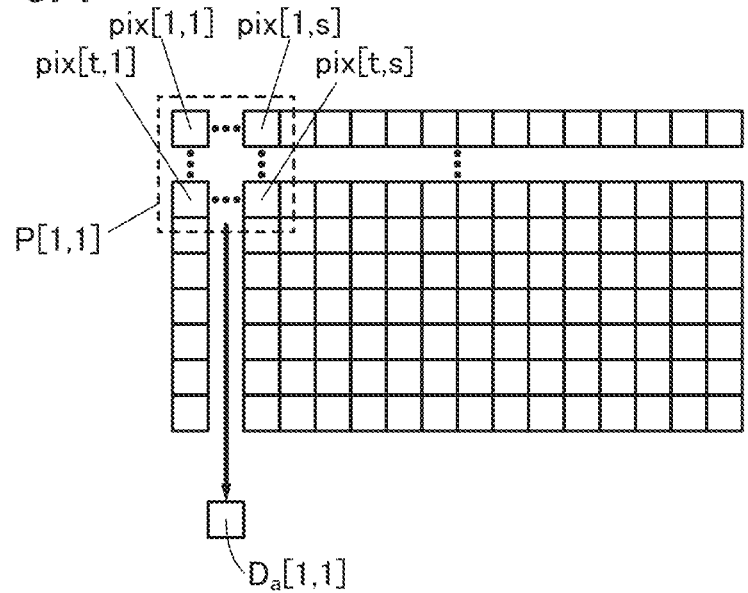
FIG. 5 Diagrams illustrating an example of convolution processing.
Figure 5B:
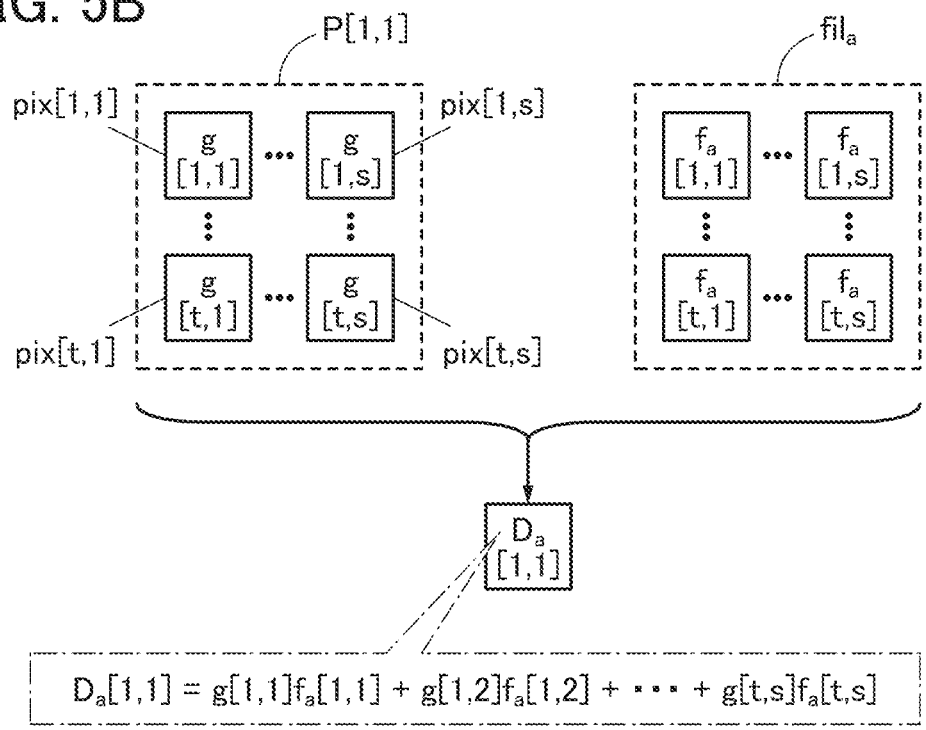

FIG. 5(A) illustrates a state where filter processing using the filter $fil_a$ is performed on a pixel region P[1, 1] whose corners are the pixel pix[1, 1], the pixel pix[1, s], the pixel pix[t, 1], and the pixel pix[t, s] to obtain data $D_a[1, 1]$. This filter processing is, as illustrated in FIG. 5(B), processing in which pixel data in one pixel pix included in the pixel region P[1, 1] is multiplied by the filter value $f_a$ of the filter $fil_a$ that corresponds to the address of the pixel pix, and the multiplication results for the pixels pix are added up together. In other words, the product-sum operation using the pixel data g[v, w] (here, v is an integer greater than or equal to 1 and less than or equal to t, and w is an integer greater than or equal to 1 and less than or equal to s) and the filter value $f_a[v, w]$ is performed in all the pixels pix included in the pixel region P[1, 1]. The data $D_a[1, 1]$ can be expressed by the following formula.

$$D_a[1, 1] = \sum_{v=1}^{t} \sum_{w=1}^{s} g[v, w] \cdot f_a[v, w] \quad \text{[Formula 1]}$$

Figure 6:
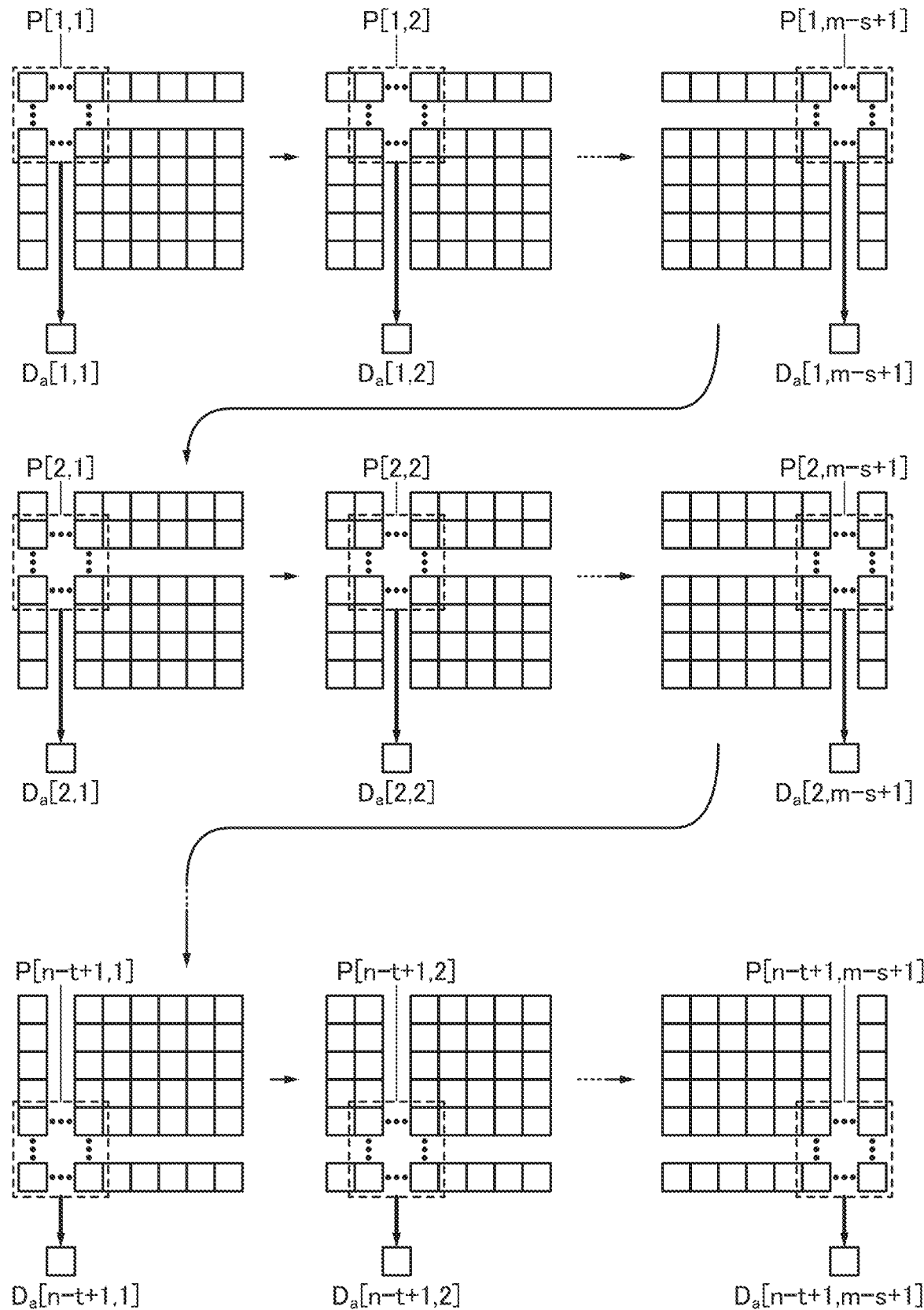
FIG. 6 A diagram illustrating an example of convolution processing.

After that, the above product-sum operation is sequentially performed also in other pixel regions. Specifically, the filter processing is performed on a pixel region P[1, 2] whose corners are the pixel pix[1, 2], the pixel pix[1, s+1], the pixel pix[t, 2], and the pixel pix[t, s+1] to obtain data $D_a[1, 2]$, as illustrated in FIG. 6. Subsequently, the data $D_a$ is obtained in each pixel region P in a similar manner while the pixel region P is moved pixel-column by pixel-column.

Then, data $D_a[1, m-s+1]$ is obtained from a pixel region P[1, m−s+1] whose corners are the pixel pix[1, m−s+1], the pixel pix[1, m], the pixel pix[t, m−s+1], and the pixel pix[t, m], and after the acquisition of data $D_a$ for one row is completed, the pixel region P is moved by one pixel row and data $D_a$ for one row is sequentially obtained in a similar manner. FIG. 6 illustrates a state where data $D_a[2, 1]$ to data $D_a[2, m-s+1]$ are obtained from a pixel region P[2, 1] to a pixel region P[2, m−s+1].

When the above operation is repeated and data $D_a[n-t+1, m-s+1]$ is obtained from a pixel region P[n−t+1, m−s+1] whose corners are the pixel pix[n−t+1, m−s+1], the pixel pix[n−t+1, m], the pixel pix[n, m−s+1], and the pixel pix[n, m], the filter processing using the filter $fil_a$ on all pixel regions P is completed.

In such a manner, a pixel region P having pixels arranged in a matrix of t rows and s columns is selected from the pixel pix[1, 1] to the pixel pix[n, m] and the filter processing using the filter $fil_a$ is performed on the pixel region P. Data $D_a[x, y]$ obtained by performing the filter processing using the filter $fil_a$ on a pixel region P whose corners are the pixel pix[x, y] (here, x is an integer greater than or equal to 1 and less than or equal to n−t+1, and y is an integer greater than or equal to 1 and less than or equal to m−s+1), the pixel pix[x, y+s−1], the pixel pix[x+t−1, y], and the pixel pix[x+t−1, y+s−1] can be expressed by the following formula.

$$D_a[x, y] = \sum_{v=1}^{t} \sum_{w=1}^{s} g[x+v-1, y+w-1] \cdot f_a[v, w]$$ [Formula 2]

Figure 7:
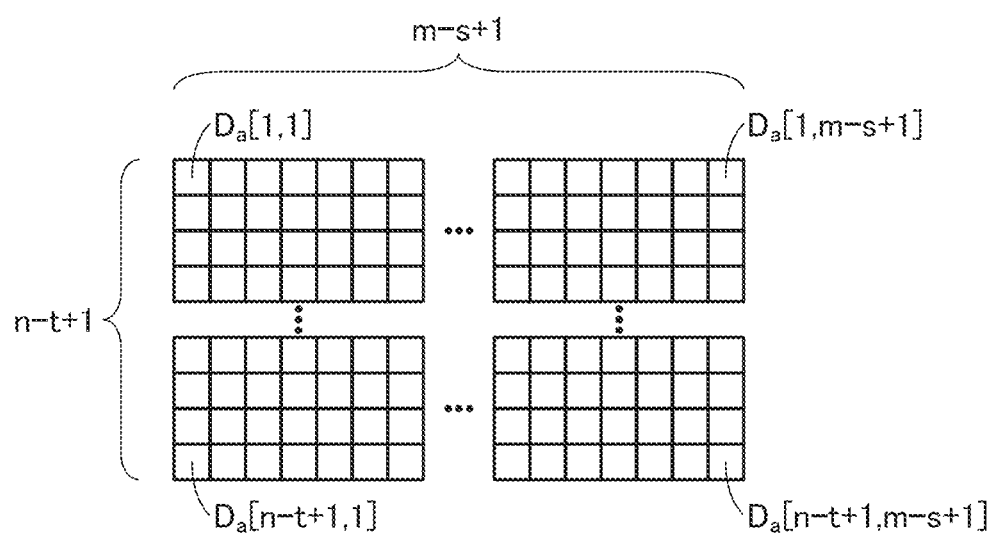
FIG. 7 A diagram illustrating a structure example of a feature map.

As described above, the data $D_a[1, 1]$ to the data $D_a[n-t+1, m-s+1]$ can be obtained when the filter processing using the filter $fil_a$ is performed on all the pixel regions P in t rows and s columns that can be selected from the pixel pix[1, 1] to the pixel pix[n, m]. Then, the data $D_a[1, 1]$ to the data $D_a[n-t+1, m-s+1]$ are arranged in a matrix in accordance with the addresses, so that a feature map illustrated in FIG. 7 can be obtained.

In the above-described manner, the convolution processing is performed by the product-sum operation using the image data and the filter values to extract the feature of an image.

Note that in the case where a plurality of filters fit are provided in the convolution layer CL as illustrated in FIG. 3, the above convolution processing is performed for each filter fil. Although described here is an example in which the pixel region P is moved pixel-column by pixel-column when the pixel region P is in the first column to the m−s-th column and the pixel region P returns to the first column and is moved by one pixel row when the pixel region P is in the m−s+1-th column, the movement distance of the pixel region P can be set freely.

<Circuit 22a>

A configuration example of the circuit 22a in the case where the NN circuit 40 described in Embodiment 1 performs the above computation with the CNN is described here.

Figure 8:
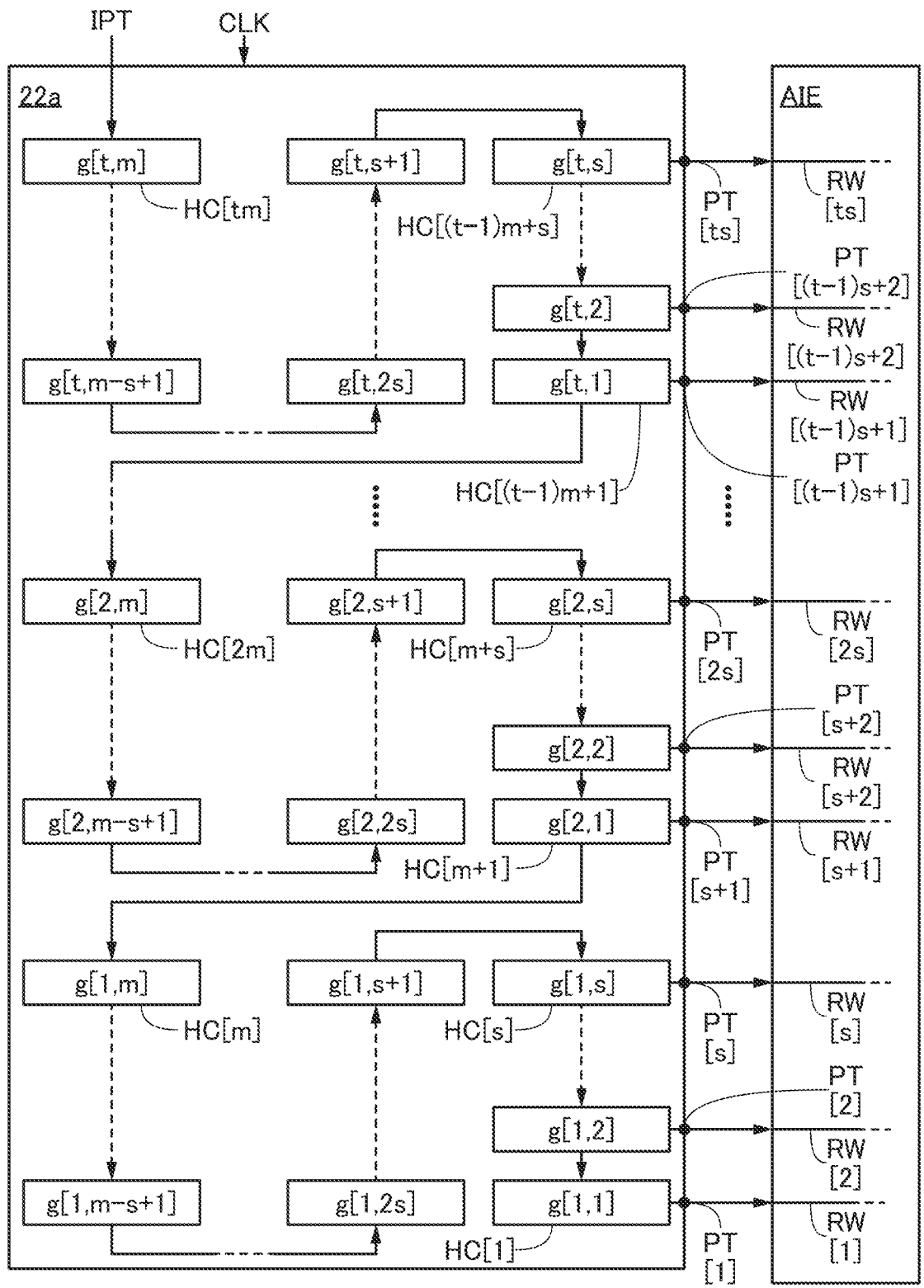
FIG. 8 A diagram illustrating an example of a circuit.

FIG. 8 illustrates the configuration example of the circuit 22a. Note that FIG. 8 illustrates not only the circuit 22a but also the encoder AIE.

The description of the circuit 22a is given here by using, as an example, the case where the imaging portion 21 in the imaging device 20 includes pixels arranged in a matrix of n rows and m columns (hereinafter referred to as the pixel pix[1, 1] to the pixel pix[n, m]) and convolution processing is performed on the pixels in n rows and m columns using the filter $fil_a$ with t rows and s columns.

The circuit 22a includes a shift register. The shift register includes t×m stages of retention circuits HC, an input terminal IPT, t×s output terminals PT, and a terminal to which a clock signal CLK is input. Note that in this specification and the like, the t×m stages of retention circuits HC are described as a retention circuit HC[1] to a retention circuit HC[tm], and the t×s output terminals PT are described as an output terminal PT[1] to an output terminal PT[ts]. In addition, among the retention circuit HC[1] to the retention circuit HC[tm], only the retention circuit HC[1], the retention circuit HC[s], the retention circuit HC[m], the retention circuit HC[m+1], the retention circuit HC[m+s], the retention circuit HC[2m], the retention circuit HC[(t−1)m+1], the retention circuit HC[(t−1)m+s], and the retention circuit HC[tm] are denoted by reference numerals in FIG. 8. Moreover, among the output terminal PT[1] to the output terminal PT[ts], only the output terminal PT[1], the output terminal PT[2], the output terminal PT[s], the output terminal PT[s+1], the output terminal PT[s+2], the output terminal PT[2s], the output terminal PT[(t−1)s+1], the output terminal PT[(t−1)s+2], and the output terminal PT[ts] are denoted by reference numerals in FIG. 8.

The input terminal IPT is electrically connected to the imaging portion 21. The image data obtained by the imaging portion 21 is input pixel by pixel to the input terminal IPT of the circuit 22a.

Among the retention circuit HC[1] to the retention circuit HC[tm], the retention circuit HC[dm+1] to the retention circuit HC[dm+s] (here, d is an integer greater than or equal to 0 and less than or equal to t−1) are electrically connected to the output terminal PT[ds+1] to the output terminal PT[(d+1)s], respectively. That is, in FIG. 8, the retention circuit HC[1] to the retention circuit HC[s] are electrically connected to the output terminal PT[1] to the output terminal PT[s], respectively, the retention circuit HC[m+1] to the retention circuit HC[m+s] are electrically connected to the output terminal PT[s+1] to the output terminal PT[2s], respectively, and the retention circuit HC[(t−1)m+1] to the retention circuit HC[(t−1)m+s] are electrically connected to the output terminal PT[(t−1)s+1] to the output terminal PT[ts], respectively.

The encoder AIE includes a wiring RW[1] to a wiring RW[ts]. The wiring RW[1] to the wiring RW[ts] are electrically connected to the output terminal PT[1] to the output terminal PT[ts], respectively. Note that among the wiring RW[1] to the wiring RW[ts], only the wiring RW[1], the wiring RW[2], the wiring RW[s], the wiring RW[s+1], the wiring RW[s+2], the wiring RW[2s], the wiring RW[(t−1)s+1], the wiring RW[(t−1)s+2], and the wiring RW[ts] are denoted by reference numerals in FIG. 8.

The encoder AIE includes a memory cell array with is rows (not illustrated in FIG. 8). In memory cells in one column included in the memory cell array, the filter value $f_a[1, 1]$ to the filter value $f_a[t, s]$ of the filter $fil_a$ used in the convolution processing are retained.

For the specific configuration of the memory cell array, refer to a memory cell array CA described in Embodiment 3.

As will be described in detail in Embodiment 3, the memory cell array CA is one of the components of a product-sum operation circuit; in other words, the encoder AIE has a structure in which a product-sum operation circuit is included. The product-sum operation circuit can perform product-sum operation using data retained in the memory cells (filter values, weight coefficients, or the like) and data input to the wirings RW (image data or the like).

The pixel data g[1, 1] to the pixel data g[n, m] taken by the pixel pix[1, 1] to the pixel pix[n, m] in the imaging portion 21 are sequentially input to the input terminal IPT of the circuit 22a. The circuit 22a transmits pixel data retained in the retention circuits HC to the retention circuits HC in the subsequent stages every time the clock signal CLK is input. FIG. 8 illustrates a diagram in which the pixel data g[1, 1] is transmitted to the retention circuit HC[1] and the pixel data g[t, m] is transmitted to the retention circuit HC[tm].

In this case, pixel data retained in the retention circuit HC[dm+1] to the retention circuit HC[dm+s] are output from the output terminal PT[ds+1] to the output terminal PT[(d+1)s], respectively. That is, in FIG. 8, the pixel data g[1, 1] to the pixel data g[1, s] are output from the output terminal PT[1] to the output terminal PT[s], respectively, the pixel data g[2, 1] to the pixel data g[2, s] are output from the output terminal PT[s+1] to the output terminal PT[2s], respectively, and the pixel data g[t, 1] to the pixel data g[t, s] are output from the output terminal PT[(t−1)s+1] to the output terminal PT[ts], respectively.

Accordingly, pixel data retained in the retention circuit HC[dm+1] to the retention circuit HC[dm+s] are respectively transmitted to the wiring RW[ds+1] to the wiring RW[(d+1)s] of the memory cell array in the encoder AIE. Note that all the pixel data transmitted to the wiring RW[1] to the wiring RW[ts] in this case correspond to the image data in the pixel region P[1, 1] illustrated in FIGS. 5(A) and 5(B).

The image data in the pixel region P[1, 1] output to the wiring RW[1] to the wiring RW[ts] are supplied to memory cells in one column included in the memory cell array with ts rows in the encoder AIE. In this case, the filter value $f_a[1, 1]$ to the filter value $f_a[t, s]$ are retained in the memory cells in one column, and the product-sum operation using the image data and the filter values $f_a$ is performed. For the details of the product-sum operation, refer to Embodiment 3.

Through the product-sum operation using the image data in the pixel region P[1, 1] and the filter $fil_a$, the data $D_a[1, 1]$ illustrated in FIG. 5 can be obtained. In this manner, the circuit 22a has a function of outputting t×s image data to the encoder AIE at a time; thus, the convolution processing can be performed at high speed.

Note that in the case of using a plurality of filters in the convolution processing as illustrated in FIG. 3, the number of columns of the memory cell array in the encoder AIE is set to the number of the filters. The details will be described in Embodiment 3.

Figure 9:
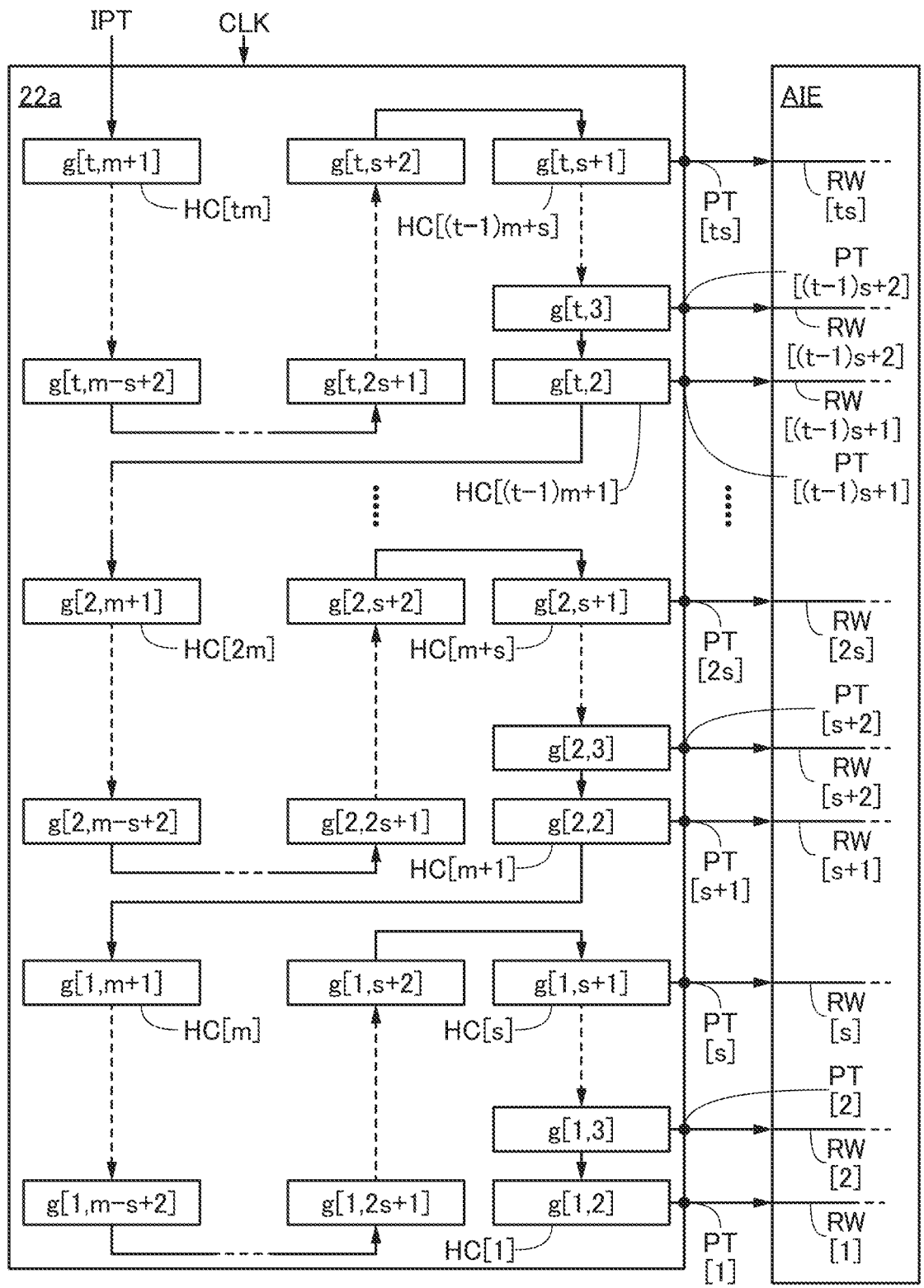
FIG. 9 A diagram illustrating an example of a circuit.

When the pulse of the next clock signal CLK is input to the circuit 22a in FIG. 8, the pixel data g[1, 2] to the pixel data g[t, m] respectively stored in the retention circuit HC[2] to the retention circuit HC[tm] of the circuit 22a are transmitted to the respective retention circuits HC in the subsequent stages, as illustrated in FIG. 9. Note that since the circuit 22a does not include a retention circuit in the subsequent stage of the retention circuit HC[1], the pixel data g[1, 1] is not retained. The retention circuit HC[1] retains the pixel data g[1, 2] transmitted from the retention circuit HC[2] in the previous stage. Moreover, the retention circuit HC[tm] retains the pixel data g[t, m+1] transmitted from the input terminal IPT.

In this case, pixel data retained in the retention circuit HC[dm+1] to the retention circuit HC[dm+s] are output from the output terminal PT[ds+1] to the output terminal PT[(d+1)s], respectively. That is, in FIG. 9, the pixel data g[1, 2] to the pixel data g[1, s+1] are output from the output terminal PT[1] to the output terminal PT[s], respectively, the pixel data g[2, 2] to the pixel data g[2, s+1] are output from the output terminal PT[s+1] to the output terminal PT[2s], respectively, and the pixel data g[t, 2] to the pixel data g[t, s+1] are output from the output terminal PT[(t−1)s+1] to the output terminal PT[ts], respectively.

Accordingly, pixel data retained in the retention circuit HC[dm+1] to the retention circuit HC[dm+s] are respectively transmitted to the wiring RW[ds+1] to the wiring RW[(d+1)s] of the memory cell array in the encoder AIE. Note that all the pixel data transmitted to the wiring RW[1] to the wiring RW[ts] in this case correspond to the image data in the pixel region P[1, 2] illustrated in FIG. 6.

The image data in the pixel region P[1, 2] transmitted by the wiring RW[1] to the wiring RW[ts] are subjected to the filter processing using the filter $fil_a$ as in the pixel region P[1, 1]. Specifically, the data $D_a[1, 2]$ illustrated in FIG. 6 can be obtained through the product-sum operation using the image data in the pixel region P[1, 2] and the filter value $f_a[1, 1]$ to the filter value $f_a[t, s]$ retained in memory cells in one column.

As described above, when new pixel data is input through the input terminal IPT and the pulse of the clock signal CLK is input to the circuit 22a, image data in the pixel region P moved pixel-column by pixel-column can be sequentially input to the circuit 22a.

Figure 10:
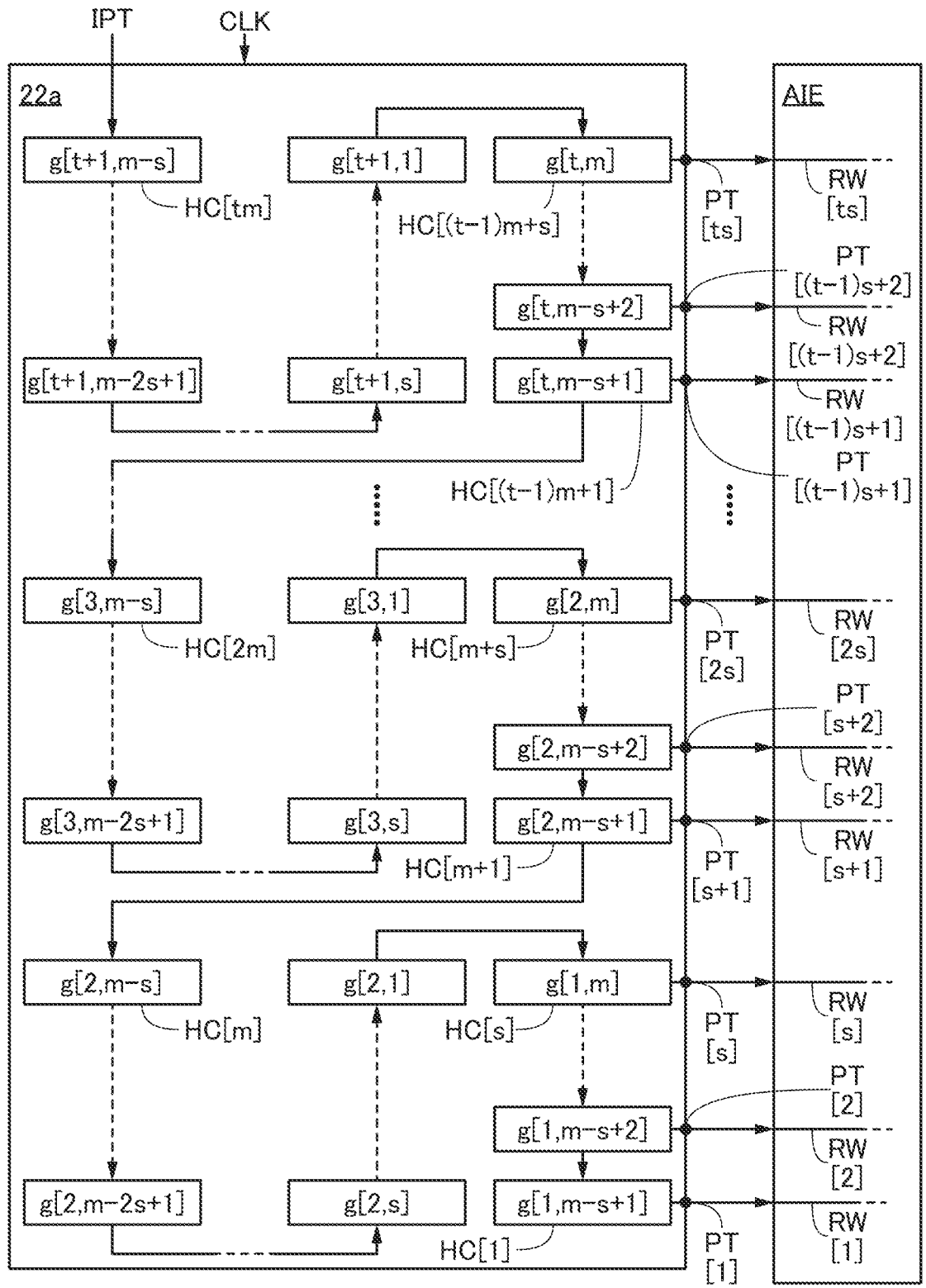
FIG. 10 A diagram illustrating an example of a circuit.

The circuit 22a illustrated in FIG. 10 is in a state where (m−s−1) pulses of the clock signal CLK are input and image data g are sequentially input from the input terminal IPT after the state illustrated in FIG. 9. That is, in FIG. 10, the pixel data g[1, m−s+1] to the pixel data g[1, m] are output from the output terminal PT[1] to the output terminal PT[s], respectively, the pixel data g[2, m−s+1] to the pixel data g[2, m] are output from the output terminal PT[s+1] to the output terminal PT[2s], respectively, and the pixel data g[t, m−s+1] to the pixel data g[t, m] are output from the output terminal PT[(t−1)s+1] to the output terminal PT[ts], respectively.

Accordingly, pixel data retained in the retention circuit HC[dm+1] to the retention circuit HC[dm+s] are respectively transmitted to the wiring RW[ds+1] to the wiring RW[(d+1)s] of the memory cell array in the encoder AIE. Note that all the pixel data transmitted to the wiring RW[1] to the wiring RW[ts] in this case correspond to the image data in the pixel region P[1, m−s+1] illustrated in FIG. 6.

The image data in the pixel region P[1, m−s+1] transmitted by the wiring RW[1] to the wiring RW[ts] are subjected to the filter processing using the filter $fil_a$ as in the pixel region P[1, 1] and the pixel region P[1, 2]. Specifically, the data $D_a[1, m−s+1]$ illustrated in FIG. 6 can be obtained through the product-sum operation using the image data in the pixel region P[1, m−s+1] and the filter value $f_a[1, 1]$ to the filter value $f_a[t, s]$ retained in memory cells in one column.

As described above, when the image data g and the clock signal CLK are sequentially input and the convolution processing is performed on each image data of the pixel region P[1, 1] to the pixel region P[1, m−s+1], the data $D_a$ for one row can be obtained.

Note that in the case of subsequently performing the convolution processing after the state illustrated in FIG. 10, the pixel region subjected to the convolution processing next is the pixel region P[2, 1]. In this case, the image data in the pixel region P[2, 1] can be input to the memory cell array in the encoder AIE when s pulses of the clock signal CLK and the pixel data g are input to the circuit 22a after the state illustrated in FIG. 10.

Figure 11:
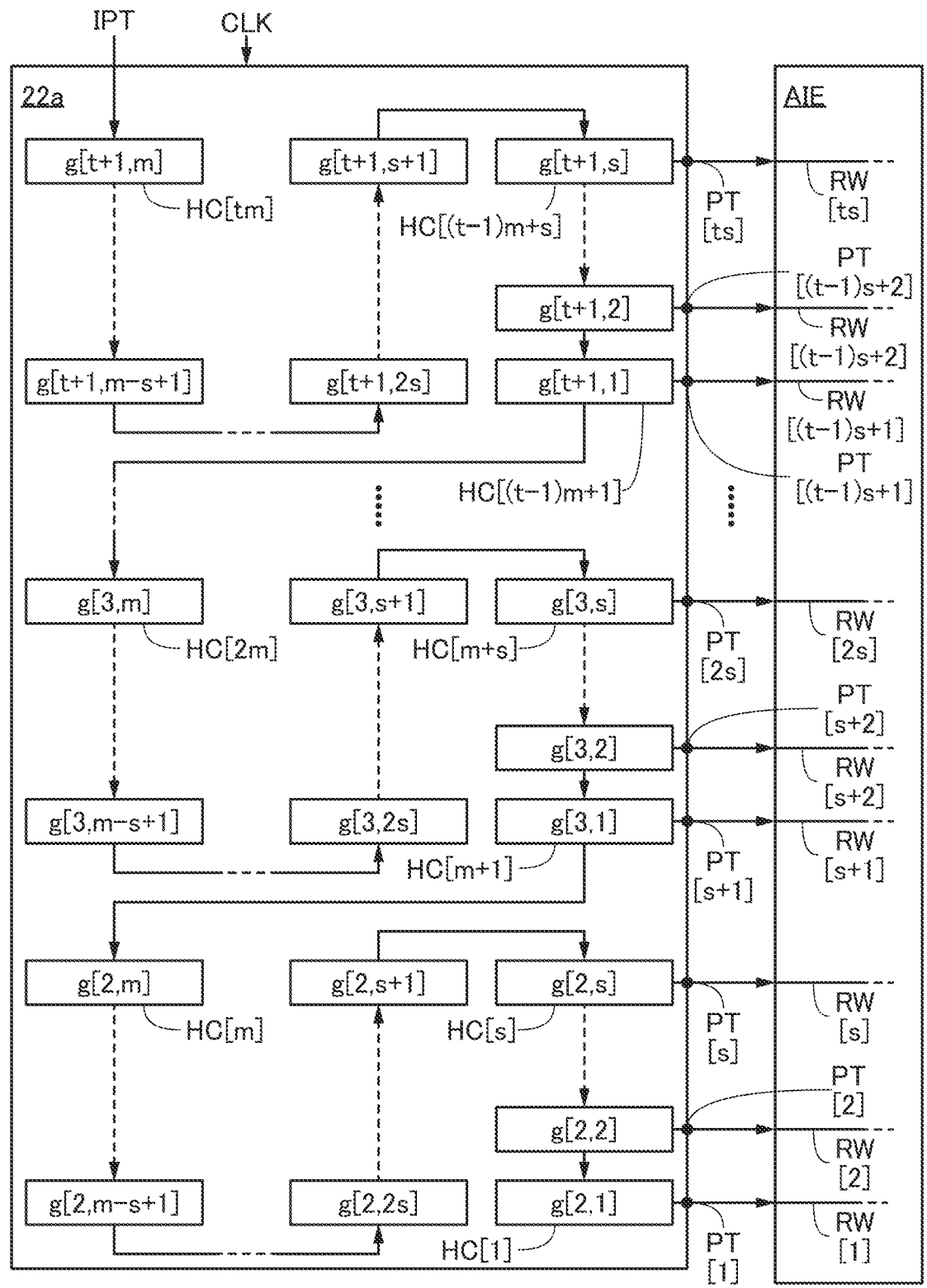
FIG. 11 A diagram illustrating an example of a circuit.

In the case of inputting s pulses of the clock signal CLK and the pixel data g to the circuit 22a in the state illustrated in FIG. 10, the state becomes that illustrated in FIG. 11. In FIG. 11, the pixel data g[2, 1] to the pixel data g[2, s] are output from the output terminal PT[1] to the output terminal PT[s], respectively, the pixel data g[3, 1] to the pixel data g[3, s] are output from the output terminal PT[s+1] to the output terminal PT[2s], respectively, and the pixel data g[t+1, 1] to the pixel data g[t+1, s] are output from the output terminal PT[(t−1)s+1] to the output terminal PT[ts], respectively.

Accordingly, pixel data retained in the retention circuit HC[dm+1] to the retention circuit HC[dm+s] are respectively transmitted to the wiring RW[ds+1] to the wiring RW[(d+1)s] of the memory cell array in the encoder AIE. Note that all the pixel data transmitted to the wiring RW[1] to the wiring RW[ts] in this case correspond to the image data in the pixel region P[2, 1] illustrated in FIG. 6.

The image data in the pixel region P[2, 1] transmitted by the wiring RW[1] to the wiring RW[ts] are subjected to the filter processing using the filter $fil_a$ as in the pixel region P[1, 1] to the pixel region P[1, m−s+1]. Specifically, the data $D_a$[2, 1] illustrated in FIG. 6 can be obtained through the product-sum operation using the image data in the pixel region P[2, 1] and the filter value $f_a$[1, 1] to the filter value $f_a$[t, s] retained in memory cells in one column.

When the above operation is repeated and the data $D_a$[n−t+1, m−s+1] is obtained from the pixel region P[n−t+1, m−s+1], the filter processing using the filter $fil_a$ on all the pixel regions P is completed.

As described above, the circuit 22a has a function of sequentially transmitting image data for every pixel region to the memory cell array in the encoder AIE. Thus, the use of the circuit 22a enables high-speed product-sum operation in the CNN.

Note that one embodiment of the present invention is not limited to the circuit 22a illustrated in FIG. 8 to FIG. 11. According to circumstances, the circuit configuration of the circuit 22a can be changed as appropriate.

Note that this embodiment can be combined with the other embodiment described in this specification as appropriate.

Embodiment 3

In this embodiment, examples of a hierarchical neural network and a circuit constituting the neural network will be described.

<Hierarchical Neural Network>

A hierarchical neural network will be described as one type of neural network that can be used for the semiconductor device of one embodiment of the present invention.

Figure 12:
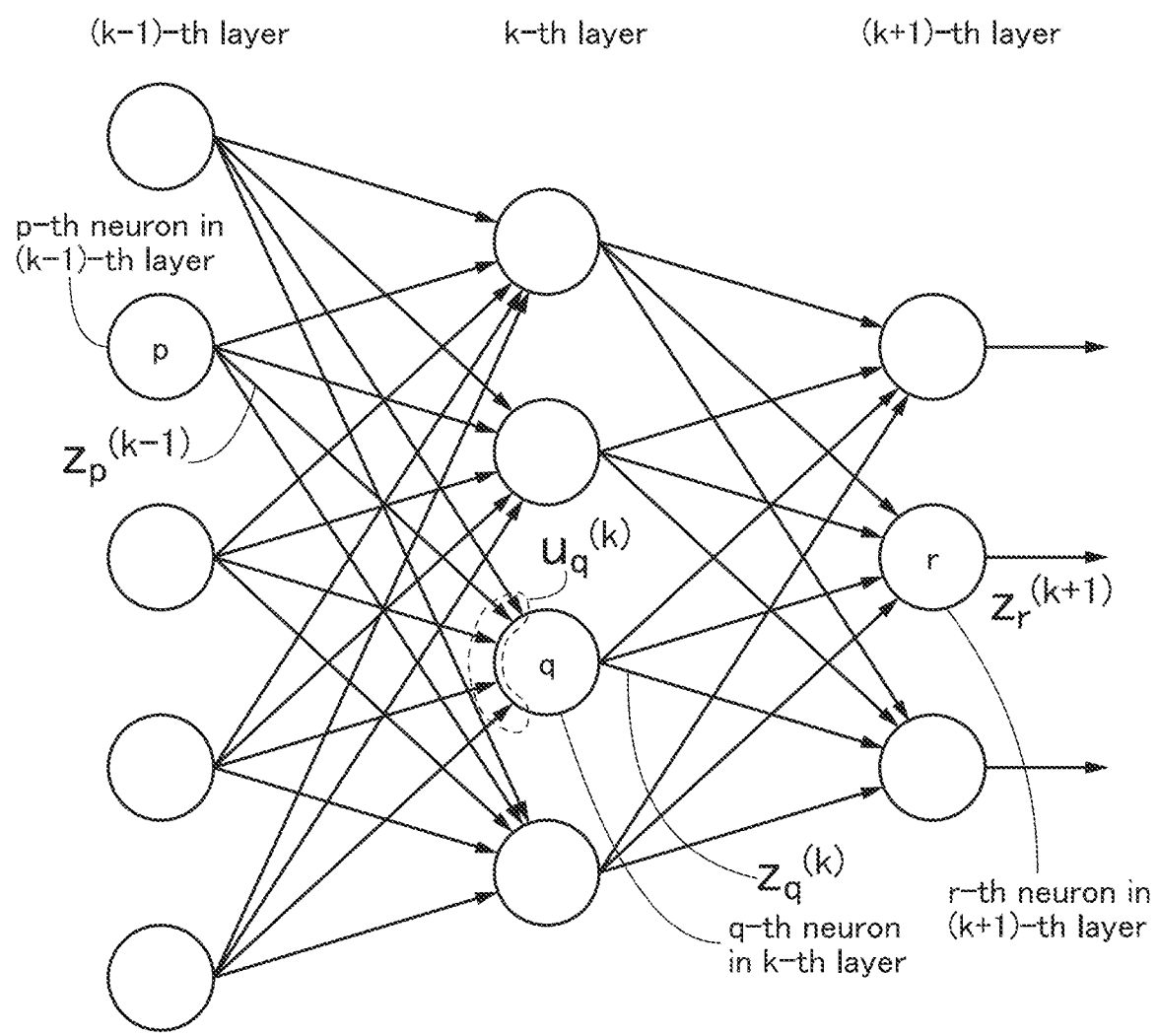
FIG. 12 A diagram illustrating an example of a hierarchical artificial neural network.

FIG. 12 is a diagram illustrating an example of a hierarchical neural network. A (k−1)-th layer (here, k is an integer greater than or equal to 2) includes P neurons (here, P is an integer greater than or equal to 1), a k-th layer includes Q neurons (here, Q is an integer greater than or equal to 1), and a (k+1)-th layer includes R neurons (here, R is an integer greater than or equal to 1).

The product of an output signal $z_p^{(k-1)}$ of the p-th neuron (here, p is an integer greater than or equal to 1 and less than or equal to P) in the (k−1)-th layer and a weight coefficient $w_{qp}^{(k)}$ is input to the q-th neuron (here, q is an integer greater than or equal to 1 and less than or equal to Q) in the k-th layer, the product of an output signal $z_q^{(k)}$ of the q-th neuron in the k-th layer and a weight coefficient $w_{rq}^{(k+1)}$ is input to the r-th neuron (here, r is an integer greater than or equal to 1 and less than or equal to R) in the (k+1)-th layer, and an output signal of the r-th neuron in the (k+1)-th layer is denoted by $z_r^{(k+1)}$.

In this case, the summation $u_q^{(k)}$ of signals input to the q-th neuron in the k-th layer is expressed by the following formula.

[Formula 3]

$$u_q^{(k)} = \Sigma w_{qp}^{(k)} z_p^{(k-1)} \tag{D1}$$

In addition, the output signal $z_q^{(k)}$ from the q-th neuron in the k-th layer is defined by the following formula.

[Formula 4]

$$z_q^{(k)} = f(u_q^{(k)}) \tag{D2}$$

Figure 15A:
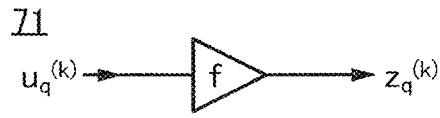
FIG. 15 Diagrams illustrating circuit configuration examples.

A function $f(u_q^{(k)})$ is an activation function, and a step function, a linear ramp function, a sigmoid function, or the like can be used. Note that product-sum operation of Formula (D1) can be performed with a multiplier circuit, an adder circuit, and the like. Note that arithmetic operation of Formula (D2) can be performed with a circuit 71 illustrated in FIG. 15(A), for example.

Note that the activation function may be the same or different among all neurons. Additionally, the activation function in one layer may be the same as or different from that in another layer.

Figure 13:
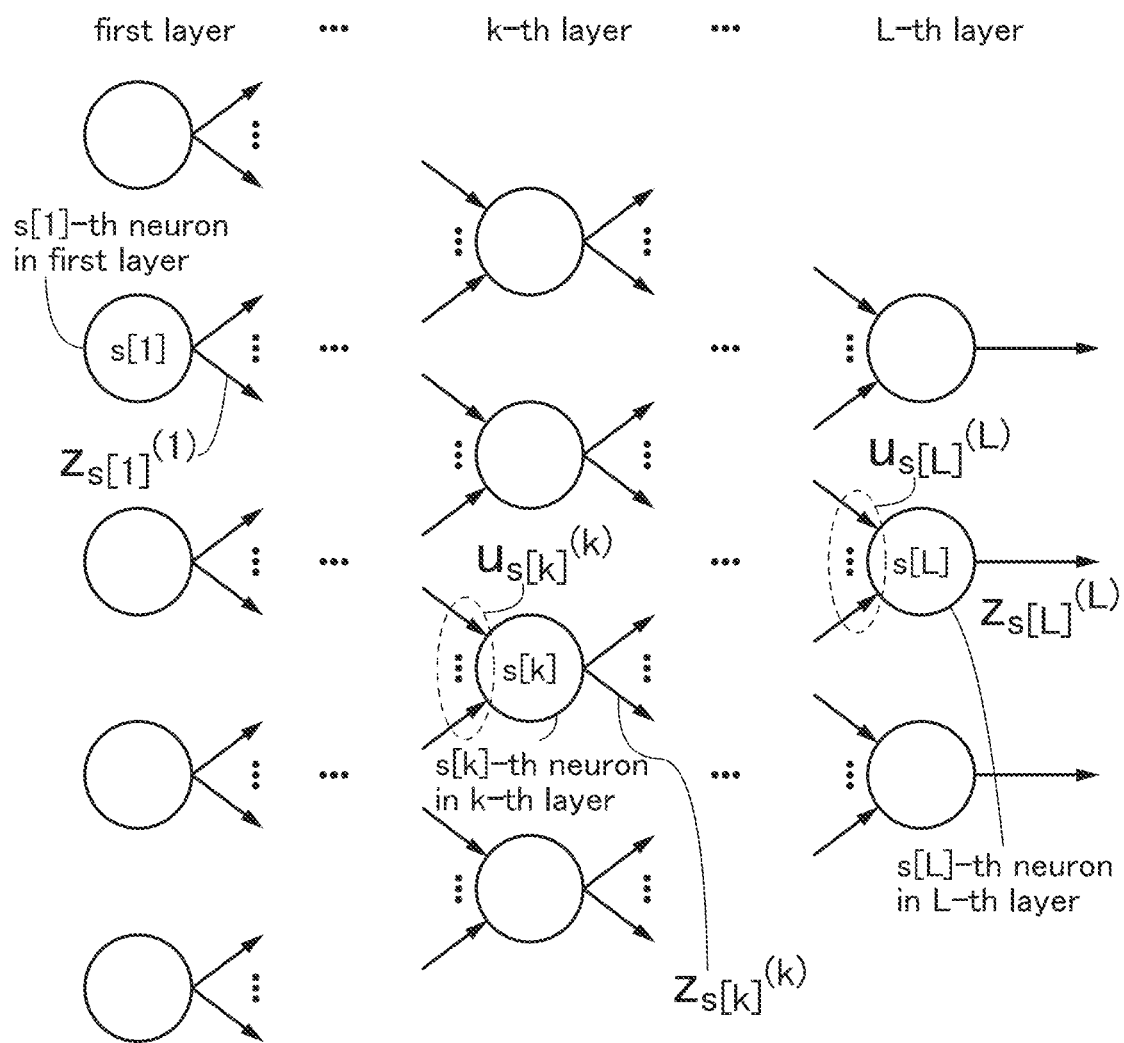
FIG. 13 A diagram illustrating an example of a hierarchical artificial neural network.

Here, a hierarchical neural network including L layers (here, L is an integer greater than or equal to 3) in total illustrated in FIG. 13 is considered (that is, here, k is an integer greater than or equal to 2 and less than or equal to (L−1)). The first layer is an input layer of the hierarchical neural network, the L-th layer is an output layer of the hierarchical neural network, and the second layer to the (L−1)-th layer are hidden layers of the hierarchical neural network.

The first layer (input layer) includes P neurons, the k-th layer (hidden layer) includes Q[k] neurons (Q[k] is an integer greater than or equal to 1), and the L-th layer (output layer) includes R neurons. An output signal of the s[1]-th neuron (s[1] is an integer greater than or equal to 1 and less than or equal to P) in the first layer is denoted by $z_{s[1]}^{(1)}$, an output signal of the s[k]-th neuron (s[k] is an integer greater than or equal to 1 and less than or equal to Q[k]) in the k-th layer is denoted by $z_{s[k]}^{(k)}$, and an output signal of the s[L]-th neuron (s[L] is an integer greater than or equal to 1 and less than or equal to R) in the L-th layer is denoted by $z_{s[L]}^{(L)}$.

Moreover, the product $u_{s[k]}^{(k)}$ of an output signal $z_{s[k-1]}^{(k-1)}$ of the s[k−1]-th neuron (s[k−1] is an integer greater than or equal to 1 and less than or equal to Q[k−1]) in the (k−1)-th layer and a weight coefficient $w_{s[k]s[k-1]}^{(k)}$ is input to the s[k]-th neuron in the k-th layer, and the product $u_{s[L]}^{(L)}$ of an output signal $z_{s[L-1]}^{(L-1)}$ of the s[L−1]-th neuron (s[L−1] is an integer greater than or equal to 1 and less than or equal to Q[L−1]) in the (L−1)-th layer and a weight coefficient $w_{s[L]s[L-1]}^{(L)}$ is input to the s[L]-th neuron in the L-th layer.

Next, supervised learning will be described. Supervised learning refers to operation of updating all weight coefficients of a hierarchical neural network on the basis of an output result and a desired result (also referred to as teacher data or a teacher signal in some cases) when the output result and the desired result differ from each other, in the above-described hierarchical neural network.

Figure 14:
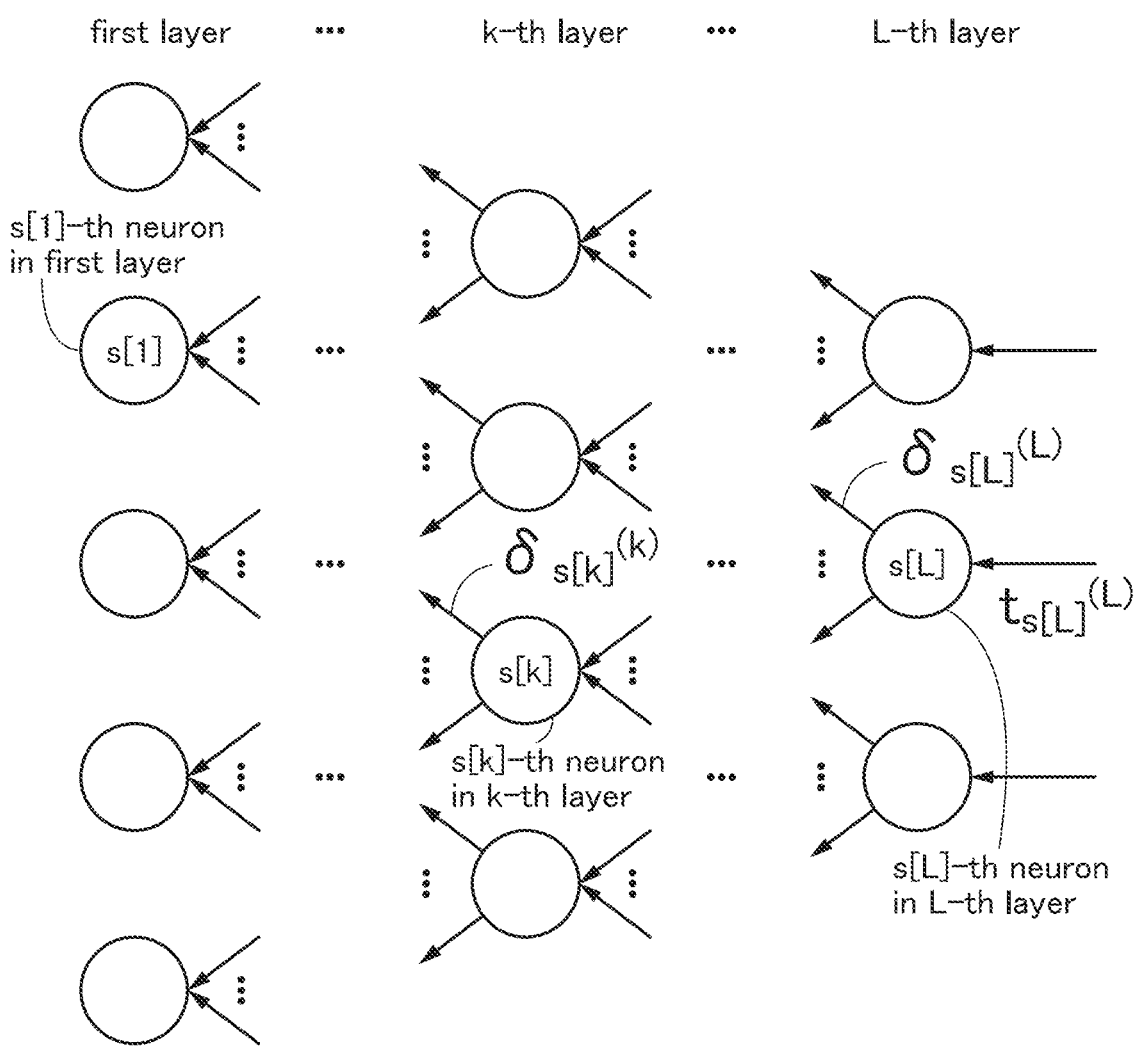
FIG. 14 A diagram illustrating an example of a hierarchical artificial neural network.

A learning method using a backpropagation method will be described as a specific example of supervised learning. FIG. 14 is a diagram illustrating a learning method using a backpropagation method. A backpropagation method is a method for changing a weight coefficient so that an error between an output of a hierarchical neural network and teacher data becomes small.

For example, assume that input data is input to the s[1]-th neuron in the first layer and output data $z_{s[L]}^{(L)}$ is output from the s[L]-th neuron in the L-th layer. Here, when a teacher signal for the output data $z_{s[L]}^{(L)}$ is $t_{s[L]}^{(L)}$, error energy E can be expressed using the output data $z_{s[L]}^{(L)}$ and a teacher signal $t_{s[L]}^{(L)}$.

The update amount of the weight coefficient $w_{s[k]s[k-1]}^{(k)}$ of the s[k]-th neuron in the k-th layer with respect to the error energy E is set to $\partial E/\partial w_{s[k]s[k-1]}^{(k)}$, whereby the weight coefficient can be updated. Here, when an error $\delta_{s[k]}^{(k)}$ of the output value $z_{s[k]}^{(k)}$ of the s[k]-th neuron in the k-th layer is defined as $\partial E/\partial u_{s[k]}^{(k)}$, $\delta_{s[k]}^{(k)}$ and $\partial E/\partial w_{s[k]s[k-1]}^{(k)}$ can be expressed by the following respective formulae.

[Formula 5]
$$\delta_{s[k]}^{(k)} = \sum_{s[k+1]} \delta_{s[k+1]}^{(k+1)} \cdot w_{s[k+1]s[k]}^{(k+1)} \cdot f'(u_{s[k]}^{(k)}) \quad (D3)$$

[Formula 6]
$$\frac{\partial E}{\partial w_{s[k]s[k-1]}^{(k)}} = \delta_{s[k]}^{(k)} \cdot z_{s[k-1]}^{(k-1)} \quad (D4)$$

Figure 15B:
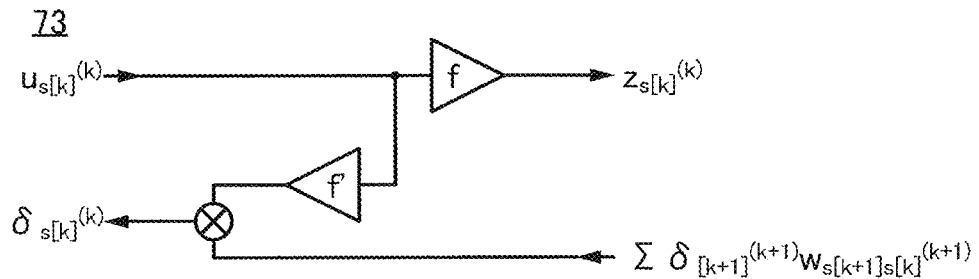
Figure 15C:
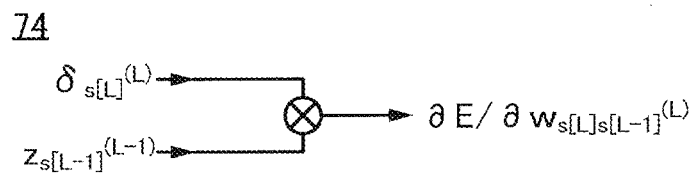

Here, $f'(u_{s[k]}^{(k)})$ is the derived function of an activation function. Note that the arithmetic operation of Formula (D3) can be computed with a circuit 73 illustrated in FIG. 15(B), for example. Moreover, the arithmetic operation of Formula (D4) can be computed with a circuit 74 illustrated in FIG. 15(C), for example. The activation function can be obtained by connecting an arithmetic circuit which corresponds to a desired derived function, to an output terminal of an operational amplifier, for example.

Furthermore, for example, the arithmetic operation for $\Sigma \delta_{s[k+1]}^{(k+1)} \cdot w_{s[k+1] \cdot s[k]}^{(k+1)}$ in Formula (D3) can be performed with an adder circuit and a multiplier circuit.

Here, when the (k+1)-th layer is an output layer, that is, when the (k+1)-th layer is the L-th layer, $\delta_{s[L]}^{(L)}$ and $\partial E/\partial w_{s[L]s[L-1]}^{(L)}$ can be expressed by the following respective formulae.

[Formula 7]
$$\delta_{s[L]}^{(L)} = (z_{s[L]}^{(L)} - t_{s[L]}^{(L)}) \cdot f'(u_{s[L]}^{(L)}) \quad (D5)$$

[Formula 8]
$$\frac{\partial E}{\partial w_{s[L]s[L-1]}^{(L)}} = \delta_{s[L]}^{(L)} \cdot z_{s[L-1]}^{(L-1)} \quad (D6)$$

Figure 15D:
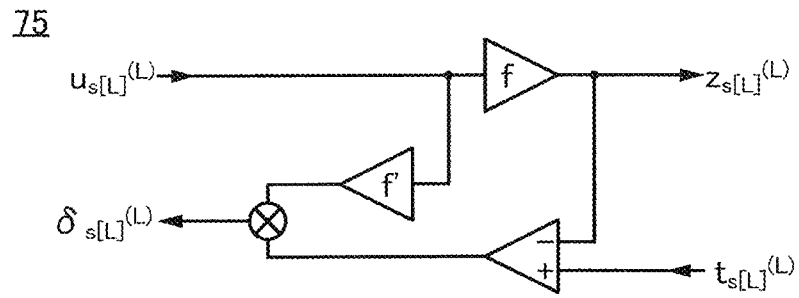

The arithmetic operation of Formula (D5) can be computed with a circuit 75 illustrated in FIG. 15(D). Moreover, the arithmetic operation of Formula (D6) can be computed with the circuit 74 illustrated in FIG. 15(C).

That is to say, the errors $\delta_{s[k]}^{(k)}$ and $\delta_{s[L]}^{(L)}$ of all neuron circuits can be obtained by Formula (D1) to Formula (D6).

Note that the update amounts of weight coefficients are set on the basis of the errors $\delta_{s[k]}^{(k)}$ and $\delta_{s[L]}^{(L)}$, desired parameters, and the like.

As described above, by using the circuits illustrated in FIG. 15(A) to FIG. 15(D) and a product-sum operation circuit MAC to be described later, computation with the hierarchical neural network using supervised learning can be performed.

Circuit Configuration Example of Hierarchical Neural Network

Figure 16:
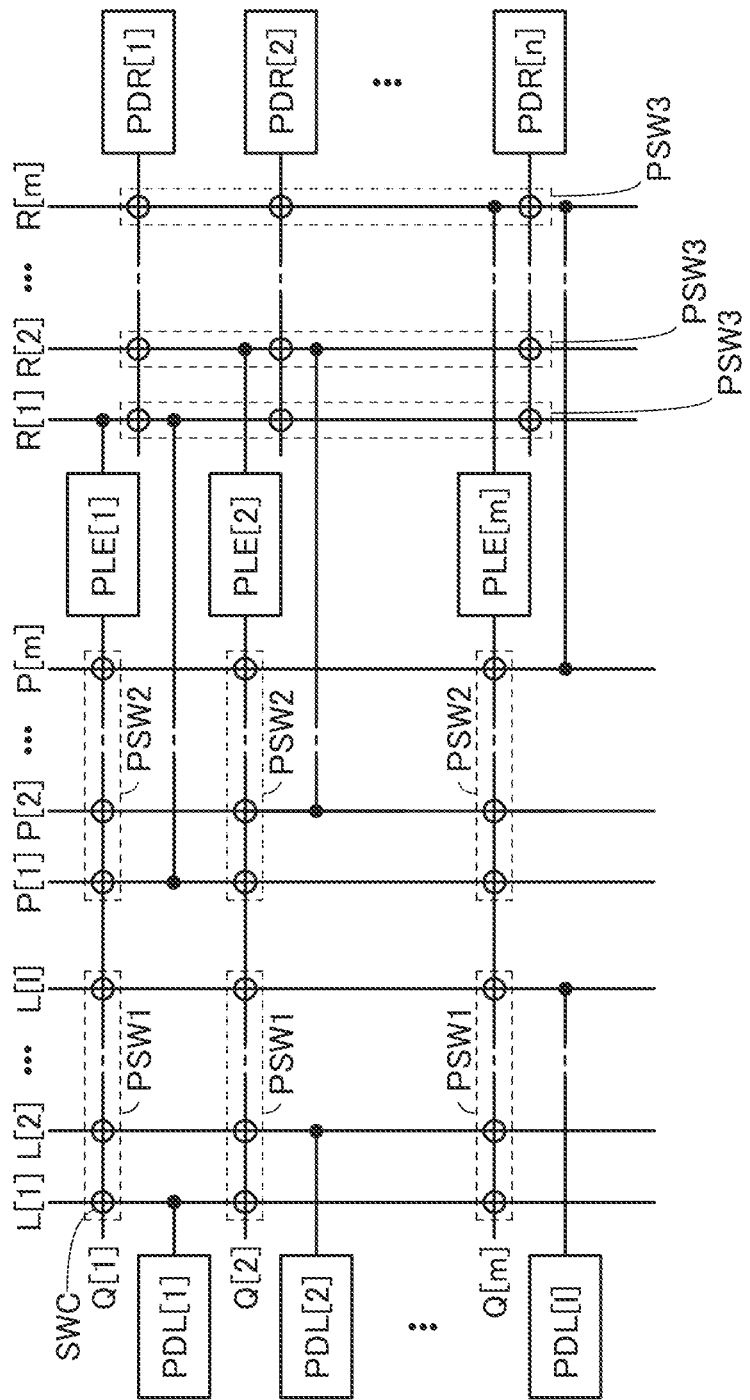
FIG. 16 A block diagram illustrating a circuit configuration example.

FIG. 16 is a block diagram illustrating a circuit configuration example of a hierarchical neural network.

An NN (neural network) circuit 80 includes an input terminal PDL[1] to an input terminal PDL[l] (here, l is an integer greater than or equal to 1), an output terminal PDR[1] to an output terminal PDR[n] (here, n is an integer greater than or equal to 1), a programmable logic element PLE[1] to a programmable logic element PLE[m], a wiring L[1] to a wiring L[l], a wiring P[1] to a wiring P[m], a wiring R[1] to a wiring R[m], a wiring Q[1] to a wiring Q[m], a plurality of programmable switches PSW1, a plurality of programmable switches PSW2, and a plurality of programmable switches PSW3.

Note that in the NN circuit 80 illustrated in FIG. 16, only the input terminal PDL[1], the input terminal PDL[2], the input terminal PDL[l], the output terminal PDR[1], the output terminal PDR[2], the output terminal PDR[n], the programmable logic element PLE[1], the programmable logic element PLE[2], the programmable logic element PLE[m], the wiring L[1], the wiring L[2], the wiring L[l], the wiring P[1], the wiring P[2], the wiring P[m], the wiring R[1], the wiring R[2], the wiring R[m], the wiring Q[1], the wiring Q[2], the wiring Q[m], the programmable switches PSW1, the programmable switches PSW2, the programmable switches PSW3, and later-described switch circuits SWC are illustrated, and the other circuits, elements, wirings, and reference numerals are omitted.

The NN circuit 80 is a multi-context programmable arithmetic processing device using the programmable logic element PLE[1] to the programmable logic element PLE[m] and the programmable switch PSW1 to the programmable switch PSW3. As specifically described later, the arithmetic processing device includes a hierarchical artificial neural network in which each network connection state between layers corresponds to a context, and can perform neural network arithmetic processing by sequentially switching contexts.

The input terminal PDL[i] (here, i is an integer greater than or equal to 1 and less than or equal to l) is electrically connected to the wiring L[i]. The output terminal PDR[k] (here, k is an integer greater than or equal to 1 and less than or equal to n) is electrically connected to the wiring R[1] to the wiring R[m] through the programmable switches PSW3. A first terminal of the programmable logic element PLE[j] (here, j is an integer greater than or equal to 1 and less than or equal to m) is electrically connected to the wiring Q[j], and the wiring Q[j] is electrically connected to the wiring L[1] to the wiring L[l] through the programmable switches PSW1. The wiring Q[j] is also electrically connected to the wiring P[1] to the wiring P[m] through the programmable switches PSW2. A second terminal of the programmable logic element PLE[j] is electrically connected to the wiring R[j]. The wiring P[1] to the wiring P[m] are electrically connected to the wiring R[1] to the wiring R[m], respectively.

The programmable switch PSW1 to the programmable switch PSW3 included in the NN circuit 80 are switches whose conduction state and non-conduction state can be switched depending on configuration data stored in a configuration memory CMS to be described later. Note that each of the programmable switch PSW1 to the programmable switch PSW3 includes the switch circuits SWC. The details of the program switch PSW1 to the program switch PSW3 will be described later.

Figure 17A:
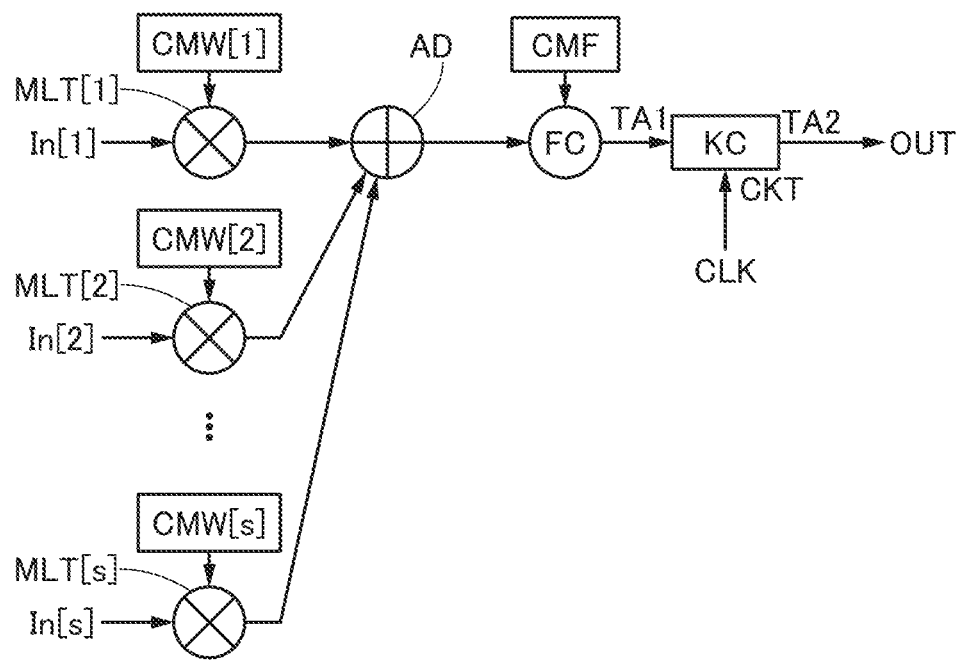
FIG. 17 A block diagram and a circuit diagram illustrating a configuration example of a product-sum operation circuit.

The programmable logic element PLE includes an arithmetic processing circuit 90 illustrated in FIG. 17(A). The arithmetic processing circuit 90 includes an input terminal In[1] to an input terminal In[s] (here, s is an integer greater than or equal to 1), an output terminal OUT, a multiplier circuit MLT[1] to a multiplier circuit MLT[s], an adder circuit AD, an activation function circuit FC, a retention circuit KC, a configuration memory CMW[1] to a configuration memory CMW[s], and a configuration memory CMF. Note that the configuration memory CMW[1] to the configuration memory CMW[s] may be one configuration memory. The configuration memory CMW[1] to the configuration memory CMW[s] and the configuration memory CMF may be one configuration memory.

The input terminal In[h] (here, h is an integer greater than or equal to 1 and less than or equal to s) is electrically connected to an input terminal of the multiplier circuit MLT[h], and an output terminal of the multiplier circuit MLT[h] is electrically connected to an input terminal of the adder circuit AD. An output terminal of the adder circuit AD is electrically connected to an input terminal of the activation function circuit FC. An output terminal of the activation function circuit FC is electrically connected to a terminal TA1 of the retention circuit KC. A terminal TA2 of the retention circuit KC is electrically connected to the output terminal OUT.

The multiplier circuit MLT[h] is a circuit that performs multiplication using data retained by the configuration memory CMW[h] (hereinafter referred to as a weight coefficient) as a multiplier and an input signal input to the input terminal In[h] as a multiplicand. The adder circuit AD computes the sum of multiplication results output from the multiplier circuit MLT[1] to the multiplier circuit MLT[s]. In other words, the multiplier circuit MLT[1] to the multiplier circuit MLT[s] and the adder circuit AD constitute a product-sum operation circuit.

The activation function circuit FC is a circuit that performs arithmetic operation on a signal input to the input terminal, that is, the result of the product-sum operation, using a function system defined by data retained by the configuration memory CMF. For example, a sigmoid function, a tanh function, a softmax function, a ReLU function, a threshold function, or the like can be used as the function system.

The retention circuit KC has a function of obtaining an operation result output from the activation function circuit FC from the terminal TA1 and temporarily retaining the operation result and a function of outputting the temporarily retained operation result to the terminal TA2. In addition, the retention circuit KC can switch the above-described two functions in response to a clock signal CLK input to a terminal CKT.

For example, the retention circuit KC can retain a potential input from the terminal TA1 when the clock signal CLK has a high-level potential, and the retention circuit KC can output the potential from the terminal TA2 to the output terminal OUT when the clock signal CLK has a low-level potential.

In the case where the arithmetic processing circuit 90 is a circuit that handles digital data, a flip-flop circuit can be used as the retention circuit KC, for example.

Figure 17B:
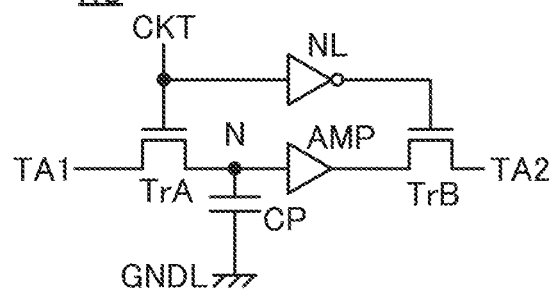

In the case where the arithmetic processing circuit 90 is a circuit that handles analog data, a retention circuit KC illustrated in FIG. 17(B) can be used, for example. The retention circuit KC illustrated in FIG. 17(B) is a sample-and-hold circuit including a transistor TrA, a transistor TrB, a capacitor CP, an amplifier AMP, and a NOT circuit NL.

A first terminal of the transistor TrA is electrically connected to the terminal TA1, a second terminal of the transistor TrA is electrically connected to a first terminal of the capacitor CP, and a gate of the transistor TrA is electrically connected to the terminal CKT. An input terminal of the amplifier AMP is electrically connected to the second terminal of the transistor TrA, and an output terminal of the amplifier AMP is electrically connected to a first terminal of the transistor TrB. A second terminal of the transistor TrB is electrically connected to the terminal TA2. An input terminal of the NOT circuit NL is electrically connected to the terminal CKT, and an output terminal of the NOT circuit NL is electrically connected to a gate of the transistor TrB. A second terminal of the capacitor CP is electrically connected to a wiring GNDL. Note that a connection point of the second terminal of the transistor TrA, the input terminal of the amplifier AMP, and the first terminal of the capacitor CP is referred to as a node N.

The amplifier AMP has a function of amplifying a signal input to the input terminal by a factor of 1 and outputting the amplified signal to the output terminal.

The wiring GNDL is a wiring that supplies a reference potential.

When the clock signal CLK input to the terminal CKT has a high-level potential, the transistor TrA is brought into a conduction state and the transistor TrB is brought into a non-conduction state. In that case, a signal input from the terminal TA1 is input to the amplifier AMP through the transistor TrA. Therefore, the amplifier AMP amplifies the signal and outputs the amplified signal from the output terminal of the amplifier AMP. Note that the amplified signal is not output from the terminal TA2 because the transistor TrB is in a non-conduction state.

In addition, the potential of the node N is retained by the capacitor CP. The potential of the node N in this case becomes the potential of the signal input from the terminal TA1.

When the clock signal CLK input to the terminal CKT has a low-level potential, the transistor TrA is brought into a non-conduction state and the transistor TrB is brought into a conduction state. The potential of the node N does not change because the transistor TrA is in a non-conduction state. The amplifier AMP outputs the potential of the node N to the first terminal of the transistor TrB. Since the transistor TrB is in a conduction state, the potential of the node N, that is, the potential of the signal input from the terminal TA1 when the clock signal CLK has a high-level potential is output from the terminal TA2.

It is preferable that the transistor TrA and/or the transistor TrB be an OS transistor, which will be described in Embodiment 5. It is particularly preferable that the OS transistor use an oxide containing at least one of indium, an element M (aluminum, gallium, yttrium, tin, and the like can be given as the element M), and zinc in a channel formation region. The use of such an OS transistor as the transistor TrA and/or the transistor TrB enables the off-state current of the transistor(s) to be extremely low. Thus, the influence of electric charge leakage due to the off-state current of the transistor can be reduced.

Note that FIG. 17(A) illustrates only the input terminal In[1], the input terminal In[2], the input terminal In[s], the multiplier circuit MLT[1], the multiplier circuit MLT[2], the multiplier circuit MLT[s], the configuration memory CMW [1], the configuration memory CMW[2], the configuration memory CMW[s], the configuration memory CMF, the adder circuit AD, the activation function circuit FC, the retention circuit KC, the terminal TA1, the terminal TA2, the terminal CKT, the output terminal OUT, and the clock signal CLK, and the other circuits, elements, wirings, and reference numerals are omitted.

Note that the structure of the retention circuit KC of the arithmetic processing circuit 90 is not limited to the above-described structure. According to circumstances, the structure of the retention circuit KC can be changed as appropriate.

Note that a structure in which data writing to the configuration memory CMW[1] to the configuration memory CMW[s] and the configuration memory CMF in the arithmetic processing circuit 90 and data writing to the later-described configuration memory CMS which sets the states of the programmable switch PSW1 to the programmable switch PSW3 are performed by different driver circuits may be used. In other words, it is possible to repeatedly update data in the configuration memory CMW[1] to the configuration memory CMW[s] and the configuration memory CMF in the arithmetic processing circuit 90 without updating data in the configuration memories CMS for the programmable switch PSW1 to the programmable switch PSW3. This enables efficient learning in a neural network.

In addition, in a multi-context system which includes a plurality of sets of configuration memories in the case where a weight coefficient of the product-sum operation in each layer of the neural network corresponds to configuration data of each context, it is possible to sequentially perform the product-sum operation in each layer with a few circuit resources by switching contexts.

Note that although the structure in which one programmable logic element includes the individual arithmetic processing circuit 90 is described in the above description, a plurality of programmable logic elements and a programmable switch connecting the programmable logic elements can constitute one product-sum operation circuit.

Figure 18A:
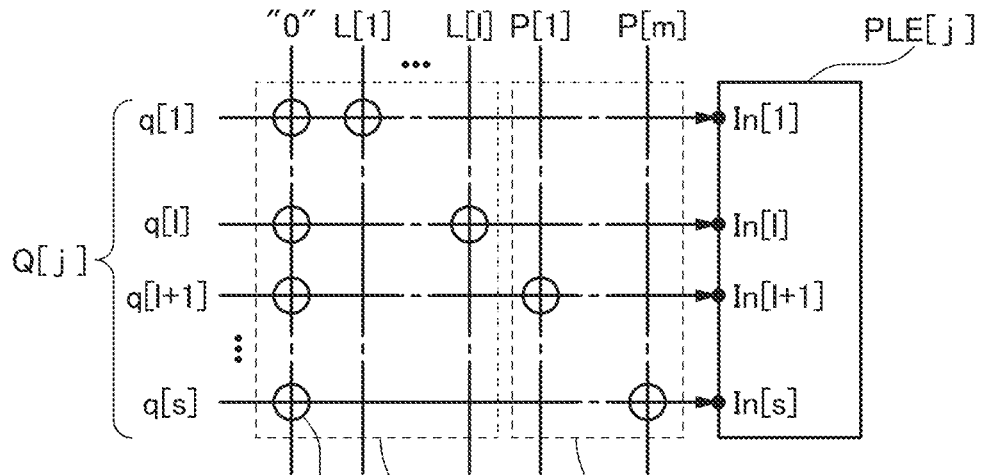
FIG. 18 Block diagrams and a circuit diagram illustrating programmable switches.
Figure 18B:
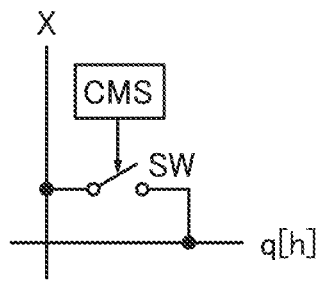

Next, the structures of the programmable switch PSW1 to the programmable switch PSW3 will be described. FIG. 18(A) illustrates an example of connections of the wiring L[1] to the wiring L[l], the wiring P[1] to the wiring P[m], the wiring Q[j], the programmable switch PSW1, the programmable switch PSW2, and the programmable logic element PLE[j] in the NN circuit 80, and FIG. 18(B) illustrates a configuration example of the switch circuit SWC.

Note that the wiring Q[j] in FIG. 18(A) includes a wiring q[1] to a wiring q[s]. In addition, the first terminal of the programmable logic element PLE[j] in FIG. 18(A) corresponds to the terminal In[1] to the terminal In[s] of the arithmetic processing circuit 90 described with FIG. 17(A). That is, the wiring q[h] is electrically connected to the terminal In[h] in FIG. 18(A).

Furthermore, in FIG. 18(A), the wiring q[1] to the wiring q[s] are electrically connected to a wiring "0" through the programmable switch PSW1. The wiring "0" is a wiring that supplies a signal having a value 0 (the potential of the signal is a reference potential).

In the structure example illustrated in FIG. 18(A), the programmable switch PSW1 and the programmable switch PSW2 include the switch circuits SWC. A structure example of the switch circuit SWC is illustrated in FIG. 18(B). A first terminal of a switch SW is electrically connected to the wiring q[h], and a second terminal of the switch SW is electrically connected to a wiring X. Note that the wiring X is any one of the wiring "0," the wiring L[1] to the wiring L[l], and the wiring P[1] to the wiring P[m]. The conduction state or the non-conduction state of the switch SW is determined by data retained by the configuration memory CMS.

In other words, each of the programmable switch PSW1 and the programmable switch PSW2 which are illustrated in FIG. 18(A) is brought into a conduction state or a non-conduction state depending on the data in the configuration memory CMS. That is, whether each of the wiring "0," the wiring L[1] to the wiring L[l], and the wiring P[1] to the wiring P[m] is connected to or disconnected from each of the terminal In[1] to the terminal In[s] can be controlled by the data in the configuration memories CMS.

In particular, in the case where no signal is input to at least one of the terminal In[1] to the terminal In[s], the switch circuit SWC connecting that terminal and the wiring "0" is brought into a conduction state. In that case, the power consumption of the multiplier circuit corresponding to that terminal can be reduced by power gating.

As the switch SW illustrated in FIG. 18(B), a switch using a MEMS (micro electro mechanical system) technology, such as a transistor, a diode, or a digital micromirror device (DMD), can be used, for example. Alternatively, the switch SW may be a logic circuit in which transistors are combined. In the case where the switch SW is one transistor, an OS transistor having a characteristic of an extremely low off-state current is preferably used.

Figure 18C:
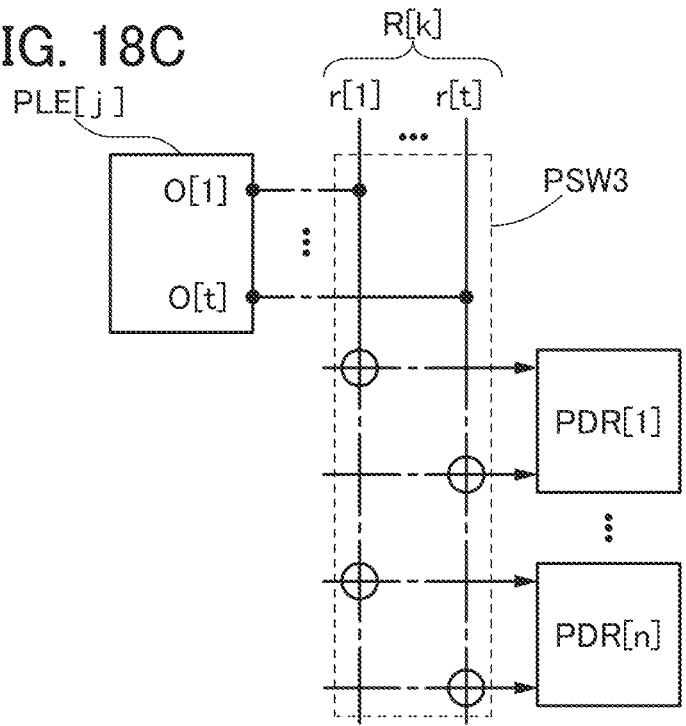

FIG. 18(C) illustrates an example of connections of the wiring R[k], the programmable switch PSW3, the programmable logic element PLE[j], and the output terminal PDR[1] to the output terminal PDR[n] in the NN circuit 80.

Note that the wiring R[k] in FIG. 18(C) includes a wiring r[1] to a wiring r[t] (here, t is an integer greater than or equal to 1). In addition, the second terminal of the programmable logic element PLE[j] is illustrated in FIG. 18(C) as a terminal O[1] to a terminal O[t]. That is, the wiring r[u] is electrically connected to the terminal O[u] (here, u is an integer greater than or equal to 1 and less than or equal to t). Note that although the plurality of second terminals are illustrated in FIG. 18(C), they may be a single terminal. In that case, the wiring r[1] to the wiring r[t] can be a single wiring.

In the structure example illustrated in FIG. 18(C), the programmable switch PSW3 includes the switch circuits SWC. That is, as in the programmable switch PSW1 and the programmable switch PSW2, the conduction state or the non-conduction state of the switch SW included in the switch circuit SWC can be determined by data retained by the configuration memory CMS. Thus, whether each of the terminal O[1] to the terminal O[t] is connected to or disconnected from each of the output terminal PDR[1] to the output terminal PDR[n] can be controlled by the data in the configuration memories CMS.

Note that an SRAM or an MRAM can be used as the above-described configuration memory CMS, configuration memory CMW[1] to configuration memory CMW[s], and configuration memory CMF, for example. Alternatively, a memory device using an OS transistor (referred to as an OS memory in this specification) can be used, for example. In particular, when an OS memory is used as the above-described configuration memory, a neural network with low power consumption can be formed with a small number of elements.

When each of the multiplier circuit MLT[1] to the multiplier circuit MLT[s] and the adder circuit AD described above is an analog product-sum operation circuit, the number of transistors included in the product-sum operation circuit can be reduced. Note that the analog product-sum operation circuit will be described later in this embodiment.

Operation Example of Circuit in Hierarchical Neural Network

Next, an operation example of the NN circuit 80 will be described with reference to FIG. 19 to FIG. 21.

Note that the number of contexts for the NN circuit 80 is N in this operation example. That is, each of the plurality of configuration memories CMS, the configuration memory CMW[1] to the configuration memory CMW[s], and the configuration memories CMF included in the NN circuit 80 contains N sets of configuration data.

Moreover, the neural network described in this operation example is a hierarchical neural network including an input layer and a first intermediate layer to an N−1-th intermediate layer. In particular, the N−1-th intermediate layer is an output layer of the hierarchical neural network.

Figure 19:
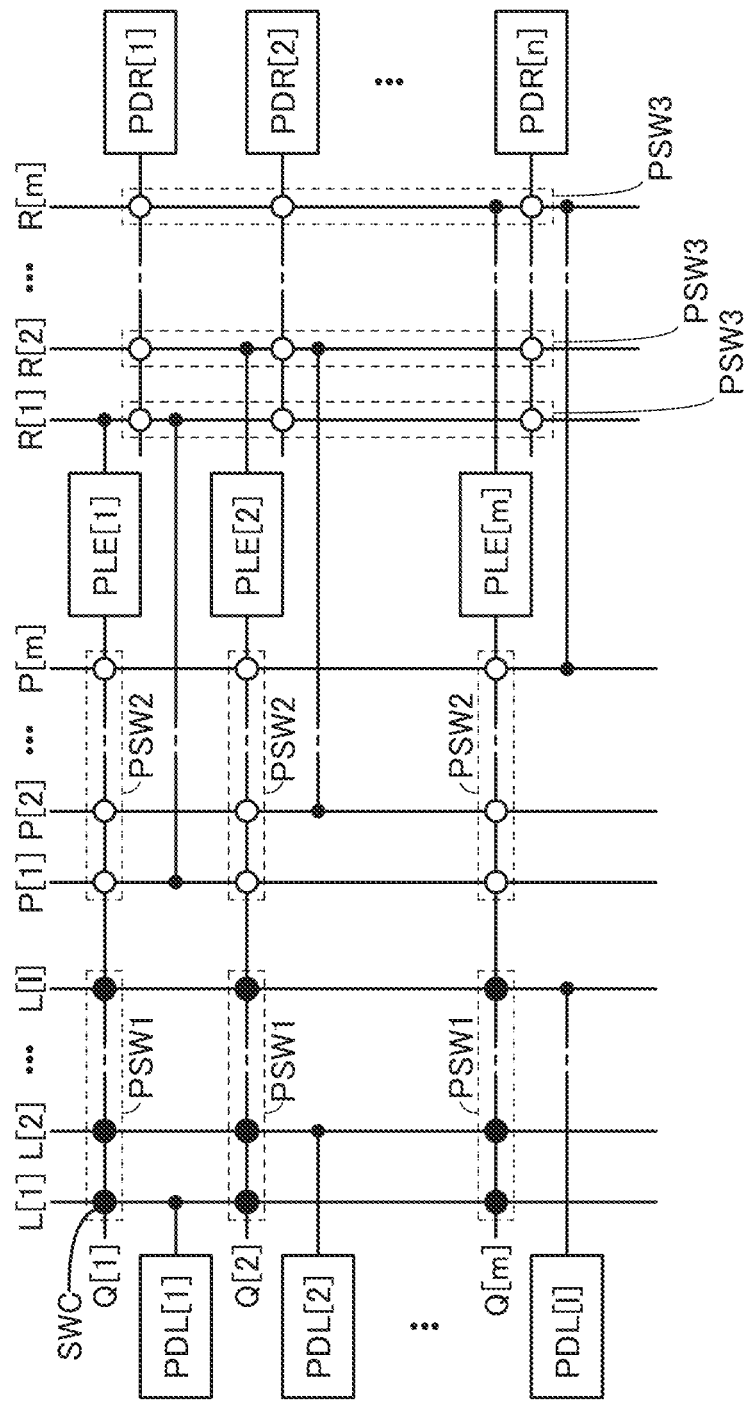
FIG. 19 A block diagram illustrating a circuit configuration example.
Figure 20:
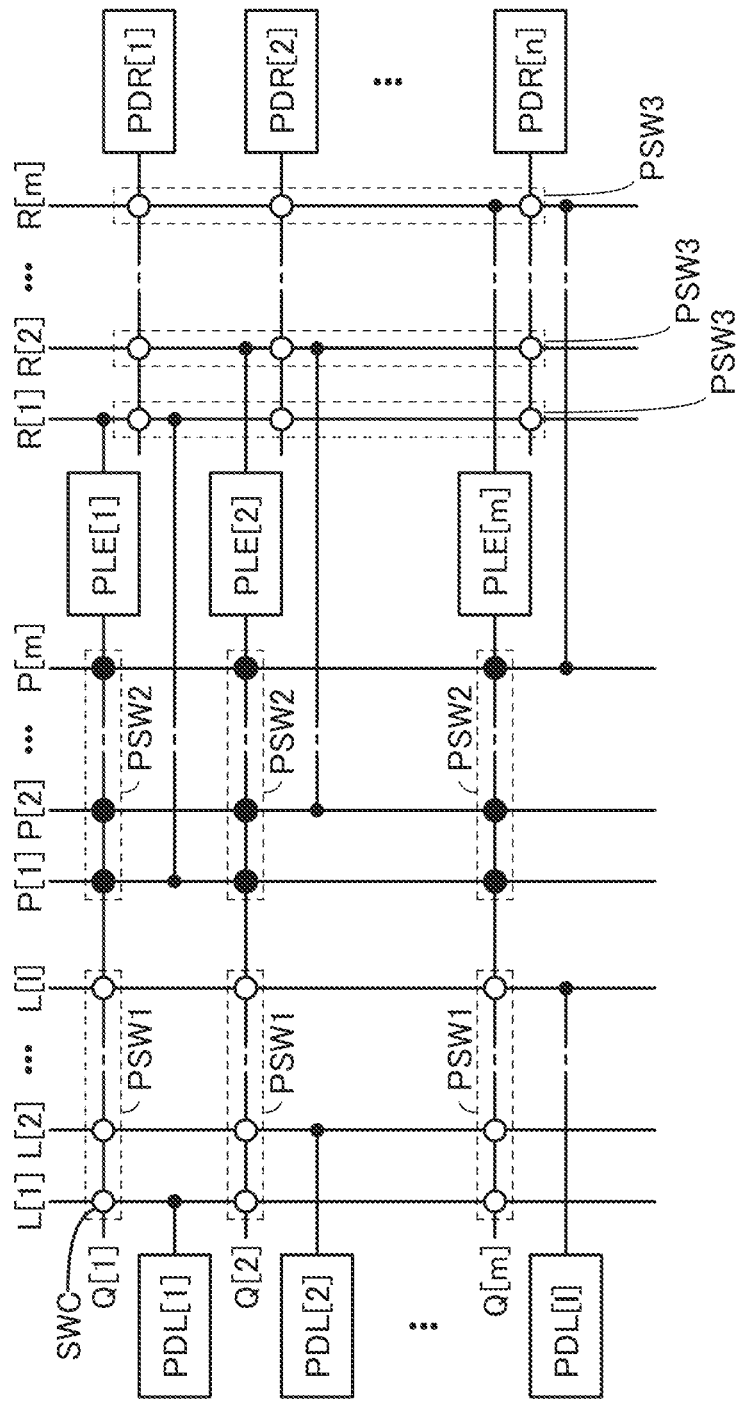
FIG. 20 A block diagram illustrating a circuit configuration example.
Figure 21:
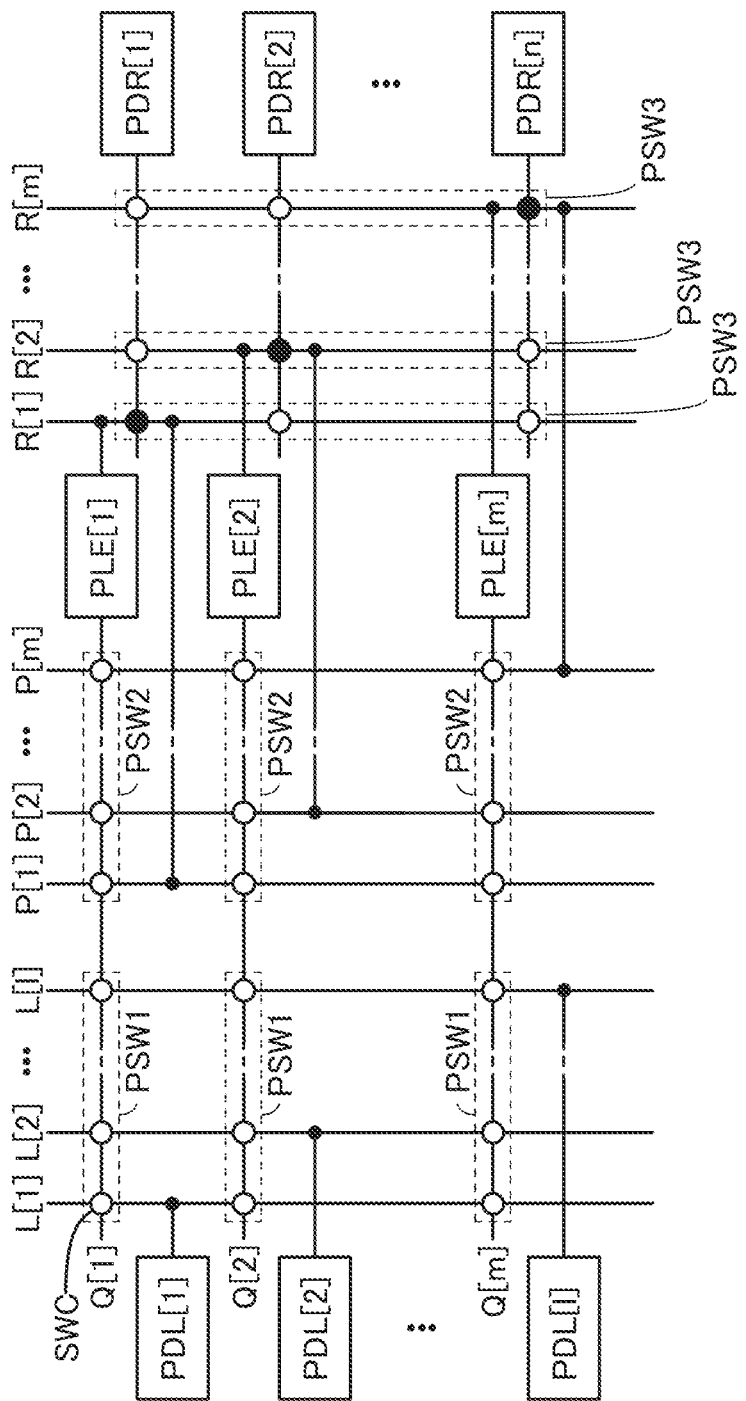
FIG. 21 A block diagram illustrating a circuit configuration example.

Furthermore, in FIG. 19 to FIG. 21, the switch circuit SWC in a conduction state is indicated by a black circle, and the switch circuit SWC in a non-conduction state is indicated by a white circle.

In addition, for the structures of the wiring Q[1] to the wiring Q[m], the wiring R[1] to the wiring R[m], and the programmable switch PSW1 to the programmable switch PSW3, the description of FIGS. 18(A), 18(B), and 18(C) can be referred to.

First, a context 1 is selected. The context 1 is a configuration corresponding to a network between the input layer and the first intermediate layer. The NN circuit 80 corresponding to the context 1 is illustrated in FIG. 19.

At that time, configuration data is set for the programmable switch PSW1 to the programmable switch PSW3 so that the programmable logic element PLE[1] to the programmable logic element PLE[m] are electrically connected to the wiring L[1] to the wiring L[l]. In addition, configuration data is set for the programmable logic element PLE[1] to the programmable logic element PLE[m] so that a weight coefficient for each neuron in the first intermediate layer with respect to an output signal of the neurons in the input layer is set in each of the programmable logic element PLE[1] to the programmable logic element PLE[m].

Signals input from the input layer to the first intermediate layer correspond to signals input from the input terminal PDL[1] to the input terminal PDL[l]. A signal input from the input terminal PDL[i] is transmitted to each of the wiring Q[1] to the wiring Q[m] through the wiring L[i]. Then, the signal transmitted to the wiring Q[j] is input to the first terminal of the programmable logic element PLE[j].

The plurality of signals input to the first terminals of the programmable logic element PLE[1] to the programmable logic element PLE[m] are subjected to arithmetic processing by the product-sum operation circuit and the activation function circuit of each programmable logic element. Specifically, product-sum operation using the plurality of signals and their respective weight coefficients corresponding to the signals and activation function operation using the result of the product-sum operation as input information are performed. Note that the weight coefficient and the activation function are based on the configuration of the context 1, as described above.

The output result of the activation function operation is retained by the retention circuit KC illustrated in FIG. 17. Note that the data retention by the retention circuit KC is performed when the potential of the clock signal CLK changes from a low-level potential to a high-level potential. Moreover, the data retained by the retention circuit KC is output when the potential of the clock signal CLK changes from the high-level potential to the low-level potential.

Next, a context 2 is selected. The context 2 is a configuration corresponding to a network between the first intermediate layer and the second intermediate layer. The NN circuit 80 corresponding to the context 2 is illustrated in FIG. 20.

At that time, configuration data is set for the programmable switch PSW1 to the programmable switch PSW3 so that the programmable logic element PLE[1] to the programmable logic element PLE[m] are electrically connected to the wiring P[1] to the wiring P[m]. In addition, configuration data is set for the programmable logic element PLE[1] to the programmable logic element PLE[m] so that a weight coefficient for each neuron in the second intermediate layer with respect to an output signal of the neurons in the first intermediate layer is set in each of the programmable logic element PLE[1] to the programmable logic element PLE[m].

In that configuration, data output from the second terminals of the programmable logic element PLE[1] to the programmable logic element PLE[m] are the above-described data stored in the retention circuits KC, that is, the results of the activation function operation based on the context 1. The results are output from the second terminals of the programmable logic element PLE[1] to the programmable logic element PLE[m] when the potential of the clock signal CLK for the retention circuit KC changes from the high-level potential to the low-level potential. The result output from the second terminal of the programmable logic element PLE[j] is transmitted to each of the wiring Q[1] to the wiring Q[m] through the wiring P[j]. Then, the signal transmitted to the wiring Q[j] is input to the first terminal of the programmable logic element PLE[j].

That is, the signals input from the first intermediate layer to the second intermediate layer correspond to the signals output from the second terminals of the programmable logic element PLE[1] to the programmable logic element PLE[m].

The plurality of signals input to the first terminals of the programmable logic element PLE[1] to the programmable logic element PLE[m] are subjected to arithmetic processing by the product-sum operation circuit and the activation function circuit of each programmable logic element. Specifically, product-sum operation using the plurality of signals and their respective weight coefficients corresponding to the signals and activation function operation using the result of the product-sum operation as input information are performed. Note that the weight coefficient and the activation function are based on the configuration of the context 2, as described above.

The output result of the activation function operation is retained by the retention circuit KC illustrated in FIG. 17, as in the operation based on the context 1.

The subsequent operation of the NN circuit 80 is performed in a manner similar to that based on the context 2. For example, the case where a context g (here, g is an integer greater than or equal to 3 and less than or equal to N−1) is selected is considered. The context g is a configuration corresponding to a network between the g−1-th intermediate layer and the g-th intermediate layer. Note that the contents of FIG. 20 are referred to for connection states in the NN circuit 80 corresponding to the context g.

At that time, configuration data is set for the programmable switch PSW1 to the programmable switch PSW3 so that the programmable logic element PLE[1] to the programmable logic element PLE[m] are electrically connected to the wiring P[1] to the wiring P[m]. In addition, configuration data is set for the programmable logic element PLE[1] to the programmable logic element PLE[m] so that a weight coefficient for each neuron in the g-th intermediate layer with respect to an output signal of neurons in the g−1-th intermediate layer is set in each of the programmable logic element PLE[1] to the programmable logic element PLE[m].

In that configuration, data output from the second terminals of the programmable logic element PLE[1] to the programmable logic element PLE[m] are the above-described data stored in the retention circuits KC, that is, the results of the activation function operation based on the context g−1. The results are output from the second terminals of the programmable logic element PLE[1] to the programmable logic element PLE[m] when the potential of the clock signal CLK for the retention circuit KC changes from the high-level potential to the low-level potential. The result output from the second terminal of the programmable logic element PLE[j] is transmitted to each of the wiring Q[1] to the wiring Q[m] through the wiring P[j]. Then, the signal transmitted to the wiring Q[j] is input to the first terminal of the programmable logic element PLE[j].

That is, the signals input from the g−1-th intermediate layer to the g-th intermediate layer correspond to the signals output from the second terminals of the programmable logic element PLE[1] to the programmable logic element PLE[m].

The plurality of signals input to the first terminals of the programmable logic element PLE[1] to the programmable logic element PLE[m] are subjected to arithmetic processing by the product-sum operation circuit and the activation function circuit of each programmable logic element. Specifically, product-sum operation using the plurality of signals and their respective weight coefficients corresponding to the signals and activation function operation using the result of the product-sum operation as input information are performed. Note that the weight coefficient and the activation function are based on the configuration of the context g, as described above.

The output result of the activation function operation is retained by the retention circuit KC illustrated in FIG. 17, as in the operations based on the context 1 and the context 2.

Lastly, a context N is selected. The context N is a configuration corresponding to connections between the N−1-th intermediate layer (output layer) and the output terminal PDR[1] to the output terminal PDR[n]. The NN circuit 80 corresponding to the context N is illustrated in FIG. 21.

At that time, configuration data are set for the programmable switch PSW1 to the programmable switch PSW3 so that the programmable logic element PLE[1] to the programmable logic element PLE[m] are electrically connected to the wiring R[1] to the wiring R[m].

In that configuration, data output from the second terminals of the programmable logic element PLE[1] to the programmable logic element PLE[m] are the above-described data stored in the retention circuits KC, that is, the results of the activation function operation based on the context N−1. The results are output from the second terminals of the programmable logic element PLE[1] to the programmable logic element PLE[m] when the potential of the clock signal CLK for the retention circuit KC changes from the high-level potential to the low-level potential. The results output from the second terminals of the programmable logic element PLE[1] to the programmable logic element PLE[m] are transmitted to the output terminal PDR[1] to the output terminal PDR[n] through the wiring R[1] to the wiring R[m]. Note that the output terminal PDR[n] refers to the output terminal PDR[m] here.

That is, the output results of the hierarchical neural network which are output from the N−1-th intermediate layer (output layer) correspond to the signals output from the second terminals of the programmable logic element PLE[1] to the programmable logic element PLE[m].

Note that the power consumption of the programmable logic elements that are not used as neurons in the input layer and the first intermediate layer to the N−1-th intermediate layer can be reduced by the above-described power gating.

Furthermore, in the arithmetic processing circuit 90 in FIG. 17, the weight coefficient can be updated by learning. In that case, a structure in which configuration data corresponding to contexts for a desired neural network structure are generated and only configuration data on weight coefficients for the corresponding contexts are repeatedly changed is preferable. Note that the weight coefficient updating can be performed with a dedicated circuit for executing the corresponding arithmetic processing.

Moreover, the arithmetic processing circuit 90 in FIG. 17 can be configured such that the corresponding arithmetic processing is executed on a server. For example, a neural network structure is possible in which examination and learning of a hierarchical structure of a neural network are performed on a server to generate configuration data for a context corresponding to the optimized hierarchical structure and weight coefficients which are obtained by learning, the configuration data is transmitted to the arithmetic processing circuit 90 included in an electronic device other than the server, and inference (recognition) is executed in the electronic device while the contexts for the arithmetic processing circuit 90 in FIG. 17 are switched.

By forming the above-described NN circuit 80, a neural network arithmetic processing circuit which can be used for learning and inference can be obtained. In addition, a multi-context programmable neural network with a reduced circuit area owing to reduction in the number of elements and the number of wirings can be provided.

Figure 22:
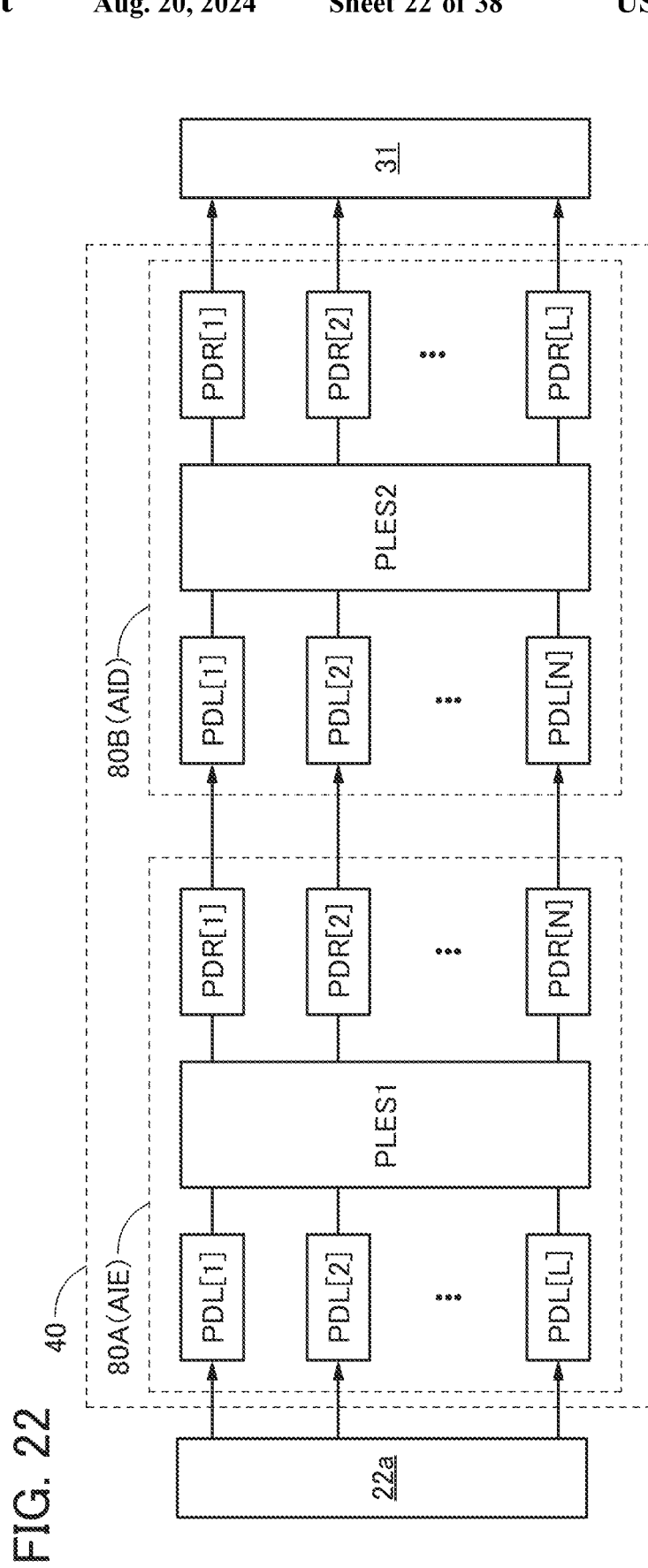
FIG. 22 A block diagram illustrating a circuit configuration example.

Here, the case where the NN circuit 80 is used as each of the encoder AIE and the decoder AID of the NN circuit 40 described in Embodiment 1 will be considered. FIG. 22 illustrates a structure example of the NN circuit 40 in which an NN circuit 80A is used as the NN circuit 80 for the encoder AIE and an NN circuit 80B is used as the NN circuit 80 for the decoder AID. In FIG. 22, the NN circuit 80A and the NN circuit 80B are electrically connected to each other. Note that FIG. 22 also illustrates the circuit 22a and the GPU 31, in addition to the NN circuit 40.

Meanwhile, the NN circuit 40 is configured such that the number of wirings electrically connecting the intermediate layer ML2 of the encoder AIE and the intermediate layer ML3 of the decoder AID is small, as illustrated in FIG. 2. In other words, the encoder AIE is configured such that the number of neurons in the intermediate layer ML2 is small, and the decoder AID is configured such that the number of neurons in the intermediate layer ML3 is small.

In view of this, a structure in which the NN circuit 80A includes the input terminal PDL[1] to an input terminal PDL[L] (here, L is an integer greater than or equal to 1) and the output terminal PDR[1] to an output terminal PDR[N]

(here, N is an integer greater than or equal to 1 and less than L), and the NN circuit 80B includes the input terminal PDL[1] to an input terminal PDL[N] and the output terminal PDR[1] to an output terminal PDR[L] is used. In addition, in FIG. 22, a plurality of programmable logic elements PLE included in the NN circuit 80A and those in the NN circuit 80B are denoted by a programmable logic element portion PLES1 and a programmable logic element portion PLES2, respectively.

As illustrated in FIG. 22, the NN circuit 40 can be formed using the NN circuit 80 as each of the encoder AIE and the decoder AID. Accordingly, image data transmitted from the circuit 22a can be converted into feature-extracted image data by the NN circuit 80A. In addition, the feature-extracted image data can be decompressed to the original image data by the NN circuit 80B, and the decompressed image data can be transmitted to the GPU 31.

Note that although the number of the input terminals PDL of the NN circuit 80A is equal to the number of the output terminals PDR of the NN circuit 80B in FIG. 22, the number of the input terminals PDL of the NN circuit 80A may differ from the number of the output terminals PDR of the NN circuit 80B according to circumstances.

Configuration Example of Product-Sum Operation Circuit

Next, an example of a circuit performing product-sum operation in the above-described NN circuit 80 will be described.

Figure 23:
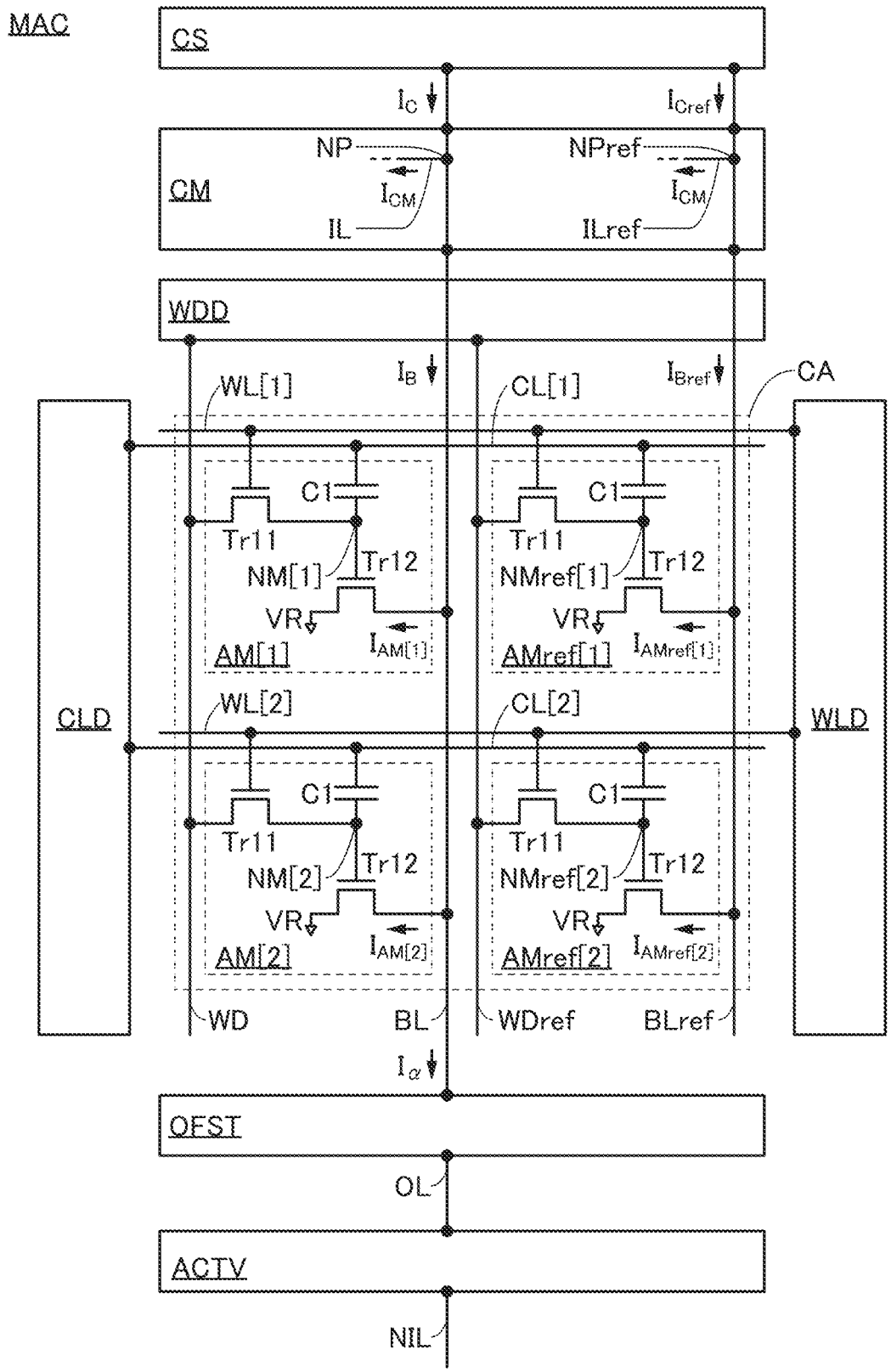
FIG. 23 A block diagram illustrating a configuration example of a product-sum operation circuit.

FIG. 23 illustrates a configuration example of the product-sum operation circuit MAC. The product-sum operation circuit MAC illustrated in FIG. 23 is a circuit that performs product-sum operation using first data retained in a memory cell described below and input second data. Note that the first data and the second data can be analog data or multilevel data (discrete data).

The product-sum operation circuit MAC includes a current supply circuit CS, a current mirror circuit CM, a circuit WDD, a circuit WLD, a circuit CLD, an offset circuit OFST, an activation function circuit ACTV, and the memory cell array CA.

The memory cell array CA includes a memory cell AM[1], a memory cell AM[2], a memory cell AMref[1], and a memory cell AMref[2]. The memory cell AM[1] and the memory cell AM[2] each have a function of retaining the first data, and the memory cell AMref[1] and the memory cell AMref[2] each have a function of retaining reference data that is needed to perform product-sum operation. The reference data can be analog data or multilevel data (discrete data), like the first data and the second data.

In the memory cell array CA in FIG. 23, memory cells are arranged in a matrix of two rows and two columns; however, the memory cell array CA may have a configuration in which memory cells are arranged in a matrix of three or more rows and three or more columns. In the case where multiplication is performed instead of product-sum operation, the memory cell array CA may have a configuration in which memory cells are arranged in a matrix of one row and two or more columns.

The memory cell AM[1], the memory cell AM[2], the memory cell AMref[1], and the memory cell AMref[2] each include a transistor Tr11, a transistor Tr12, and a capacitor C1.

Note that the transistor Tr11 is preferably an OS transistor. In addition, it is further preferable that a channel formation region of the transistor Tr11 be an oxide containing at least one of indium, the element M (as the element M, aluminum, gallium, yttrium, tin, or the like can be given), and zinc. It is further preferable that the transistor Tr11 have a structure of the transistor described in Embodiment 5, in particular.

With the use of an OS transistor as the transistor Tr11, the leakage current of the transistor Tr11 can be suppressed, so that a product-sum operation circuit with high computation accuracy can be obtained in some cases. Furthermore, with the use of an OS transistor as the transistor Tr11, the amount of leakage current from a retention node to a writing word line can be extremely small when the transistor Tr11 is in a non-conduction state. In other words, the frequency of refresh operation of the potential at the retention node can be reduced; thus, power consumption of the product-sum operation circuit can be reduced.

The use of an OS transistor also as the transistor Tr12 allows the transistor Tr12 to be formed concurrently with the transistor Tr11, leading to a reduction in the number of manufacturing steps for the product-sum operation circuit, in some cases. A channel formation region of the transistor Tr12 may be amorphous silicon, polycrystalline silicon, or the like instead of an oxide.

In each of the memory cell AM[1], the memory cell AM[2], the memory cell AMref[1], and the memory cell AMref[2], a first terminal of the transistor Tr11 is electrically connected to a gate of the transistor Tr12. A first terminal of the transistor Tr12 is electrically connected to a wiring VR. A first terminal of the capacitor C1 is electrically connected to the gate of the transistor Tr12.

In the memory cell AM[1], a second terminal of the transistor Tr11 is electrically connected to a wiring WD, and a gate of the transistor Tr11 is electrically connected to a wiring WL[1]. A second terminal of the transistor Tr12 is electrically connected to a wiring BL, and a second terminal of the capacitor C1 is electrically connected to a wiring CL[1]. In FIG. 23, in the memory cell AM[1], a connection portion of the first terminal of the transistor Tr11, the gate of the transistor Tr12, and the first terminal of the capacitor C1 is a node NM[1]. In addition, a current that flows from the wiring BL to the second terminal of the transistor Tr12 is $I_{AM[1]}$.

In the memory cell AM[2], a second terminal of the transistor Tr11 is electrically connected to the wiring WD, and a gate of the transistor Tr11 is electrically connected to a wiring WL[2]. A second terminal of the transistor Tr12 is electrically connected to the wiring BL, and a second terminal of the capacitor C1 is electrically connected to a wiring CL[2]. In FIG. 23, in the memory cell AM[2], a connection portion of the first terminal of the transistor Tr11, the gate of the transistor Tr12, and the first terminal of the capacitor C1 is a node NM[2]. In addition, a current that flows from the wiring BL to the second terminal of the transistor Tr12 is $I_{AM[2]}$.

In the memory cell AMref[1], a second terminal of the transistor Tr11 is electrically connected to a wiring WDref, and a gate of the transistor Tr11 is electrically connected to the wiring WL[1]. A second terminal of the transistor Tr12 is electrically connected to a wiring BLref, and a second terminal of the capacitor C1 is electrically connected to the wiring CL[1]. In FIG. 23, in the memory cell AMref[1], a connection portion of the first terminal of the transistor Tr11, the gate of the transistor Tr12, and the first terminal of the capacitor C1 is a node NMref[1]. In addition, a current that flows from the wiring BLref to the second terminal of the transistor Tr12 is $I_{AMref[1]}$.

In the memory cell AMref[2], a second terminal of the transistor Tr11 is electrically connected to the wiring WDref, and a gate of the transistor Tr11 is electrically connected to the wiring WL[2]. A second terminal of the transistor Tr12 is electrically connected to the wiring BLref, and a second terminal of the capacitor C1 is electrically connected to the wiring CL[2]. In FIG. 23, in the memory cell AMref[2], a connection portion of the first terminal of the transistor Tr11, the gate of the transistor Tr12, and the first terminal of the capacitor C1 is a node NMref[2]. In addition, a current that flows from the wiring BLref to the second terminal of the transistor Tr12 is $I_{AMref[2]}$.

The node NM[1], the node NM[2], the node NMref[1], and the node NMref[2] described above function as retention nodes of their respective memory cells.

The wiring VR is a wiring for supplying current between the first terminal and the second terminal of the transistor Tr12 in each of the memory cell AM[1], the memory cell AM[2], the memory cell AMref[1], and the memory cell AMref[2]. Thus, the wiring VR functions as a wiring for supplying a predetermined potential. In this embodiment, a potential to be supplied from the wiring VR can be a reference potential or a potential lower than the reference potential.

The current supply circuit CS is electrically connected to the wiring BL and the wiring BLref. The current supply circuit CS has a function of supplying current to the wiring BL and the wiring BLref. Note that the amounts of current supplied to the wiring BL and the wiring BLref may be different from each other. In this configuration example, a current that is supplied from the current supply circuit CS to the wiring BL is $I_C$, and a current that is supplied from the current supply circuit CS to the wiring BLref is $I_{Cref}$.

The current mirror circuit CM includes a wiring IL and a wiring ILref. The wiring IL is electrically connected to the wiring BL, and in FIG. 23, a connection portion of the wiring IL and the wiring BL is shown as a node NP. The wiring ILref is electrically connected to the wiring BLref, and in FIG. 23, a connection portion of the wiring ILref and the wiring BLref is shown as a node NPref. The current mirror circuit CM has a function of letting out current according to the potential of the node NPref from the node NPref of the wiring BLref to the wiring ILref, and letting out the same amount of current as the above current from the node NP of the wiring BL to the wiring IL. In FIG. 23, a current that is let out from the node NP to the wiring IL and a current that is let out from the node NPref to the wiring ILref are represented by $I_{CM}$. In addition, a current that flows from the current mirror circuit CM to the memory cell array CA in the wiring BL is represented by $I_B$, and a current that flows from the current mirror circuit CM to the memory cell array CA in the wiring BLref is represented by $I_{Bref}$.

The circuit WDD is electrically connected to the wiring WD and the wiring WDref. The circuit WDD has a function of transmitting data that is to be stored in each memory cell included in the memory cell array CA.

The circuit WLD is electrically connected to the wiring WL[1] and the wiring WL[2]. The circuit WLD has a function of selecting a memory cell to which data is written in data writing to the memory cell included in the memory cell array CA.

The circuit CLD is electrically connected to the wiring CL[1] and the wiring CL[2]. The circuit CLD has a function of applying a potential to the second terminal of the capacitor C1 of each memory cell included in the memory cell array CA.

The circuit OFST is electrically connected to the wiring BL and a wiring OL. The circuit OFST has a function of measuring the amount of current flowing from the wiring BL to the circuit OFST and/or the amount of change in current flowing from the wiring BL to the circuit OFST. In addition, the circuit OFST has a function of outputting the measurement result to the wiring OL. Note that the circuit OFST may have a configuration in which the measurement result is output as it is as current to the wiring OL or have a configuration in which the measurement result is converted into voltage and then output to the wiring OL. In FIG. 23, a current flowing from the wiring BL to the circuit OFST is represented $I_\alpha$.

Figure 24:
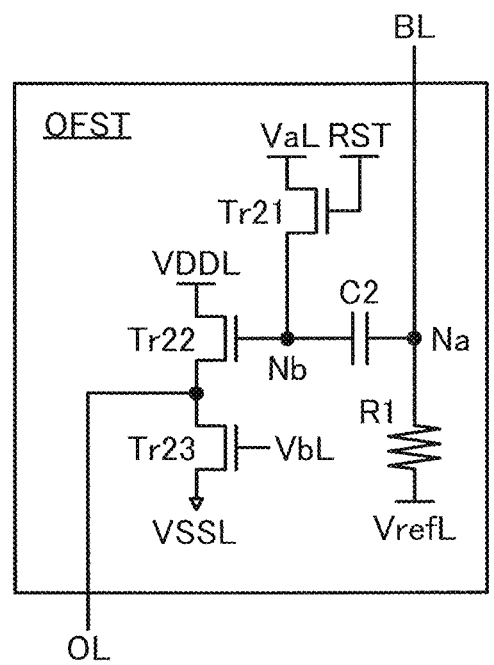
FIG. 24 A circuit diagram illustrating a configuration example of a circuit included in a product-sum operation circuit.

The circuit OFST can have a configuration in FIG. 24, for example. In FIG. 24, the circuit OFST includes a transistor Tr21, a transistor Tr22, a transistor Tr23, a capacitor C2, and a resistor R1.

A first terminal of the capacitor C2 is electrically connected to the wiring BL, and a first terminal of the resistor R1 is electrically connected to the wiring BL. A second terminal of the capacitor C2 is electrically connected to a first terminal of the transistor Tr21, and the first terminal of the transistor Tr21 is electrically connected to a gate of the transistor Tr22. A first terminal of the transistor Tr22 is electrically connected to a first terminal of the transistor Tr23, and the first terminal of the transistor Tr23 is electrically connected to the wiring OL. An electrical connection point of the first terminal of the capacitor C2 and the first terminal of the resistor R1 is a node Na, and an electrical connection point of the second terminal of the capacitor C2, the first terminal of the transistor Tr21, and the gate of the transistor Tr22 is a node Nb.

A second terminal of the resistor R1 is electrically connected to a wiring VrefL. A second terminal of the transistor Tr21 is electrically connected to a wiring VaL, and a gate of the transistor Tr21 is electrically connected to a wiring RST. A second terminal of the transistor Tr22 is electrically connected to a wiring VDDL. A second terminal of the transistor Tr23 is electrically connected to a wiring VSSL, and a gate of the transistor Tr23 is electrically connected to a wiring VbL.

The wiring VrefL is a wiring for supplying a potential Vref, the wiring VaL is a wiring for supplying a potential Va, and the wiring VbL is a wiring for supplying a potential Vb. The wiring VDDL is a wiring for supplying a potential VDD, and the wiring VSSL is a wiring for supplying a potential VSS. Particularly in this configuration example of the circuit OFST, the potential VDD is a high-level potential and the potential VSS is a low-level potential. The wiring RST is a wiring for supplying a potential for switching the conduction state and the non-conduction state of the transistor Tr21.

In the circuit OFST illustrated in FIG. 24, a source follower circuit is composed of the transistor Tr22, the transistor Tr23, the wiring VDDL, the wiring VSSL, and the wiring VbL.

In the circuit OFST illustrated in FIG. 24, owing to the resistor R1 and the wiring VrefL, a potential according to current flowing through the wiring BL and the resistance of the resistor R1 is supplied to the node Na.

An operation example of the circuit OFST illustrated in FIG. 24 is described. When first-time current (hereinafter referred to as first current) flows through the wiring BL, a potential according to the first current and the resistance of the resistor R1 is supplied to the node Na owing to the resistor R1 and the wiring VrefL. At this time, the transistor Tr21 is brought into a conduction state so that the potential Va is supplied to the node Nb. After that, the transistor Tr21 is brought into a non-conduction state.

Next, when second-time current (hereinafter referred to as second current) flows through the wiring BL, a potential according to the second current and the resistance of the resistor R1 is supplied to the node Na owing to the resistor R1 and the wiring VrefL as in the case where the first current flows. At this time, the node Nb is in a floating state; thus, a change in the potential of the node Na changes the potential of the node Nb because of capacitive coupling. When the change in the potential of the node Na is $\Delta V_{Na}$ and the capacitive coupling coefficient is 1, the potential of the node Nb is Va+$\Delta V_{Na}$. When the threshold voltage of the transistor Tr22 is $V_{th}$, a potential Va+$\Delta V_{Na}$-$V_{th}$ is output through the wiring OL. When the potential Va is the threshold voltage $V_{th}$ here, a potential $\Delta V_{Na}$ can be output through the wiring OL.

The potential $\Delta V_{Na}$ is determined by the amount of change from the first current to the second current, the resistor R1, and the potential Vref. The resistor R1 and the potential Vref can be regarded as known; therefore, the use of the circuit OFST illustrated in FIG. 24 allows the amount of change in current flowing through the wiring BL to be obtained from the potential $\Delta V_{Na}$.

The activation function circuit ACTV is electrically connected to the wiring OL and a wiring NIL. The result of the amount of change in current measured by the circuit OFST is input to the activation function circuit ACTV through the wiring OL. The activation function circuit ACTV is a circuit that performs arithmetic operation according to a function system defined in advance, on the result. As the function system, for example, a sigmoid function, a tanh function, a softmax function, a ReLU function, a threshold function, or the like can be used, and these functions are used as activation functions in a neural network. The activation function circuit ACTV can be the aforementioned activation function circuit FC.

Operation Example of Product-Sum Operation Circuit

Next, an operation example of the product-sum operation circuit MAC will be described.

Figure 25:
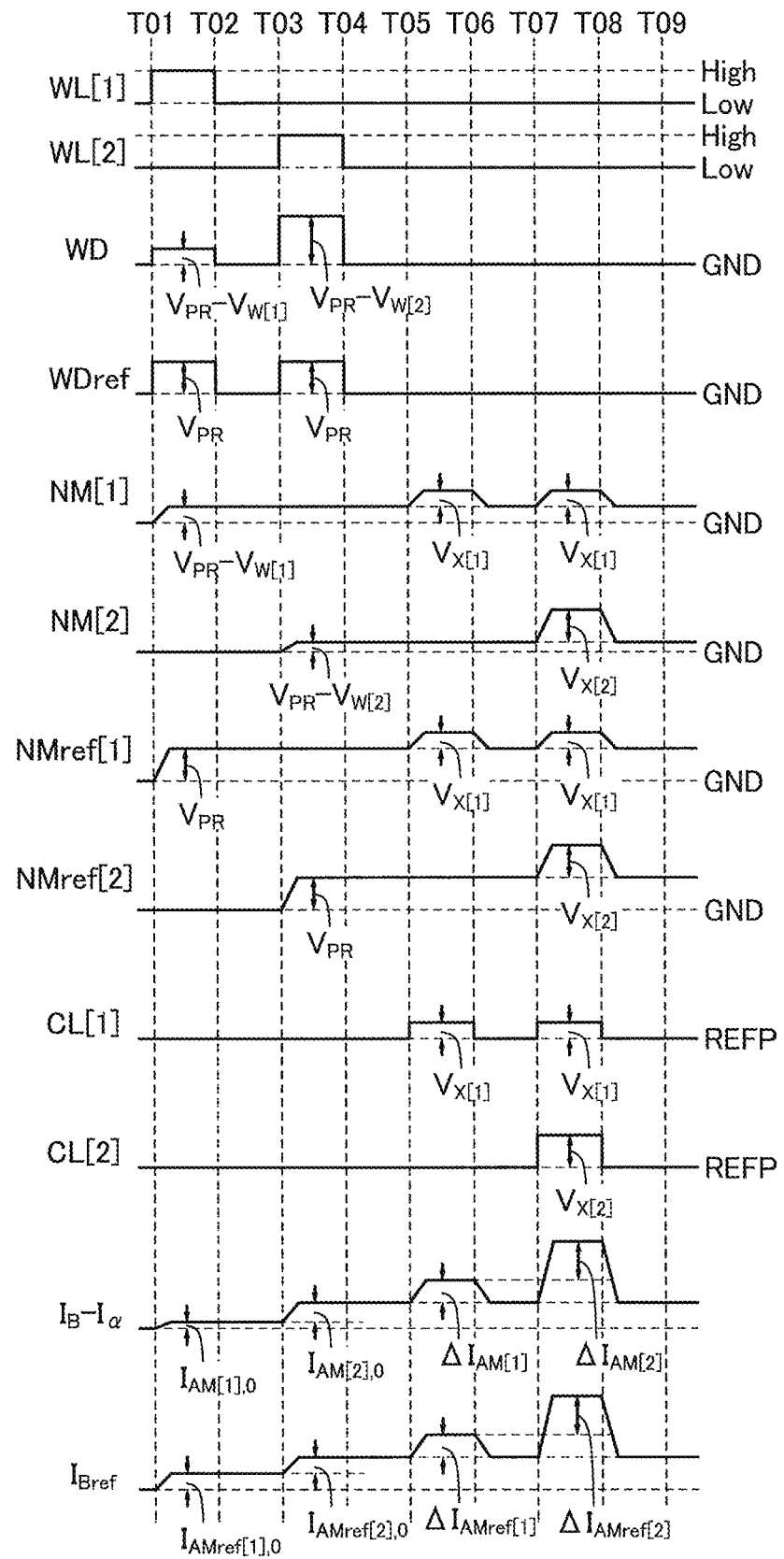
FIG. 25 A timing chart showing an operation example of a product-sum operation circuit.

FIG. 25 shows a timing chart of the operation example of the product-sum operation circuit MAC. The timing chart of FIG. 25 shows changes in the potentials of the wiring WL[1], the wiring WL[2], the wiring WD, the wiring WDref, the node NM[1], the node NM[2], the node NMref[1], the node NMref[2], the wiring CL[1], and the wiring CL[2] and changes in the amounts of current $I_B$-$I_\alpha$ and current $I_{Bref}$ from Time T01 to Time T09. In particular, the current $I_B$-$I_\alpha$ represents the total amount of current that flows from the wiring BL to the memory cell AM[1] and the memory cell AM[2] in the memory cell array CA.

<<From Time T01 to Time T02>>

During a period from Time T01 to Time T02, a high-level potential (denoted by High in FIG. 25) is applied to the wiring WL[1], and a low-level potential (denoted by Low in FIG. 25) is applied to the wiring WL[2]. Furthermore, a potential higher than a ground potential (denoted by GND in FIG. 25) by $V_{PR}$-$V_{W[1]}$ is applied to the wiring WD, and a potential higher than the ground potential by $V_{PR}$ is applied to the wiring WDref. Moreover, a reference potential (denoted by REFP in FIG. 25) is applied to each of the wiring CL[1] and the wiring CL[2].

The potential $V_{W[1]}$ is a potential corresponding to one piece of the first data. The potential $V_{PR}$ is a potential corresponding to the reference data.

At this time, the high-level potential is applied to each of the gates of the transistors Tr11 in the memory cell AM[1] and the memory cell AMref[1]; accordingly, the transistors Tr11 in the memory cell AM[1] and the memory cell AMref[1] are each brought into a conduction state. Thus, in the memory cell AM[1], the wiring WD and the node NM[1] are electrically connected to each other, and the potential of the node NM[1] becomes $V_{PR}$-$V_{W[1]}$. Similarly, in the memory cell AMref[1], the wiring WDref and the node NMref[1] are electrically connected to each other, and the potential of the node NMref[1] becomes $V_{PR}$.

Here, the current flowing from the second terminal to the first terminal of the transistor Tr12 in each of the memory cell AM[1] and the memory cell AMref[1] is considered. When the current flowing from the wiring BL to the first terminal of the transistor Tr12 in the memory cell AM[1] through its second terminal is $I_{AM[1],0}$, $I_{AM[1],0}$ can be expressed by the following formula.

[Formula 9]

$$I_{AM[1],0} = k(V_{PR}-V_{W[1]}-V_{th})^2 \quad (E1)$$

Note that k is a constant determined by the channel length, the channel width, the mobility, the capacitance of a gate insulating film, and the like of the transistor Tr12. Furthermore, $V_{th}$ is the threshold voltage of the transistor Tr12.

When current flowing from the wiring BLref to the first terminal of the transistor Tr12 in the memory cell AMref[1] through its second terminal is $I_{AMref[1],0}$, $I_{AMref[1],0}$ can be expressed similarly by the following formula.

[Formula 10]

$$I_{AMref[1],0} = k(V_{PR}-V_{th})^2 \quad (E2)$$

Note that since the low-level potential is applied to each of the gates of the transistors Tr11 in the memory cell AM[2] and the memory cell AMref[2], the transistors Tr11 in the memory cell AM[2] and the memory cell AMref[2] are each brought into a non-conduction state. Thus, the potentials are not written to the node NM[2] and the node NMref[2].

<<From Time T02 to Time T03>>

During a period from Time T02 to Time T03, the low-level potential is applied to the wiring WL[1]. At this time, the low-level potential is applied to each of the gates of the transistors Tr11 in the memory cell AM[1] and the memory cell AMref[1]; accordingly, the transistors Tr11 in the memory cell AM[1] and the memory cell AMref[1] are each brought into a non-conduction state.

In addition, the low-level potential remains applied to the wiring WL[2] from before Time T02. Thus, the transistors Tr11 in the memory cell AM[2] and the memory cell AMref[2] each remain in a non-conduction state since before Time T02.

Since the transistors Tr11 in the memory cell AM[1], the memory cell AM[2], the memory cell AMref[1], and the memory cell AMref[2] are each in a non-conduction state as described above, the potentials of the node NM[1], the node NM[2], the node NMref[1], and the node NMref[2] are each retained during the period from Time T02 to Time T03.

In particular, when an OS transistor is applied to each of the transistors Tr11 in the memory cell AM[1], the memory cell AM[2], the memory cell AMref[1], and the memory cell AMref[2] as mentioned in the description of the circuit configuration of the product-sum operation circuit MAC, leakage current flowing between the first terminal and the second terminal of the transistor Tr11 can be made low, which makes it possible to retain the potential of each of the node NM[1], the node NM[2], the node NMref[1], and the node NMref[2] for a long time.

During the period from Time T02 to Time T03, the ground potential is applied to the wiring WD and the wiring WDref. Since the transistors Tr11 in the memory cell AM[1], the memory cell AM[2], the memory cell AMref[1], and the memory cell AMref[2] are each in a non-conduction state, the potentials retained at the node NM[1], the node NM[2], the node NMref[1], and the node NMref[2] are not rewritten by application of potentials from the wiring WD and the wiring WDref.

<<From Time T03 to Time T04>>

During a period from Time T03 to Time T04, the low-level potential is applied to the wiring WL[1], and the high-level potential is applied to the wiring WL[2]. Furthermore, a potential higher than the ground potential by $V_{PR}-V_{w[2]}$ is applied to the wiring WD, and a potential higher than the ground potential by $V_{PR}$ is applied to the wiring WDref. Moreover, the reference potential is continuously applied to each of the wiring CL[1] and the wiring CL[2] since before Time T02.

Note that the potential $V_{w[2]}$ is a potential corresponding to one piece of the first data.

At this time, the high-level potential is applied to each of the gates of the transistors Tr11 in the memory cell AM[2] and the memory cell AMref[2]; accordingly, the transistors Tr11 in the memory cell AM[2] and the memory cell AMref[2] are each brought into a conduction state. Thus, in the memory cell AM[2], the wiring WD and the node NM[2] are electrically connected to each other, and the potential of the node NM[2] becomes $V_{PR}-V_{W[2]}$. Similarly, in the memory cell AMref[2], the wiring WDref and the node NMref[2] are electrically connected to each other, and the potential of the node NMref[2] becomes $V_{PR}$.

Here, the current flowing from the second terminal to the first terminal of the transistor Tr12 in each of the memory cell AM[2] and the memory cell AMref[2] is considered. When the current flowing from the wiring BL to the first terminal of the transistor Tr12 in the memory cell AM[2] through its second terminal is $I_{AM[2],0}$, $I_{AM[2],0}$ can be expressed by the following formula.

[Formula 11]

$$I_{AM[2],0}=k(V_{PR}-V_{W[2]}-V_{th})^2 \quad (E3)$$

When current flowing from the wiring BLref to the first terminal of the transistor Tr12 in the memory cell AMref[2] through its second terminal is $I_{AMref[2],0}$, $I_{AMref[2],0}$ can be expressed similarly by the following formula.

[Formula 12]

$$I_{AMref[2],0}=k(V_{PR}-V_{th})^2 \quad (E4)$$

<<From Time T04 to Time T05>>

Here, currents that flow in the wiring BL and the wiring BLref during a period from Time T04 to Time T05 are described.

Current from the current supply circuit CS is supplied to the wiring BLref In addition, current is let out by the current mirror circuit CM, the memory cell AMref[1], and the memory cell AMref[2] to the wiring BLref. When the current supplied from the current supply circuit CS is $I_{Cref}$ and the current let out by the current mirror circuit CM is $I_{CM,0}$ in the wiring BLref, the following formula is satisfied according to Kirchhoff's law.

[Formula 13]

$$I_{Cref}-I_{CM,0}=I_{AMref[1],0}+I_{AMref[2],0} \quad (E5)$$

Current from the current supply circuit CS is supplied to the wiring BL. In addition, current is let out by the current mirror circuit CM, the memory cell AM[1], and the memory cell AM[2] to the wiring BL. Moreover, current flows from the wiring BL to the circuit OFST. When the current supplied from the current supply circuit CS is $I_C$ and the current that flows from the wiring BL to the circuit OFST is $I_{\alpha,0}$ in the wiring BL, the following formula is satisfied according to Kirchhoff's law.

[Formula 14]

$$I_C-I_{CM,0}=I_{AM[1],0}+I_{AM[2],0}+I_{\alpha,0} \quad (E6)$$

<<From Time T05 to Time T06>>

During a period from Time T05 to Time T06, a potential higher than the reference potential by $V_{X[1]}$ is applied to the wiring CL[1]. At this time, the potential $V_{X[1]}$ is applied to the second terminal of the capacitor C1 in each of the memory cell AM[1] and the memory cell AMref[1], so that the potentials of the gates of the transistors Tr12 increase.

The potential $V_{X[1]}$ is a potential corresponding to one piece of the second data.

Note that an increase in the potential of the gate of the transistor Tr12 corresponds to a potential obtained by multiplying a change in the potential of the wiring CL[1] by a capacitive coupling coefficient determined by the memory cell configuration. The capacitive coupling coefficient is calculated using the capacitance of the capacitor C1, the gate capacitance of the transistor Tr12, the parasitic capacitance, and the like. In this operation example, to avoid complexity of description, description is made on the assumption that an increase in the potential of the wiring CL[1] is equal to the increase in the potential of the gate of the transistor Tr12. This corresponds to the case where the capacitive coupling coefficient in each of the memory cell AM[1] and the memory cell AMref[1] is set to 1.

Since the capacitive coupling coefficient is set to 1, when the potential $V_{X[1]}$ is applied to the second terminal of the capacitor C1 in each of the memory cell AM[1] and the memory cell AMref[1], the potentials of the node NM[1] and the node NMref[1] each increase by $V_{X[1]}$.

Here, the current flowing from the second terminal to the first terminal of the transistor Tr12 in each of the memory cell AM[1] and the memory cell AMref[1] is considered. When the current flowing from the wiring BL to the first terminal of the transistor Tr12 in the memory cell AM[1] through its second terminal is $I_{AM[1],1}$, $I_{AM[1],1}$ can be expressed by the following formula.

[Formula 15]

$$I_{AM[1],1}=k(V_{PR}-V_{W[1]}+V_{X[1]}-V_{th})^2 \quad (E7)$$

In other words, by application of the potential $V_{X[1]}$ to the wiring CL[1], the current flowing from the wiring BL to the first terminal of the transistor Tr12 in the memory cell AM[1] through its second terminal increases by $I_{AM[1],1}-I_{AM[1],0}$ (denoted by $\Delta I_{AM[1]}$ in FIG. 25).

Similarly, when current flowing from the wiring BLref to the first terminal of the transistor Tr12 in the memory cell AMref[1] through its second terminal is $I_{AMref[1],1}$, $I_{AMref[1],1}$ can be expressed by the following formula.

[Formula 16]

$$I_{AM[1],1}=k(V_{PR}+V_{X[1]}-V_{th})^2 \quad (E8)$$

In other words, by application of the potential $V_{x[1]}$ to the wiring CL[1], the current flowing from the wiring BLref to the first terminal of the transistor Tr12 in the memory cell AMref[1] through its second terminal increases by $I_{AMref[1],1} - I_{AMref[1],0}$ (denoted by $\Delta I_{AMref[1]}$ in FIG. 25).

Here, currents that flow in the wiring BL and the wiring BLref are described.

As in the period from Time T04 to Time T05, the current $I_{Cref}$ from the current supply circuit CS is supplied to the wiring BLref. At the same time, current is let out by the current mirror circuit CM, the memory cell AMref[1], and the memory cell AMref[2] to the wiring BLref. When the current let out by the current mirror circuit CM is $I_{CM,1}$ in the wiring BLref, the following formula is satisfied according to Kirchhoff's law.

[Formula 17]

$$I_{Cref} - I_{CM,1} = I_{AMref[1],1} + I_{AMref[2],0} \quad \text{(E9)}$$

As in the period from Time T04 to Time T05, the current $I_C$ from the current supply circuit CS is supplied to the wiring BL. At the same time, current is let out by the current mirror circuit CM, the memory cell AM[1], and the memory cell AM[2] to the wiring BL. Moreover, current flows from the wiring BL to the circuit OFST. When the current that flows from the wiring BL to the circuit OFST is $I_{\alpha,0}$ in the wiring BL, the following formula is satisfied according to Kirchhoff's law.

[Formula 18]

$$I_C - I_{CM,1} = I_{AM[1],1} + I_{AM[2],0} + I_{\alpha,1} \quad \text{(E10)}$$

Note that $\Delta I_\alpha$ represents the difference between the current $I_{\alpha,0}$ flowing from the wiring BL to the wiring OFST during the period from Time T04 to Time T05 and the current $I_{\alpha,1}$ flowing from the wiring BL to the wiring OFST during the period from Time T05 to Time T06. Hereinafter, $\Delta I_\alpha$ is referred to as a difference current in the product-sum operation circuit MAC. The difference current $\Delta I_\alpha$ can be expressed by the following formula, using Formula (E1) to Formula (E10).

[Formula 19]

$$\Delta I_\alpha = I_{\alpha,0} - I_{\alpha,1} = 2k V_{W[1]} V_{X[1]} \quad \text{(E11)}$$

<<From Time T06 to Time T07>>

During a period from Time T06 to Time T07, the ground potential is applied to the wiring CL[1]. At this time, the ground potential is applied to the second terminal of the capacitor C1 in each of the memory cell AM[1] and the memory cell AMref[1]; thus, the potentials of the node NM[1] and the node NMref[1] return to the potentials during the period from Time T04 to Time T05.

<<From Time T07 to Time T08>>

During a period from Time T07 to Time T08, a potential higher than the reference potential by $V_{X[1]}$ is applied to the wiring CL[1], and a potential higher than the reference potential by $V_{X[2]}$ is applied to the wiring CL[2]. At this time, the potential $V_{X[1]}$ is applied to the second terminal of the capacitor C1 in each of the memory cell AM[1] and the memory cell AMref[1], and the potential $V_{X[2]}$ is applied to the second terminal of the capacitor C1 in each of the memory cell AM[2] and the memory cell AMref[2]. Consequently, the potential of the gate of the transistor Tr12 in each of the memory cell AM[1], the memory cell AM[2], the memory cell AMref[1], and the memory cell AMref[2] increases.

For the potential change at the node in each of the memory cell AM[1] and the memory cell AMref[1], refer to the operation during the period from Time T05 to Time T06. Similarly, the memory cell AM[2] and the memory cell AMref[2] are described on the assumption that the capacitive coupling coefficient of each memory cell is 1.

Since the capacitive coupling coefficient is set to 1, when the potential $V_{X[2]}$ is applied to the second terminal of the capacitor C1 in each of the memory cell AM[2] and the memory cell AMref[2], the potentials of the node NM[2] and the node NMref[2] each increase by $V_{X[2]}$.

Here, the current flowing from the second terminal to the first terminal of the transistor Tr12 in each of the memory cell AM[2] and the memory cell AMref[2] is considered. When the current flowing from the wiring BL to the first terminal of the transistor Tr12 in the memory cell AM[1] through its second terminal is $I_{AM[2],1}$, $I_{AM[2],1}$ can be expressed by the following formula.

[Formula 20]

$$I_{AM[2],1} = k(V_{PR} - V_{W[2]} + V_{X[2]} - V_{th})^2 \quad \text{(E12)}$$

In other words, by application of the potential $V_{X[2]}$ to the wiring CL[2], the current flowing from the wiring BL to the first terminal of the transistor Tr12 in the memory cell AM[2] through its second terminal increases by $I_{AM[2]1,1} - I_{AM[2],0}$ (denoted by $\Delta I_{AM[2]}$ in FIG. 25).

Similarly, when current flowing from the wiring BLref to the first terminal of the transistor Tr12 in the memory cell AMref[2] through its second terminal is $I_{AMref[2],1}$, $I_{AMref[2],1}$ can be expressed by the following formula.

[Formula 21]

$$I_{AMref[2],1} = k(V_{PR} + V_{X[2]} - V_{th})^2 \quad \text{(E13)}$$

In other words, by application of the potential $V_{X[2]}$ to the wiring CL[2], the current flowing from the wiring BLref to the first terminal of the transistor Tr12 in the memory cell AMref[2] through its second terminal increases by $I_{AMref[2],1} - I_{AMref[2],0}$ (denoted by $\Delta I_{AMref[2]}$ in FIG. 25).

Here, currents that flow in the wiring BL and the wiring BLref are described.

As in the period from Time T04 to Time T05, the current $I_{Cref}$ from the current supply circuit CS is supplied to the wiring BLref. At the same time, current is let out by the current mirror circuit CM, the memory cell AMref[1], and the memory cell AMref[2] to the wiring BLref. When the current let out by the current mirror circuit CM is $I_{CM,2}$ in the wiring BLref, the following formula is satisfied according to Kirchhoff's law.

[Formula 22]

$$I_{Cref} - I_{CM,2} = I_{AMref[1],1} + I_{AMref[2],1} \quad \text{(E14)}$$

As in the period from Time T04 to Time T05, the current $I_C$ from the current supply circuit CS is supplied to the wiring BL. At the same time, current is let out by the current mirror circuit CM, the memory cell AM[1], and the memory cell AM[2] to the wiring BL. Moreover, current flows from the wiring BL to the circuit OFST. When the current that flows from the wiring BL to the circuit OFST is $I_{\alpha,3}$ in the wiring BL, the following formula is satisfied according to Kirchhoff's law.

[Formula 23]

$$I_C - I_{CM,2} = I_{AM[1],1} + I_{AM[2],1} I_{\alpha,3} \quad \text{(E15)}$$

The difference current $\Delta I_\alpha$, the difference between the current $I_{\alpha,0}$ flowing from the wiring BL to the wiring OFST during the period from Time T04 to Time T05 and the current $I_{\alpha,3}$ flowing from the wiring BL to the wiring OFST during the period from Time T07 to Time T08, can be expressed by the following formula, using Formula (E1) to Formula (E8) and Formula (E12) to Formula (E15).

[Formula 24]

$$\Delta I_\alpha = I_{\alpha,0} - I_{\alpha,3} = 2k(V_{W[1]}V_{X[1]} + V_{W[2]}V_{X[2]}) \quad (E16)$$

As shown by Formula (E16), the difference current $\Delta I_\alpha$ input to the circuit OFST has a value corresponding to the sum of products of the potential $V_W$, which is a plurality of pieces of the first data, and the potential $V_X$, which is a plurality of pieces of the second data. In other words, when the difference current $\Delta I_\alpha$ is measured by the circuit OFST, the value of the sum of products of the first data and the second data can be obtained.

<<From Time T08 to Time T09>>

During a period from Time T08 to Time T09, the reference potential is applied to the wiring CL[1] and the wiring CL[2]. At this time, the reference potential is applied to the second terminal of the capacitor C1 in each of the memory cell AM[1], the memory cell AM[2], the memory cell AMref[1], and the memory cell AMref[2]; thus, the potentials of the node NM[1], the node NM[2], the node NMref[1], and the node NMref[2] return to the potentials during the period from Time T06 to Time T07.

Although $V_{X[1]}$ was applied to the wiring CL[1] during the period from Time T05 to Time T06 and $V_{X[1]}$ and $V_{X[2]}$ were applied to the wiring CL[1] and the wiring CL[2], respectively, during the period from Time T07 to Time T08, potentials that are applied to the wiring CL[1] and the wiring CL[2] may be lower than the reference potential REFP. In the case where a potential lower than the reference potential REFP is applied to the wiring CL[1] and/or the wiring CL[2], the potential of a retention node of a memory cell connected to the wiring CL[1] and/or the wiring CL[2] can be decreased by capacitive coupling. Thus, multiplication of the first data and one piece of the second data, which is a negative value, can be performed in the product-sum operation. For example, in the case where $-V_{X[2]}$, instead of $V_{X[2]}$, is applied to the wiring CL[2] during the period from Time T07 to Time T08, the difference current $\Delta I_\alpha$ can be expressed by the following formula.

[Formula 25]

$$\Delta I_\alpha = I_{\alpha,0} - I_{\alpha,3} = 2k(V_{W[1]}V_{X[1]} - V_{W[2]}V_{X[2]}) \quad (E17)$$

Although the memory cell array CA including memory cells arranged in a matrix of two rows and two columns is used in this operation example, product-sum operation can be similarly performed in a memory cell array of one row and two or more columns and a memory cell array of three or more rows and three or more columns. In a product-sum operation circuit of such a case, memory cells in one of the plurality of columns are used for retaining reference data (potential $V_{PR}$), whereby product-sum operations, the number of which corresponds to the number of the rest of the columns among the plurality of columns, can be executed concurrently. That is, when the number of columns in a memory cell array is increased, a semiconductor device that achieve high-speed product-sum operation can be provided. Furthermore, increasing the number of rows allows an increase in the number of terms to be added to each other in the product-sum operation. The difference current $\Delta I_\alpha$ when the number of rows is increased can be expressed by the following formula.

[Formula 26]

$$\Delta I_\alpha = 2k \sum_i V_{W[i]} V_{X[i]} \quad (E18)$$

In the case where the product-sum operation circuit described in this embodiment is used as the above-described hidden layer, the weight coefficient $w_{s[k]s[k-1]}^{(k)}$ is stored as the first data in each of the memory cells AM in the same column and the output signal $z_{s[k-1]}^{(k-1)}$ from the s[k–1]-th neuron in the (k–1)-th layer is used as a potential (the second data) applied from the wiring CL in each row, so that the sum of products of the first data and the second data can be obtained from the difference current $\Delta I_\alpha$. In addition, the value of the activation function can be obtained using the value of the sum of products, so that the value of the activation function can be, as a signal, the output signal $z_{s[k]}^{(k)}$ of the s[k]-th neuron in the k-th layer.

In the case where the product-sum operation circuit described in this embodiment is used as the above-described output layer, the weight coefficient $w_{s[L]s[L-1]}^{(L)}$ is stored as the first data in each of the memory cells AM in the same column and the output signal $z_{s[L-1]}^{(L-1)}$ from the s[L–1]-th neuron in the (L–1)-th layer is used as a potential (the second data) applied from the wiring CL in each row, so that the sum of products of the first data and the second data can be obtained from the difference current $\Delta I_\alpha$. In addition, the value of the activation function can be obtained using the value of the sum of products, so that the value of the activation function can be, as a signal, the output signal $z_{s[L]}^{(L)}$ of the s[L]-th neuron in the L-th layer.

Note that the input layer described in this embodiment may function as a buffer circuit that outputs an input signal to the second layer.

By the way, in the product-sum operation circuit described in this embodiment, the number of the rows of the memory cells AM corresponds to the number of neurons in the previous layer. In other words, the number of the rows of the memory cells AM corresponds to the number of output signals of the neurons in the previous layer that are input to one neuron in the next layer. The number of the columns of the memory cells AM corresponds to the number of neurons in the next layer. In other words, the number of the columns of the memory cells AM corresponds to the number of output signals that are output from the neurons in the next layer. That is to say, the number of the rows and the number of the columns of the memory cell array of the product-sum operation circuit are determined depending on the number of neurons in each of the previous layer and the next layer; thus, a neural network is designed by determining the number of the rows and the number of the columns of the memory cell array depending on the desired configuration.

The case of combining the product-sum operation circuit MAC described in this embodiment and the circuit 22a described in Embodiment 2 is described here. In the case where the memory cell array included in the encoder AIE described in Embodiment 2 is the memory cell array CA described in this embodiment, the number of the rows of the memory cell array CA is ts. Accordingly, the memory cell array CA includes the wiring CL[1] to the wiring CL[ts]. In addition, when a configuration is employed in which the wiring RW[1] to the wiring RW[ts] are electrically connected to the wiring CL[1] to the wiring CL[ts], respectively, signals output from the output terminal PT[1] to the output terminal PT[ts] included in the circuit 22a can be input to the wiring CL[1] to the wiring CL[ts] of the memory cell array CA, respectively.

The filter values of the weight filter described in Embodiment 2 are stored in memory cells in one column of the memory cell array CA. For example, the filter value $f_a[1, 1]$ to the filter value $f_a[t, s]$ of the filter $fil_a$ described in Embodiment 2 are stored in memory cells in one column of the memory cell array CA with ts rows. In the case of a plurality of filters, the number of the columns of the memory cell array CA is determined depending on the number of filters. In the case of using the filter $fil_a$, the filter $fil_b$, and the filter $fil_c$ described in Embodiment 2, for example, the filter $fil_a$ is stored in the memory cell AM in the first column of the memory cell array CA, the filter $fil_b$ is stored in the memory cell AM in the second column of the memory cell array CA, the filter $fil_c$ is stored in the memory cell AM in the third column of the memory cell array CA, and the reference data $V_{PR}$ is stored in the memory cell AMref in the fourth column of the memory cell array CA. In other words, this case employs a configuration in which the memory cell array CA has four columns at the minimum. When a plurality of filters are each stored in one column of the memory cell array as described above, the product-sum operations for the filters can be performed in parallel by simply outputting image data in the pixel region P from the circuit 22a once. Thus, a plurality of convolution processings can be performed at the same time.

Note that this embodiment can be combined with the other embodiment described in this specification as appropriate.

Embodiment 4

In this embodiment, embodiments of the semiconductor device described in the above embodiment are described with reference to FIG. 26 and FIG. 27. Note that a semiconductor device 100 described in this specification can mean the imaging device 20, the peripheral circuit 30, or the display device 50 described in the above embodiment, for example. Alternatively, the semiconductor device 100 can mean the imaging portion 21, the circuit 22a, the encoder AIE, or the control portion 24 included in the imaging device 20, or the GPU 31, the memory portion 33, or the memory portion 34 included in the peripheral circuit 30, for example.

<Cross-Sectional Structure of Semiconductor Device 100>

Figure 26:
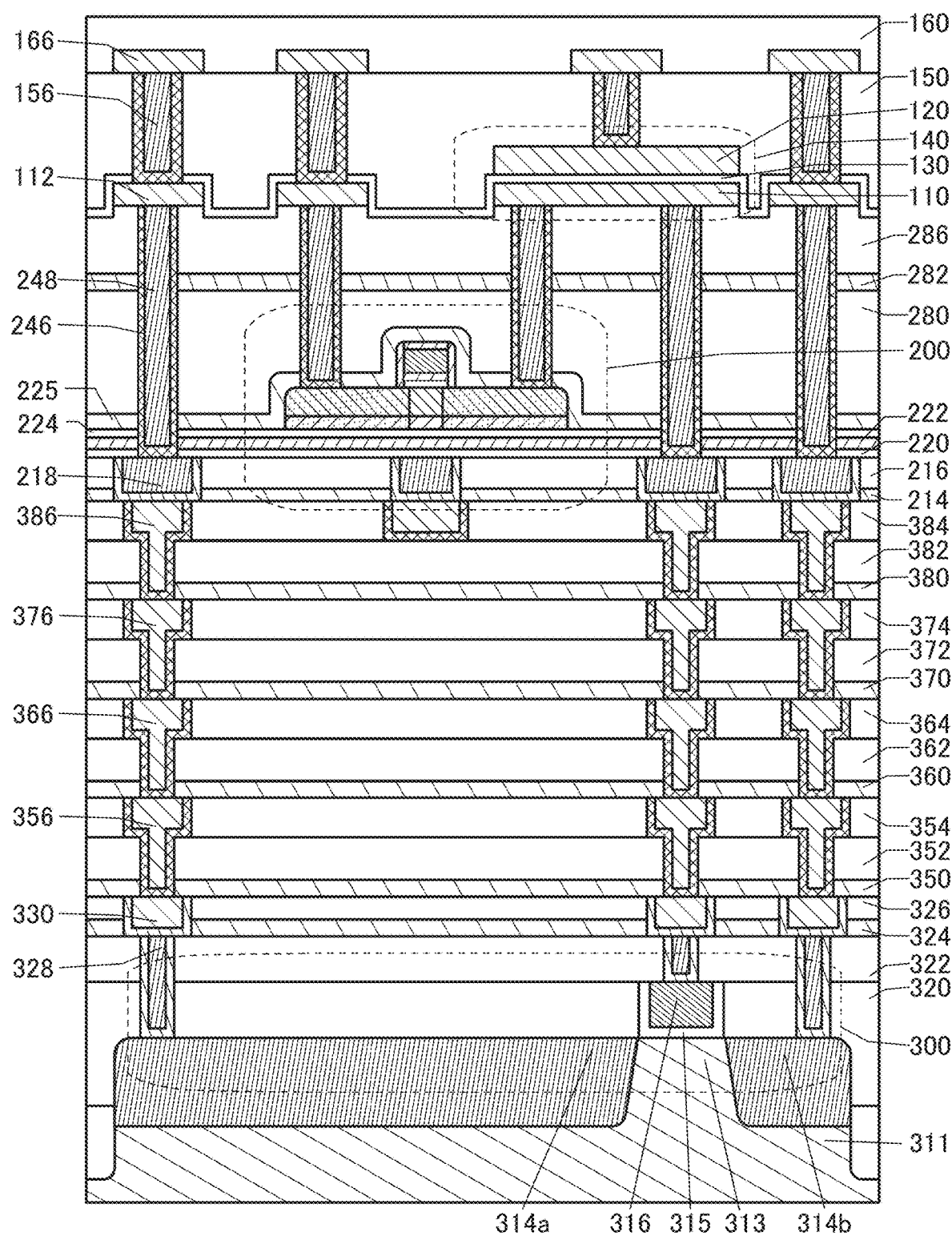
FIG. 26 A cross-sectional view illustrating a structure example of a semiconductor device.

FIG. 26 is a schematic cross-sectional view illustrating an example of the semiconductor device 100. The semiconductor device 100 includes a transistor 300, a transistor 200, and a capacitor 140. The transistor 200 is provided above the transistor 300, and the capacitor 140 is provided above the transistor 300 and the transistor 200.

The transistor 200 is an OS transistor including an oxide semiconductor in a channel formation region. Since OS transistors can be formed with high yield even when miniaturized, the transistor 200 can be miniaturized. The use of such a transistor in a semiconductor device allows miniaturization and/or high integration of the semiconductor device. Since the off-state current of the OS transistor is low, a semiconductor device using the OS transistor can retain stored data for a long time. In other words, since refresh operation is not required or frequency of refresh operation is extremely low, the power consumption of the semiconductor device can be sufficiently reduced.

The transistor 300 is provided on a substrate 311 and includes a conductor 316, an insulator 315, a semiconductor region 313 that is part of the substrate 311, a low-resistance region 314a functioning as one of a source region and a drain region, and a low-resistance region 314b functioning as the other of the source region and the drain region.

The transistor 300 is of either a p-channel type or an n-channel type.

A region of the semiconductor region 313 where a channel is formed, a region in the vicinity thereof, the low-resistance region 314a, the low-resistance region 314b, and the like preferably contain a semiconductor such as a silicon-based semiconductor, further preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is adjusted by applying stress to the crystal lattice and thereby changing the lattice spacing is used.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

For the conductor 316 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that since the material of the conductor 316 determines the work function, the threshold voltage can be adjusted by changing the material of the conductor. Specifically, it is preferable to use a material such as titanium nitride or tantalum nitride for the conductor 316. Furthermore, in order to ensure both conductivity and embeddability, it is preferable to use a stacked layer of metal materials such as tungsten and aluminum for the conductor 316, and it is particularly preferable to use tungsten in terms of heat resistance.

In the transistor 300 illustrated in FIG. 26, the semiconductor region 313 (part of the substrate 311) where the channel is formed has a protruding shape. Furthermore, the conductor 316 is provided to cover the top surface and side surfaces of the semiconductor region 313 with the insulator 315 therebetween. Note that a material for adjusting the work function may be used for the conductor 316. Such a transistor 300 is also referred to as a FIN transistor because the protruding portion of the semiconductor substrate is utilized. Note that an insulator functioning as a mask for forming the protruding portion may be provided in contact with the top surface of the protruding portion. Although the case where the protruding portion is formed by processing part of the semiconductor substrate is described here, a semiconductor film having a protruding shape may be formed by processing an SOI substrate.

Note that the transistor 300 illustrated in FIG. 26 is only an example and the structure is not limited thereto; an appropriate transistor can be used in accordance with a circuit configuration or a driving method.

An insulator 320, an insulator 322, an insulator 324, and an insulator 326 are provided to be stacked in this order to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that contains more oxygen than nitrogen in its composition, and silicon nitride oxide refers to a material that contains more nitrogen than oxygen in its composition. Furthermore, in this specification, aluminum oxynitride refers to a material that contains more oxygen than nitrogen in its composition, and aluminum nitride oxide refers to a material that contains more nitrogen than oxygen in its composition.

The insulator 322 may have a function of a planarization film for planarizing a level difference caused by the transistor 300 or the like provided below the insulator 322. For example, the top surface of the insulator 322 may be planarized by planarization treatment using a chemical mechanical polishing (CMP) method or the like to improve planarity.

As the insulator 324, it is preferable to use a film having a barrier property that prevents diffusion of hydrogen and impurities from the substrate 311, the transistor 300, or the like into a region where the transistor 200 is provided.

As an example of the film having a barrier property against hydrogen, silicon nitride deposited by a CVD method, for example, can be used. Here, the diffusion of hydrogen into a semiconductor element including an oxide semiconductor, such as the transistor 200, degrades the characteristics of the semiconductor element in some cases. Therefore, a film that inhibits diffusion of hydrogen is preferably used between the transistor 200 and the transistor 300. Specifically, the film that inhibits diffusion of hydrogen is a film from which a small amount of hydrogen is released.

The amount of released hydrogen can be analyzed by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$ in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. For example, the dielectric constant of the insulator 326 is preferably 0.7 times or less, further preferably 0.6 times or less the dielectric constant of the insulator 324. When a material with a low permittivity is used for an interlayer film, the parasitic capacitance between wirings can be reduced.

Moreover, a conductor 328, a conductor 330, and the like are embedded in the insulator 320, the insulator 322, the insulator 324, and the insulator 326. Note that the conductor 328 and the conductor 330 have functions of plugs or wirings. In addition, a plurality of structures of conductors having functions of plugs or wirings are collectively denoted by the same reference numeral in some cases. Furthermore, in this specification and the like, a wiring and a plug electrically connected to the wiring may be a single component. That is, there are cases where part of a conductor functions as a wiring and part of a conductor functions as a plug.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is particularly preferable to use tungsten. Alternatively, it is preferable to form the plugs and wirings with a low-resistance conductive material such as aluminum or copper. The use of a low-resistance conductive material can reduce wiring resistance.

A wiring layer may be provided over the insulator 326 and the conductor 330. For example, in FIG. 26, an insulator 350, an insulator 352, an insulator 354, an insulator 360, an insulator 362, an insulator 364, an insulator 370, an insulator 372, an insulator 374, an insulator 380, an insulator 382, and an insulator 384 are stacked sequentially. A conductor 356, a conductor 366, a conductor 376, and a conductor 386 are formed in these insulators. These conductors have functions of plugs or wirings. Note that these conductors can be formed using a material similar to those for the conductor 328 and the conductor 330.

Note that as with the insulator 324, an insulator having a barrier property against hydrogen is preferably used as the insulator 350, the insulator 360, the insulator 370, and the insulator 380. Furthermore, the conductor 356, the conductor 366, the conductor 376, and the conductor 386 preferably include a conductor having a barrier property against hydrogen. When focusing on the insulator 350 and the conductor 356, for example, formation of the conductor 356 in an opening portion of the insulator 350 can inhibit the diffusion of hydrogen from the transistor 300 to the transistor 200. The same can be applied to the other insulators and conductors.

Note that as the conductor having a barrier property against hydrogen, tantalum nitride or the like is preferably used, for example. In addition, by stacking tantalum nitride and tungsten, which has high conductivity, the diffusion of hydrogen from the transistor 300 can be inhibited while the conductivity as a wiring is kept.

An insulator 214 and an insulator 216 are stacked over the insulator 384. A substance having a barrier property against oxygen and hydrogen is preferably used for either of the insulator 214 and the insulator 216.

As the insulator 214, for example, it is preferable to use a film having a barrier property that inhibits diffusion of hydrogen and impurities from the substrate 311 or a region where the transistor 300 is provided into the region where the transistor 200 is provided. Therefore, a material similar to that for the insulator 324 can be used.

As an example of the film having a barrier property against hydrogen, silicon nitride deposited by a CVD method can be used. Here, the diffusion of hydrogen into a semiconductor element including an oxide semiconductor, such as the transistor 200, degrades the characteristics of the semiconductor element in some cases. Therefore, a film that inhibits diffusion of hydrogen is preferably used between the transistor 200 and the transistor 300. Specifically, the film that inhibits diffusion of hydrogen is a film from which a small amount of hydrogen is released.

For the insulator 214 serving as the film having a barrier property against hydrogen, for example, a metal oxide such as aluminum oxide, hafnium oxide, or tantalum oxide is preferably used.

In particular, aluminum oxide has an excellent blocking effect that inhibits the passage of both oxygen and impurities such as hydrogen and moisture which are factors of a change in electrical characteristics of the transistor. Accordingly, aluminum oxide can prevent entry of impurities such as hydrogen and moisture into the transistor 200 in a manufacturing process and after manufacturing of the transistor. In addition, release of oxygen from the oxide included in the transistor 200 can be inhibited. Therefore, aluminum oxide is suitably used for a protective film for the transistor 200.

For example, for the insulator 216, a material similar to that for the insulator 320 can be used. When a material with a relatively low permittivity is used for an interlayer film, the parasitic capacitance between wirings can be reduced. For example, a silicon oxide film, a silicon oxynitride film, or the like can be used as the insulator 216.

Moreover, a conductor 218, a conductor included in the transistor 200 (e.g., an electrode functioning as a back gate), and the like are embedded in the insulator 214 and the insulator 216. The conductor 218 can be provided using a material similar to those for the conductor 328 and the conductor 330.

The conductor 218 is preferably a conductor having a barrier property against oxygen, hydrogen, and water. Such a structure enables the transistor 300 and the transistor 200 to be separated by a layer having a barrier property against oxygen, hydrogen, and water; thus, the diffusion of hydrogen from the transistor 300 into the transistor 200 can be inhibited.

The transistor 200 is provided above the insulator 216. Note that an OS transistor is used as the transistor 200. The details of the transistor 200 will be described in aftermentioned Embodiment 5.

An insulator 280 is provided above the transistor 200. In the insulator 280, an excess-oxygen region is preferably formed. In particular, in the case of using an oxide semiconductor in the channel formation region of the transistor 200, providing an insulator including an excess-oxygen region as an interlayer film or the like in the vicinity of the transistor 200 reduces oxygen vacancies in the oxide semiconductor included in the transistor 200, whereby the reliability can be improved. The insulator 280 that covers the transistor 200 may function as a planarization film that covers an uneven shape thereunder. Note that the insulator 280 is provided in contact with an insulator 225 formed above the transistor 200.

For the insulator including an excess-oxygen region, specifically, an oxide material from which part of oxygen is released by heating is preferably used. An oxide from which oxygen is released by heating is an oxide film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably in a range higher than or equal to 100° C. and lower than or equal to 700° C., or higher than or equal to 100° C. and lower than or equal to 500° C.

As such a material, for example, a material containing silicon oxide or silicon oxynitride is preferably used. Alternatively, a metal oxide can be used.

A structure in which an insulator 282 is provided over the insulator 280 may be employed. A substance having a barrier property against oxygen and hydrogen is preferably used for the insulator 282. Thus, a material similar to that for the insulator 214 can be used for the insulator 282. For the insulator 282, for example, a metal oxide such as aluminum oxide, hafnium oxide, or tantalum oxide is preferably used. When the insulator 282 is deposited by a sputtering method using plasma containing oxygen, for example, oxygen can be added to the insulator 280 serving as a base layer of the insulator.

In particular, aluminum oxide has an excellent blocking effect that inhibits the passage of both oxygen and impurities such as hydrogen and moisture which are factors of a change in electrical characteristics of the transistor. Accordingly, aluminum oxide can prevent entry of impurities such as hydrogen and moisture into the transistor 200 in a manufacturing process and after manufacturing of the transistor. In addition, release of oxygen from the oxide included in the transistor 200 can be inhibited. Therefore, aluminum oxide is suitably used for a protective film for the transistor 200.

An insulator 286 is provided over the insulator 282. A material similar to that for the insulator 320 can be used for the insulator 286. When a material with a relatively low permittivity is used for an interlayer film, the parasitic capacitance between wirings can be reduced. For example, a silicon oxide film, a silicon oxynitride film, or the like can be used as the insulator 286.

A conductor 246, a conductor 248, and the like are embedded in an insulator 220, an insulator 222, an insulator 224, the insulator 225, the insulator 280, the insulator 282, and the insulator 286.

The conductor 246 and the conductor 248 can be provided using a material similar to those for the conductor 328 and the conductor 330.

The capacitor 140 is provided above the transistor 200. The capacitor 140 includes a conductor 110, a conductor 120, and an insulator 130.

A conductor 112 may be provided over the conductor 246 and the conductor 248. Note that the conductor 112 and the conductor 110 can be formed at the same time.

As the conductor 112 and the conductor 110, a metal film containing an element selected from molybdenum, titanium, tantalum, tungsten, aluminum, copper, chromium, neodymium, and scandium; a metal nitride film containing any of the above elements as its component (e.g., a tantalum nitride film, a titanium nitride film, a molybdenum nitride film, or a tungsten nitride film); or the like can be used. Alternatively, a conductive material such as an indium tin oxide, an indium oxide containing tungsten oxide, an indium zinc oxide containing tungsten oxide, an indium oxide containing titanium oxide, an indium tin oxide containing titanium oxide, an indium zinc oxide, or an indium tin oxide to which silicon oxide is added can be used.

Although the conductor 112 and the conductor 110 each have a single-layer structure in FIG. 26, the structure is not limited thereto; a stacked-layer structure of two or more layers may be employed. For example, between a conductor having a barrier property and a conductor having high conductivity, a conductor which is highly adhesive to the conductor having a barrier property and the conductor having high conductivity may be formed.

As a dielectric of the capacitor 140, the insulator 130 is provided over the conductor 112 and the conductor 110. The insulator 130 can be provided to have a stacked-layer structure or a single-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, a material with high dielectric strength, such as silicon oxynitride, is preferably used for the insulator 130. In the capacitor 140 with the structure, owing to the insulator 130, the dielectric strength can be improved and the electrostatic breakdown of the capacitor 140 can be inhibited.

Over the insulator 130, the conductor 120 is provided to overlap with the conductor 110. Note that a conductive material such as a metal material, an alloy material, or a metal oxide material can be used for the conductor 120. It is preferable to use a high-melting-point material which has both heat resistance and conductivity, such as tungsten or molybdenum, and it is particularly preferable to use tungsten. In the case where the conductor 120 is formed concurrently with another component such as a conductor, Cu (copper), Al (aluminum), or the like which is a low-resistance metal material is used.

An insulator 150 is provided over the conductor 120 and the insulator 130. The insulator 150 can be provided using a material similar to that for the insulator 320. Furthermore, the insulator 150 may function as a planarization film that covers an uneven shape thereunder.

A conductor 156 is embedded in the insulator 150. Note that the conductor 156 can be provided using a material similar to those for the conductor 328 and the conductor 330.

A conductor 166 is provided over the conductor 156. Furthermore, an insulator 160 is provided over the conductor 166 and the insulator 150. The insulator 160 may function as a planarization film that covers an uneven shape thereunder.

The above is the description of the structure example. With the use of this structure, a change in electrical characteristics can be inhibited and reliability can be improved in a semiconductor device using an OS transistor. Alternatively, the power consumption of a semiconductor device using an OS transistor can be reduced. Alternatively, a semiconductor device using an OS transistor can be miniaturized or highly integrated. Alternatively, a miniaturized or highly integrated semiconductor device can be provided with high productivity.

Modification Example of Semiconductor Device 100

Figure 27:
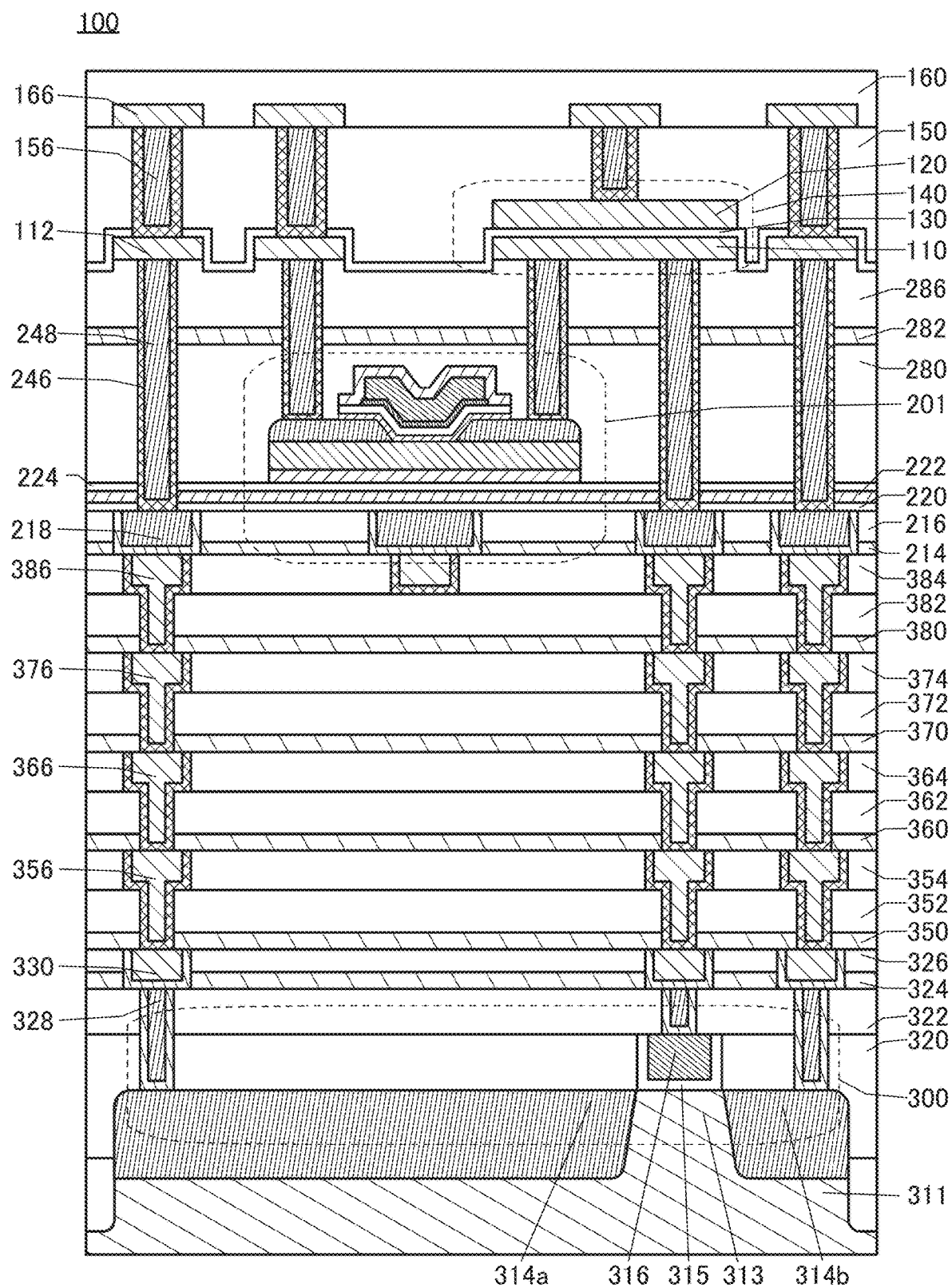
FIG. 27 A cross-sectional view illustrating a structure example of a semiconductor device.

FIG. 27 illustrates an example of a modification example of this embodiment.

FIG. 27 is a schematic cross-sectional view of the case where the transistor 200 in FIG. 26 is replaced by a transistor 201. Like the transistor 200, the transistor 201 is an OS transistor. The details of the transistor 201 will be described in after-mentioned Embodiment 5.

For the details of the other components in FIG. 27, refer to the description of FIG. 26.

Note that this embodiment can be combined with the other embodiment described in this specification as appropriate.

Embodiment 5

In this embodiment, the details of the transistor 200 and the transistor 201 described in Embodiment 4 will be described with reference to FIG. 28 to FIG. 31.

<<Transistor 200>>

First, the details of the transistor 200 illustrated in FIG. 28 will be described.

Figure 28A:
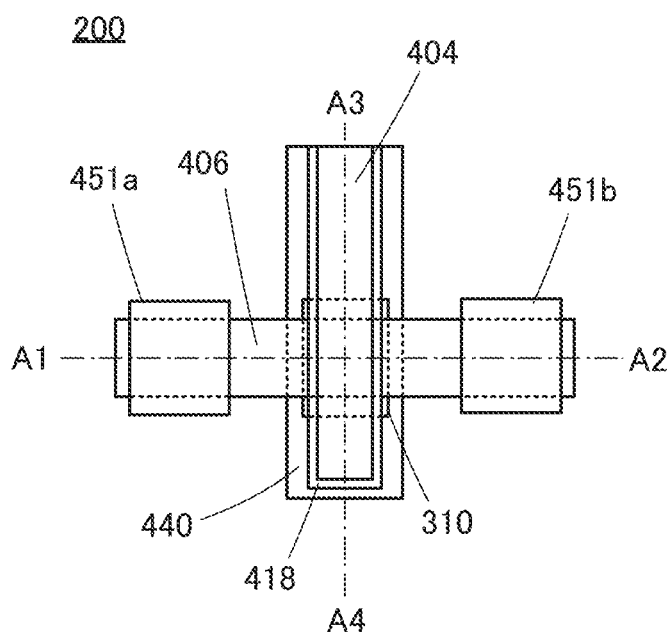
FIG. 28 A top view and cross-sectional views illustrating a structure example of a transistor.
Figure 28C:
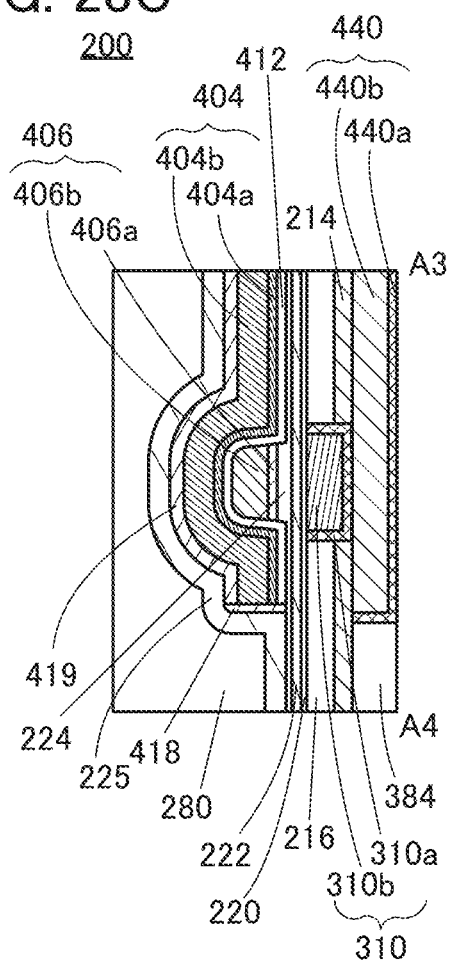
Figure 28B:
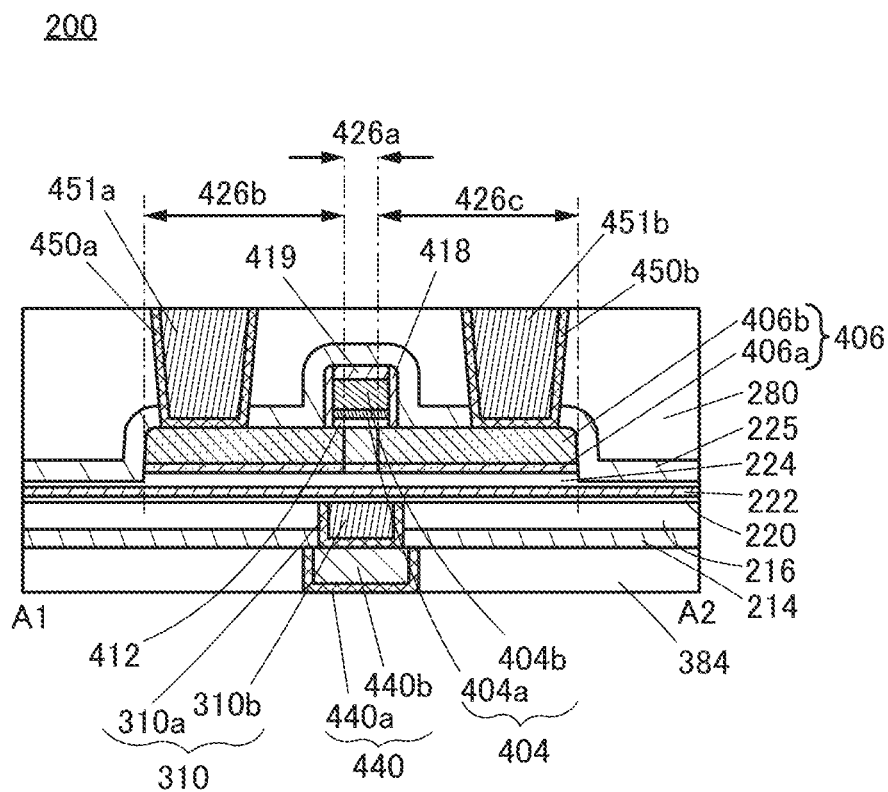

FIG. 28(A) is a top view of a semiconductor device including the transistor 200. Moreover, FIG. 28(B) is a cross-sectional view of a portion indicated by a dashed-dotted line A1-A2 in FIG. 28(A), and is also a cross-sectional view of the transistor 200 in a channel length direction. Furthermore, FIG. 28(C) is a cross-sectional view of a portion indicated by a dashed-dotted line A3-A4 in FIG. 28(A), and is also a cross-sectional view of the transistor 200 in a channel width direction. In the top view of FIG. 28(A), some components are not illustrated for simplification of the drawing.

As illustrated in FIGS. 28(A) to 28(C), the transistor 200 includes the insulator 224 located over a substrate (not illustrated), a metal oxide 406a located over the insulator 224, a metal oxide 406b located in contact with at least part of a top surface of the metal oxide 406a, an insulator 412 located over the metal oxide 406b, a conductor 404a located over the insulator 412, a conductor 404b located over the conductor 404a, an insulator 419 located over the conductor 404b, an insulator 418 located in contact with side surfaces of the insulator 412, the conductor 404a, the conductor 404b, and the insulator 419, and the insulator 225 located in contact with a top surface of the metal oxide 406b and a side surface of the insulator 418. Here, as illustrated in FIG. 28(B), a top surface of the insulator 418 is preferably substantially aligned with a top surface of the insulator 419. Furthermore, the insulator 225 is preferably provided to cover the insulator 419, a conductor 404, the insulator 418, and a metal oxide 406.

In the following description, the metal oxide 406a and the metal oxide 406b are collectively referred to as the metal oxide 406, in some cases. Note that although the structure in which the metal oxide 406a and the metal oxide 406b are stacked in the transistor 200 is illustrated, the present invention is not limited thereto. For example, a structure in which only the metal oxide 406b is provided may be employed. Furthermore, the conductor 404a and the conductor 404b are collectively denoted by the conductor 404, in some cases. Note that although the structure in which the conductor 404a and the conductor 404b are stacked in the transistor 200 is illustrated, the present invention is not limited thereto. For example, a structure in which only the conductor 404b is provided may be employed.

In a conductor 440, a conductor 440a is formed in contact with an inner wall of an opening of the insulator 384 and a conductor 440b is formed on the inner side. Here, the top surfaces of the conductor 440a and the conductor 440b and the top surface of the insulator 384 can be substantially level with each other. Note that although the structure in which the conductor 440a and the conductor 440b are stacked in the transistor 200 is illustrated, the present invention is not limited thereto. For example, a structure in which only the conductor 440b is provided may be employed.

A conductor 310 includes a conductor 310a and a conductor 310b. The conductor 310a is formed in contact with an inner wall of an opening of the insulator 214 and the insulator 216, and the conductor 310b is formed on the inner side. Thus, a structure in which the conductor 310a is in contact with the conductor 440b is preferable. Here, the top surfaces of the conductor 310a and the conductor 310b and the top surface of the insulator 216 can be substantially level with each other. Note that although the structure in which the conductor 310a and the conductor 310b are stacked in the transistor 200 is illustrated, the present invention is not limited thereto. For example, a structure in which only the conductor 310b is provided may be employed.

The conductor 404 can function as a top gate, and the conductor 310 can function as a back gate. The potential of the back gate may be the same as the potential of the top gate, or may be the ground potential or a given potential. Moreover, by changing the potential of the back gate not in synchronization with but independently of the potential of the top gate, the threshold voltage of the transistor can be changed.

The conductor 440 extends in the channel width direction in a manner similar to that of the conductor 404, and functions as the conductor 310, that is, a wiring that applies potential to the back gate. Here, when the conductor 310 embedded in the insulator 214 and the insulator 216 is stacked over the conductor 440 functioning as the wiring for the back gate, the insulator 214 and the insulator 216 and the like are provided between the conductor 440 and the conductor 404, reducing the parasitic capacitance between the conductor 440 and the conductor 404 and thereby increasing the withstand voltage. The reduction in the parasitic capacitance between the conductor 440 and the conductor 404 can improve the switching speed of the transistor, so that the transistor can have high frequency characteristics. Furthermore, the increase in the withstand voltage between the conductor 440 and the conductor 404 can improve the reliability of the transistor 200. Therefore, the thicknesses of the insulator 214 and the insulator 216 are preferably large. Note that the extending direction of the conductor 440 is not limited thereto; for example, the conductor 440 may extend in the channel length direction of the transistor 200.

Here, it is preferable to use conductive materials that have a function of inhibiting the passage of (that are relatively impermeable to) impurities such as water or hydrogen for the conductor 310a and the conductor 440a. For example, tantalum, tantalum nitride, ruthenium, ruthenium oxide, or the like is preferably used, and a single layer or a stacked layer is used. Owing to this, diffusion of impurities such as hydrogen or water from a lower layer into an upper layer through the conductor 440 and the conductor 310 can be inhibited. Note that it is preferable that the conductor 310a and the conductor 440a have a function of inhibiting the passage of at least one of impurities such as a hydrogen atom, a hydrogen molecule, a water molecule, an oxygen atom, an oxygen molecule, a nitrogen atom, a nitrogen molecule, a nitrogen oxide molecule ($N_2O$, NO, $NO_2$, and the like), and a copper atom and oxygen (for example, an oxygen atom and an oxygen molecule). Furthermore, the same applies to the case where a conductive material having a function of inhibiting the passage of impurities is described below. When the conductor 310a and the conductor 440a have a function of inhibiting the passage of oxygen, the conductivity of the conductor 310b and the conductor 440b can be prevented from being lowered because of oxidation.

Moreover, the conductor 310b preferably uses a conductive material containing tungsten, copper, or aluminum as its main component. In addition, although not illustrated, the conductor 310b may have a stacked-layer structure and be, for example, a stack of titanium or titanium nitride and the above-described conductive material.

Furthermore, since the conductor 440b serves as a wiring, a conductor having a higher conductivity than the conductor 310b is preferably used, and a conductive material containing copper or aluminum as its main component can be used, for example. In addition, although not illustrated, the conductor 440b may have a stacked-layer structure and for example, may be a stack of titanium or titanium nitride and the above-described conductive material.

The insulator 214 can function as a barrier insulating film for preventing impurities such as water or hydrogen from entering the transistor from a lower layer. The insulator 214 preferably uses an insulating material having a function of inhibiting the passage of impurities such as water or hydrogen. For example, for the insulator 214, silicon nitride or the like is preferably used. Accordingly, diffusion of impurities such as hydrogen or water to a layer over the insulator 214 can be inhibited. Note that it is preferable that the insulator 214 have a function of inhibiting the passage of at least one of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Furthermore, the same applies to the case where an insulating material having a function of inhibiting the passage of impurities is described below.

Furthermore, the insulator 214 preferably uses an insulating material having a function of inhibiting the passage of oxygen (for example, an oxygen atom or an oxygen molecule). This can inhibit downward diffusion of oxygen contained in the insulator 224 or the like.

Furthermore, with the structure in which the conductor 310 is stacked over the conductor 440, the insulator 214 can be provided between the conductor 440 and the conductor 310. Here, even when a metal that is easily diffused, such as copper, is used as the conductor 440b, silicon nitride or the like provided as the insulator 214 can prevent diffusion of the metal to a layer over the insulator 214.

Moreover, for an insulator 222, an insulating material having a function of inhibiting the passage of oxygen and impurities such as water or hydrogen is preferably used, and for example, aluminum oxide or hafnium oxide is preferably used. Accordingly, diffusion of impurities such as water or hydrogen from a layer under the insulator 222 to a layer over the insulator 222 can be inhibited. Furthermore, downward diffusion of oxygen contained in the insulator 224 or the like can be inhibited.

Furthermore, the concentration of impurities such as water, hydrogen, or nitrogen oxide in the insulator 224 is preferably reduced. The released amount of hydrogen from the insulator 224 that is converted into the released amount of hydrogen molecules per unit area of the insulator 224 is lower than or equal to $2 \times 10^{15}$ molecules/cm$^2$, preferably lower than or equal to $1 \times 10^{15}$ molecules/cm$^2$, further preferably lower than or equal to $5 \times 10^{14}$ molecules/cm$^2$ in a thermal desorption spectroscopy analysis method (TDS) in a film-surface temperature range from 50° C. to 500° C., for example. Moreover, the insulator 224 is preferably formed using an insulator from which oxygen is released by heating.

The insulator 412 can function as a first gate insulating film, and an insulator 220, the insulator 222, and the insulator 224 can function as a second gate insulating film. Note that although the structure in which the insulator 220, the insulator 222, and the insulator 224 are stacked in the transistor 200 is illustrated, the present invention is not limited thereto. For example, a structure in which any two layers of the insulator 220, the insulator 222, and the insulator 224 are stacked may be used, or a structure in which any one layer of them is used may be used.

As the metal oxide 406, a metal oxide functioning as an oxide semiconductor is preferably used. As the metal oxide, a metal oxide having an energy gap greater than or equal to 2 eV, preferably greater than or equal to 2.5 eV is preferably used. With the use of a metal oxide having such a wide energy gap, the off-state current of the transistor can be reduced.

A transistor using a metal oxide has an extremely low leakage current in a non-conduction state; thus, a semiconductor device with low power consumption can be provided. Moreover, a metal oxide can be deposited by a sputtering method or the like and thus can be used in a transistor included in a highly integrated semiconductor device.

The metal oxide 406 preferably contains at least indium or zinc. In particular, indium and zinc are preferably contained. In addition, aluminum, gallium, yttrium, tin, or the like is preferably contained. Furthermore, one kind or a plurality of kinds selected from boron, silicon, titanium, iron, nickel, germanium, zirconium, molybdenum, lanthanum, cerium, neodymium, hafnium, tantalum, tungsten, magnesium, or the like may be contained.

Here, the case where the metal oxide 406 is an In-M-Zn oxide containing indium, an element M, and zinc is considered. Note that the element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that a plurality of the above elements may be used in combination as the element M in some cases.

Note that in this specification and the like, a metal oxide containing nitrogen is also called a metal oxide in some cases. Moreover, a metal oxide containing nitrogen may be called a metal oxynitride.

Here, the atomic ratio of the element M to constituent elements in the metal oxide used as the metal oxide 406a is preferably greater than the atomic ratio of the element M to constituent elements in the metal oxide used as the metal oxide 406b. Moreover, the atomic ratio of the element M to In in the metal oxide used as the metal oxide 406a is preferably greater than the atomic ratio of the element M to In in the metal oxide used as the metal oxide 406b. Furthermore, the atomic ratio of In to the element M in the metal oxide used as the metal oxide 406b is preferably greater than the atomic ratio of In to the element M in the metal oxide used as the metal oxide 406a.

It is preferable that by using the above metal oxide as the metal oxide 406a, the energy of the conduction band minimum of the metal oxide 406a be higher than the energy of the conduction band minimum of a region of the metal oxide 406b where the energy of the conduction band minimum is low. In other words, the electron affinity of the metal oxide 406a is preferably smaller than the electron affinity of the region of the metal oxide 406b where the energy of conduction band minimum is low.

Here, the energy level of the conduction band minimum gradually changes in the metal oxide 406a and the metal oxide 406b. In other words, it continuously changes or is continuously connected. To obtain such an energy level, the density of defect states in a mixed layer formed at an interface between the metal oxide 406a and the metal oxide 406b is preferably made low.

Specifically, when the metal oxide 406a and the metal oxide 406b contain the same element (as a main component) in addition to oxygen, a mixed layer with a low density of defect states can be formed. For example, in the case where the metal oxide 406b is an In—Ga—Zn oxide, it is preferable to use an In—Ga—Zn oxide, a Ga—Zn oxide, gallium oxide, or the like as the metal oxide 406a.

In this case, a narrow-gap portion formed in the metal oxide 406b serves as a main carrier path. Since the density of defect states at the interface between the metal oxide 406a and the metal oxide 406b can be made low, the influence of interface scattering on carrier conduction is small, and high on-state current can be obtained.

Furthermore, the metal oxide 406 includes a region 426a, a region 426b, and a region 426c. The region 426a is sandwiched between the region 426b and the region 426c as illustrated in FIG. 28(B). The region 426b and the region 426c are regions having reduced resistance owing to the deposition of the insulator 225 and are regions having higher conductivity than the region 426a. An impurity element such as hydrogen or nitrogen included in the atmosphere for depositing the insulator 225 is added to the region 426b and the region 426c. Thus, owing to the added impurity element, oxygen vacancies are generated mainly in the regions of the metal oxide 406b that overlap with the insulator 225, and furthermore the impurity element enters the oxygen vacancies, which increases the carrier density and decreases the resistance.

Therefore, the region 426b and the region 426c preferably have a higher concentration of at least one of hydrogen and nitrogen than the region 426a. The concentration of hydrogen or nitrogen is measured by a secondary ion mass spectrometry method (SIMS) or the like. Here, the concentration of hydrogen or nitrogen in the middle of the region of the metal oxide 406b that overlaps with the insulator 412 (for example, a portion in the metal oxide 406b which is located equidistant from both side surfaces in the channel length direction of the insulator 412) is measured as the concentration of hydrogen or nitrogen in the region 426a.

Note that the resistance of the region 426b and the region 426c is reduced by addition of an element that generates oxygen vacancies or an element that is bonded to oxygen vacancies. Typical examples of the element include hydrogen, boron, carbon, nitrogen, fluorine, phosphorus, sulfur, chlorine, titanium, and rare gas. In addition, typical examples of the rare gas element include helium, neon, argon, krypton, and xenon. Thus, the region 426b and the region 426c have a structure in which one or a plurality of the above-described elements are included.

Furthermore, it is preferable in the metal oxide 406a that the atomic ratio of In to the element M in the region 426b and the region 426c be substantially the same as the atomic ratio of In to the element M in the metal oxide 406b. In other words, in the metal oxide 406a, the atomic ratio of In to the element M in the region 426b and the region 426c is preferably larger than the atomic ratio of In to the element M in the region 426a. Here, when the indium content in the metal oxide 406 is increased, the carrier density is increased and the resistance can be decreased. With this structure, even when the thickness of the metal oxide 406b becomes small and electric resistance of the metal oxide 406b becomes high in the manufacturing process of the transistor 200, the region 426b in the metal oxide 406 can function as one of a source region and a drain region and the region 426c in the metal oxide 406 can function as the other of the source region and the drain region, owing to the sufficiently reduced resistance of the metal oxide 406a in the region 426b and the region 426c.

Figure 29A:
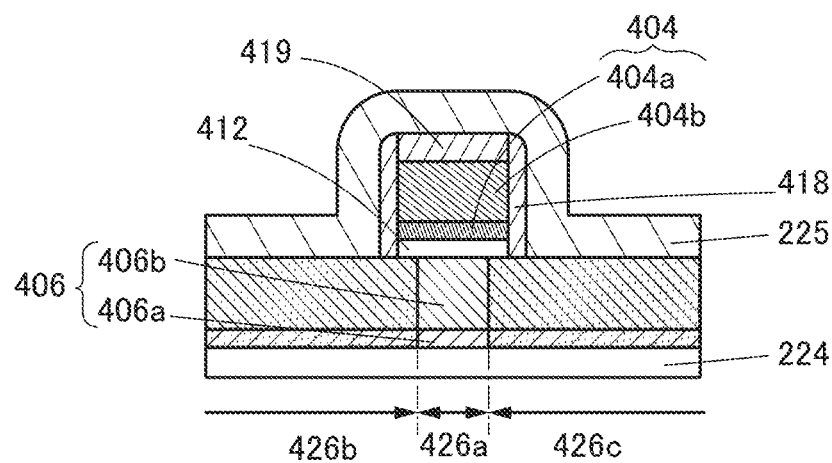
FIG. 29 Cross-sectional views illustrating structure examples of transistors.

An enlarged view of the vicinity of the region 426a illustrated in FIG. 28(B) is illustrated in FIG. 29(A). As illustrated in FIG. 29(A), the region 426b and the region 426c are formed in at least the regions overlapping with the insulator 225 in the metal oxide 406. Here, one of the region 426b and the region 426c in the metal oxide 406b can function as a source region, and the other can function as a drain region. Moreover, the region 426a in the metal oxide 406b can function as a channel formation region.

Note that although the region 426a, the region 426b, and the region 426c are formed in the metal oxide 406b and the metal oxide 406a in FIG. 28(B) and FIG. 29(A), it is acceptable as long as these regions are formed in the metal oxide 406b. Furthermore, although a boundary between the region 426a and the region 426b and a boundary between the region 426a and the region 426c are illustrated as being substantially perpendicular to the top surface of the metal oxide 406 in FIG. 28(B) and the like, this embodiment is not limited thereto. For example, in some cases, the region 426b and the region 426c project to the conductor 404 side in the vicinity of the surface of the metal oxide 406b and are recessed to the insulator 225 side in the vicinity of a bottom surface of the metal oxide 406a.

In the transistor 200, as illustrated in FIG. 29(A), the region 426b and the region 426c are formed in the regions where the metal oxide 406 is in contact with the insulator 225 and the regions overlapping with the vicinity of the both end portions of the insulator 418 and the insulator 412. In this case, portions of the region 426b and the region 426c which overlap with the conductor 404 function as what is called overlap regions (also referred to as Lov regions). Because a high-resistance region is not formed between the channel formation region and the source region or the drain region of the metal oxide 406 in the structure including the Lov region, the on-state current and the mobility of the transistor can be increased.

Figure 29B:
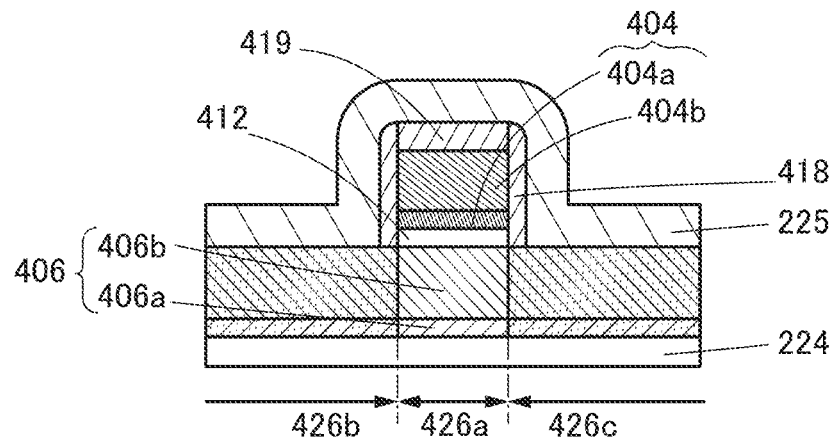

Note that the semiconductor device described in this embodiment is not limited thereto. For example, as illustrated in FIG. 29(B), a structure in which the region 426b and the region 426c are formed in regions where the metal oxide 406 overlaps with the insulator 225 and the insulator 418 may be used. Note that the structure illustrated in FIG. 29(B) can be rephrased as the structure in which the width of the conductor 404 in the channel length direction is substantially the same as the width of the region 426a. With the structure illustrated in FIG. 29(B), a high-resistance region is not formed between the channel formation region and the source region and the drain region, so that the on-state current of the transistor can be increased. Moreover, with the structure illustrated in FIG. 29(B), the gate does not overlap with the source region and the drain region in the channel length direction, so that formation of unnecessary capacitance can be inhibited.

Thus, by appropriately selecting the areas of the region 426b and the region 426c, a transistor having electric characteristics necessary for the circuit design can be easily provided.

The insulator 412 is preferably located in contact with the top surface of the metal oxide 406b. The insulator 412 is preferably formed using an insulator from which oxygen is released by heating. When the insulator 412 is formed in contact with the top surface of the metal oxide 406b, oxygen can be supplied to the metal oxide 406b effectively. Furthermore, as in the insulator 224, the concentration of impurities such as water or hydrogen in the insulator 412 is preferably reduced. The thickness of the insulator 412 is preferably greater than or equal to 1 nm and less than or equal to 20 nm, and may be approximately 1 nm, for example.

The insulator 412 preferably contains oxygen. For example, the released amount of oxygen molecules that is converted into the released amount of oxygen molecules per unit area of the insulator 412 is higher than or equal to $1\times10^{14}$ molecules/cm$^2$, preferably higher than or equal to $2\times10^{14}$ molecules/cm$^2$, further preferably higher than or equal to $4\times10^{14}$ molecules/cm$^2$ in a thermal desorption spectroscopy analysis method (TDS analysis) in the range of a surface temperature of higher than or equal to 100° C. and lower than or equal to 700° C. or higher than or equal to 100° C. and lower than or equal to 500° C.

The insulator 412, the conductor 404, and the insulator 419 each include a region overlapping with the metal oxide 406b. In addition, side surfaces of the insulator 412, the conductor 404a, the conductor 404b, and the insulator 419 are preferably substantially aligned with each other.

As the conductor 404a, a conductive oxide is preferably used. For example, the metal oxide that can be used as the metal oxide 406a or the metal oxide 406b can be used. In particular, an In—Ga—Zn-based oxide with a metal atomic ratio of [In]:[Ga]:[Zn]=4:2:3 to 4:1 and a value in the vicinity thereof, which has high conductivity, is preferably used. When the above conductor 404a is provided, the passage of oxygen into the conductor 404b can be inhibited, and an increase in the electric resistance value of the conductor 404b due to oxidation can be prevented.

Moreover, when such a conductive oxide is deposited by a sputtering method, oxygen can be added to the insulator 412, so that oxygen can be supplied to the metal oxide 406b. Thus, oxygen vacancies in the region 426a of the metal oxide 406 can be reduced.

For the conductor 404b, a metal such as tungsten can be used, for example. Alternatively, as the conductor 404b, a conductor that can add impurities such as nitrogen to the conductor 404a to improve the conductivity of the conductor 404a may be used. For example, titanium nitride or the like is preferably used for the conductor 404b. Furthermore, the conductor 404b may have a structure in which a metal such as tungsten is stacked over a metal nitride such as titanium nitride.

Here, the conductor 404 having a function of a gate electrode is provided to cover the top surface in the vicinity of the region 426a and the side surface, which is in the channel width direction, of the metal oxide 406b with the insulator 412 interposed therebetween. Thus, the electric field of the conductor 404 having a function of a gate electrode can electrically surround the top surface in the vicinity of the region 426a and the side surface, which is in the channel width direction, of the metal oxide 406b. The structure of the transistor in which the channel formation region is electrically surrounded by the electric field of the conductor 404 is referred to as a surrounded channel (s-channel) structure. Thus, a channel can be formed in the top surface in the vicinity of the region 426a and the side surface, which is in the channel width direction, of the metal oxide 406b; therefore, a large amount of current can flow between the source and the drain, and a current in a conduction state (on-state current) can be large. Moreover, since the top surface in the vicinity of the region 426a and the side surface, which is in the channel width direction, of the metal oxide 406b are surrounded by the electric field of the conductor 404, a leakage current in a non-conduction state (off-state current) can be low.

The insulator 419 is preferably located over the conductor 404b. In addition, side surfaces of the insulator 419, the conductor 404a, the conductor 404b, and the insulator 412 are preferably substantially aligned with each other. The insulator 419 is preferably deposited by an atomic layer deposition (ALD) method. In that case, the insulator 419 can be deposited to have a thickness of approximately greater than or equal to 1 nm and less than or equal to 20 nm, preferably approximately greater than or equal to 5 nm and less than or equal to 10 nm. Here, for the insulator 419 as well as the insulator 418, an insulating material having a function of inhibiting the passage of oxygen and impurities such as water or hydrogen is preferably used; aluminum oxide, hafnium oxide, or the like is preferably used, for example.

When the insulator 419 is provided, the insulator 419 and the insulator 418 which have a function of inhibiting the passage of oxygen and impurities such as water or hydrogen can cover a top surface and side surfaces of the conductor 404. This can prevent entry of impurities such as water or hydrogen into the metal oxide 406 through the conductor 404. Thus, the insulator 418 and the insulator 419 have a function of a gate cap that protects the gate.

The insulator 418 is provided in contact with the side surfaces of the insulator 412, the conductor 404, and the insulator 419. Furthermore, the top surface of the insulator 418 is preferably substantially aligned with the top surface of the insulator 419. The insulator 418 is preferably deposited by an ALD method. In that case, the insulator 418 can be deposited to have a thickness of approximately greater than or equal to 1 nm and less than or equal to 20 nm, preferably approximately greater than or equal to 1 nm and less than or equal to 3 nm, and for example, 1 nm.

As described above, the region 426b and the region 426c of the metal oxide 406 are formed by the impurity element added in the deposition of the insulator 225. In the case where the transistor is miniaturized and formed to have a channel length of approximately 10 nm to 30 nm, the impurity element contained in the source region or the drain region might be diffused to bring electrical connection between the source region and the drain region. In view of this, the insulator 418 is formed as described in this embodiment, so that the distance between regions of the metal oxide 406 that are in contact with the insulator 225 is increased; accordingly, electrical connection between the source region and the drain region can be prevented. Furthermore, when the insulator 418 is formed using an ALD method, the thickness thereof is as small as or smaller than the length of the miniaturized channel, an excessive increase of the distance between the source region and the drain region is not caused, and thereby an increase in the resistance can be prevented.

Here, for the insulator 418, an insulating material having a function of inhibiting the passage of oxygen and impurities such as water or hydrogen is preferably used, and for example, aluminum oxide or hafnium oxide is preferably used. Accordingly, oxygen in the insulator 412 can be prevented from diffusing to the outside. Furthermore, entry of impurities such as hydrogen or water to the metal oxide 406 from an end portion or the like of the insulator 412 can be inhibited.

The insulator 418 is preferably formed by depositing an insulating film by an ALD method and then performing anisotropic etching so as to leave a portion of the insulating film that is in contact with the side surfaces of the insulator 412, the conductor 404, and the insulator 419. Thus, an insulator having a small thickness as described above can be easily formed. Furthermore, since the insulator 419 is provided over the conductor 404, the portions of the insulator 418 in contact with the insulator 412 and the conductor 404 can to be left sufficiently even when the insulator 419 is partly removed by the anisotropic etching.

The insulator 225 is provide to cover the insulator 419, the insulator 418, the metal oxide 406, and the insulator 224. Here, the insulator 225 is provided in contact with the top surfaces of the insulator 419 and the insulator 418 and in contact with the side surface of the insulator 418. As described above, the insulator 225 adds impurities such as hydrogen or nitrogen to the metal oxide 406, so that the region 426b and the region 426c are formed. Thus, the insulator 225 preferably contains at least one of hydrogen and nitrogen.

Furthermore, the insulator 225 is preferably provided in contact with a side surface of the metal oxide 406b and a side surface of the metal oxide 406a as well as the top surface of the metal oxide 406b. This enables a resistance reduction to the side surface of the metal oxide 406b and the side surface of the metal oxide 406a in the region 426b and the region 426c.

Moreover, for the insulator 225, an insulating material having a function of inhibiting the passage of oxygen and impurities such as water or hydrogen is preferably used. For example, as the insulator 225, silicon nitride, silicon nitride oxide, silicon oxynitride, aluminum nitride, aluminum nitride oxide, or the like is preferably used. Formation of such an insulator 225 can prevent a reduction in carrier density due to oxygen passing through the insulator 225 and oxygen being supplied to oxygen vacancies in the region 426b and the region 426c. Furthermore, impurities such as water or hydrogen can be prevented from passing through the insulator 225 and excessively enlarging the region 426b and the region 426c to the region 426a side.

An insulator 280 is preferably provided over the insulator 225. Furthermore, as in the insulator 224 or the like, the concentration of impurities such as water or hydrogen in the insulator 280 is preferably reduced.

In openings formed in the insulator 280 and the insulator 225, a conductor 450a and a conductor 451a, and a conductor 450b and a conductor 451b are located. The conductor 450a and the conductor 451a, and the conductor 450b and the conductor 451b are preferably provided to face each other with the conductor 404 sandwiched therebetween.

Here, the conductor 450a is formed in contact with an inner wall of the opening of the insulator 280 and the insulator 225, and the conductor 451a is formed on the inner side. The region 426b of the metal oxide 406 is positioned in at least part of a bottom portion of the opening, and the conductor 450a is in contact with the region 426b. Similarly, the conductor 450b is formed in contact with an inner wall of the opening of the insulator 280 and the insulator 225, and the conductor 451b is formed on the inner side. The region 426c of the metal oxide 406 is positioned in at least part of a bottom portion of the opening, and the conductor 450b is in contact with the region 426c.

The conductor 450a and the conductor 451a function as one of a source electrode and a drain electrode, and the conductor 450b and the conductor 451b function as the other of the source electrode and the drain electrode.

For the conductor 450a and the conductor 450b as well as the conductor 310a or the like, a conductive material having a function of inhibiting the passage of impurities such as water or hydrogen is preferably used. For example, tantalum, tantalum nitride, titanium, titanium nitride, ruthenium, or ruthenium oxide is preferably used, and a single layer or a stacked layer may be used. This can inhibit entry of impurities such as hydrogen or water from a layer over the insulator 280 to the metal oxide 406 through the conductor 451a and the conductor 451b.

Moreover, for the conductor 451a and the conductor 451b, a conductive material containing tungsten, copper, aluminum, or the like as its main component is preferably used. Furthermore, although not illustrated, the conductor 451a and the conductor 451b may have a stacked-layer structure, and for example, may be a stack of titanium or titanium nitride and the above-described conductive material.

Next, materials for components of the transistor 200 will be described.

<Substrate>

As a substrate over which the transistor 200 is formed, for example, an insulator substrate, a semiconductor substrate, or a conductor substrate may be used. As the insulator substrate, a glass substrate, a quartz substrate, a sapphire substrate, a stabilized zirconia substrate (an yttria-stabilized zirconia substrate or the like), or a resin substrate is given, for example. Moreover, as the semiconductor substrate, a semiconductor substrate of silicon, germanium, or the like, or a compound semiconductor substrate of silicon carbide, silicon germanium, gallium arsenide, indium phosphide, zinc oxide, or gallium oxide is given, for example. Furthermore, a semiconductor substrate in which an insulator region is provided in the above semiconductor substrate, for example, an SOI (Silicon On Insulator) substrate or the like is given. As the conductor substrate, a graphite substrate, a metal substrate, an alloy substrate, a conductive resin substrate, or the like is given. Alternatively, a substrate including a metal nitride, a substrate including a metal oxide, or the like is given, and a substrate which is an insulator substrate provided with a conductor or a semiconductor, a substrate which is a semiconductor substrate provided with a conductor or an insulator, a substrate which is a conductor substrate provided with a semiconductor or an insulator, or the like is also given. Alternatively, any of these substrates over which an element is provided may be used. As the element provided over the substrate, a capacitor, a resistor, a switching element, a light-emitting element, a memory element, or the like is given.

Alternatively, a flexible substrate may be used as the substrate. Note that as a method for providing a transistor over a flexible substrate, there is a method in which the transistor is formed over a non-flexible substrate and then the transistor is separated and transferred to the substrate which is a flexible substrate. In that case, a separation layer is preferably provided between the non-flexible substrate and the transistor. Note that as the substrate, a sheet, a film, or a foil containing a fiber may be used. In addition, the substrate may have elasticity. Moreover, the substrate may have a property of returning to its original shape when bending or pulling is stopped. Alternatively, the substrate may have a property of not returning to its original shape. The substrate includes a region having a thickness of, for example, greater than or equal to 5 µm and less than or equal to 700 µm, preferably greater than or equal to 10 µm and less than or equal to 500 µm, and further preferably greater than or equal to 15 µm and less than or equal to 300 µm. When the substrate has a small thickness, the semiconductor device including the transistor can be lightweight. Furthermore, when the substrate has a small thickness, even in the case of using glass or the like, the substrate may have elasticity or a property of returning to its original shape when bending or pulling is stopped. Therefore, an impact or the like applied to the semiconductor device over the substrate, which is caused by dropping or the like, can be reduced. That is, a durable semiconductor device can be provided.

For the substrate which is a flexible substrate, metal, an alloy, resin, glass, or fiber thereof can be used, for example. The substrate which is a flexible substrate preferably has a lower coefficient of linear expansion because deformation due to an environment is inhibited. For the substrate which is a flexible substrate, for example, a material whose coefficient of linear expansion is lower than or equal to $1 \times 10^{-3}$/K, lower than or equal to $5 \times 10^{-5}$/K, or lower than or equal to $1 \times 10^{-5}$/K may be used. Examples of the resin include polyester, polyolefin, polyamide (nylon, aramid, or the like), polyimide, polycarbonate, and acrylic. In particular, aramid is preferably used for the substrate which is a flexible substrate because of its low coefficient of linear expansion.

<Insulator>

As the insulator, oxide, nitride, oxynitride, nitride oxide, metal oxide, metal oxynitride, metal nitride oxide, or the like having an insulating property is given.

When the transistor is surrounded by an insulator that has a function of inhibiting the passage of oxygen and impurities such as hydrogen, the electrical characteristics of the transistor can be stabilized. For example, an insulator that has a function of inhibiting the passage of oxygen and impurities such as hydrogen may be used as the insulator 222 and the insulator 214.

As the insulator that has a function of inhibiting the passage of oxygen and impurities such as hydrogen, for example, a single layer or a stacked layer of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used.

Furthermore, for example, as the insulator 222 and the insulator 214, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride may be used. Note that the insulator 222 and the insulator 214 preferably include aluminum oxide, hafnium oxide, or the like.

As the insulator 384, the insulator 216, the insulator 220, the insulator 224, and the insulator 412, for example, an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used as a single layer or a stacked layer. For example, the insulator 384, the insulator 216, the insulator 220, the insulator 224, and the insulator 412 each preferably include silicon oxide, silicon oxynitride, or silicon nitride.

The insulator 220, the insulator 222, the insulator 224, and/or the insulator 412 preferably include an insulator with a high dielectric constant. For example, the insulator 220, the insulator 222, the insulator 224, and/or the insulator 412 each preferably include gallium oxide, hafnium oxide, zirconium oxide, oxide containing aluminum and hafnium, oxynitride containing aluminum and hafnium, oxide containing silicon and hafnium, oxynitride containing silicon and hafnium, or nitride containing silicon and hafnium. Alternatively, the insulator 220, the insulator 222, the insulator 224, and/or the insulator 412 each preferably have a stacked-layer structure of silicon oxide or silicon oxynitride and an insulator with a high dielectric constant. Because silicon oxide and silicon oxynitride have thermal stability, a combination of silicon oxide or silicon oxynitride with an insulator with a high dielectric constant allows the stacked-layer structure to be thermally stable and have a high dielectric constant. For example, when a structure in which aluminum oxide, gallium oxide, or hafnium oxide is in contact with the metal oxide 406 in each of the insulator 224 and the insulator 412 is used, silicon contained in silicon oxide or silicon oxynitride can be prevented from entering the metal oxide 406. Furthermore, for example, when a structure in which silicon oxide or silicon oxynitride is in contact with the metal oxide 406 in each of the insulator 224 and the insulator 412 is used, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

The insulator 384, the insulator 216, and the insulator 280 preferably include an insulator with a low dielectric constant. For example, the insulator 384, the insulator 216, and the insulator 280 preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or a resin. Alternatively, the insulator 384, the insulator 216, and the insulator 280 preferably have a stacked-layer structure of silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide, and a resin. Because silicon oxide and silicon oxynitride have thermal stability, a combination of silicon oxide or silicon oxynitride with a resin allows the stacked-layer structure to have thermal stability and a low dielectric constant. Examples of the resin include polyester, polyolefin, polyamide (nylon, aramid, or the like), polyimide, polycarbonate, and acrylic.

As the insulator 418 and the insulator 419, an insulator having a function of inhibiting the passage of oxygen and impurities such as hydrogen may be used. As the insulator 418 and the insulator 419, a metal oxide such as aluminum oxide, hafnium oxide, magnesium oxide, gallium oxide, germanium oxide, yttrium oxide, zirconium oxide, lanthanum oxide, neodymium oxide, or tantalum oxide; silicon nitride oxide; or silicon nitride may be used, for example.
<Conductor>

For the conductor 404a, the conductor 404b, the conductor 310a, the conductor 310b, the conductor 450a, the conductor 450b, the conductor 451a, and the conductor 451b, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Alternatively, a semiconductor having a high electric conductivity typified by polycrystalline silicon including an impurity element such as phosphorus, or silicide such as nickel silicide may be used.

Moreover, for the above-described conductors, especially for the conductor 404a, the conductor 310a, the conductor 450a, and the conductor 450b, a conductive material containing oxygen and a metal element contained in a metal oxide that can be used for the metal oxide 406 may be used. Alternatively, a conductive material containing the above-described metal element and nitrogen may be used. For example, a conductive material containing nitrogen such as titanium nitride or tantalum nitride may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used, or indium gallium zinc oxide containing nitrogen may be used. By using such a material, hydrogen contained in the metal oxide 406 can be captured in some cases. Alternatively, hydrogen entering from an external insulator or the like can be captured in some cases.

Alternatively, a stack of a plurality of conductive layers formed using the above materials may be used. For example, a stacked-layer structure in which a material containing any of the above metal elements and a conductive material containing oxygen are combined may be used. Alternatively, a stacked-layer structure in which a material containing any of the above metal elements and a conductive material containing nitrogen are combined may be used. A stacked-layer structure in which a material containing any of the above metal elements, a conductive material containing oxygen, and a conductive material containing nitrogen are combined may be used.

Note that when oxide is used for the channel formation region in the transistor, a stacked-layer structure in which a material containing the above-described metal element and a conductive material containing oxygen are combined is preferably employed for the gate electrode. In this case, the conductive material containing oxygen is preferably formed on the channel formation region side. When the conductive material containing oxygen is formed on the channel formation region side, oxygen released from the conductive material is likely to be supplied to the channel formation region.
<Metal Oxide Applicable to Metal Oxide 406>

The metal oxide 406 according to the present invention will be described below. As the metal oxide 406, a metal oxide functioning as an oxide semiconductor is preferably used.

The metal oxide 406 preferably contains at least indium or zinc. In particular, indium and zinc are preferably contained. In addition, aluminum, gallium, yttrium, tin, or the like is preferably contained. Furthermore, one kind or a plurality of kinds selected from boron, silicon, titanium, iron, nickel, germanium, zirconium, molybdenum, lanthanum, cerium, neodymium, hafnium, tantalum, tungsten, magnesium, or the like may be contained.

Here, the case where the metal oxide 406 contains indium, the element M, and zinc is considered. Note that the terms of the atomic ratio of indium, the element M, and zinc contained in the metal oxide 406 are denoted by [In], [M], and [Zn], respectively.

Preferred ranges of the atomic ratio of indium, the element M, and zinc contained in the metal oxide 406 will be described with reference to FIGS. 30(A), 30(B), and 30(C). Note that the atomic ratio of oxygen is not shown in FIGS. 30(A), 30(B), and 30(C). In addition, the terms of the atomic ratio of indium, the element M, and zinc contained in the metal oxide 406 are denoted by [In], [M], and [Zn], respectively.

Figure 30A:
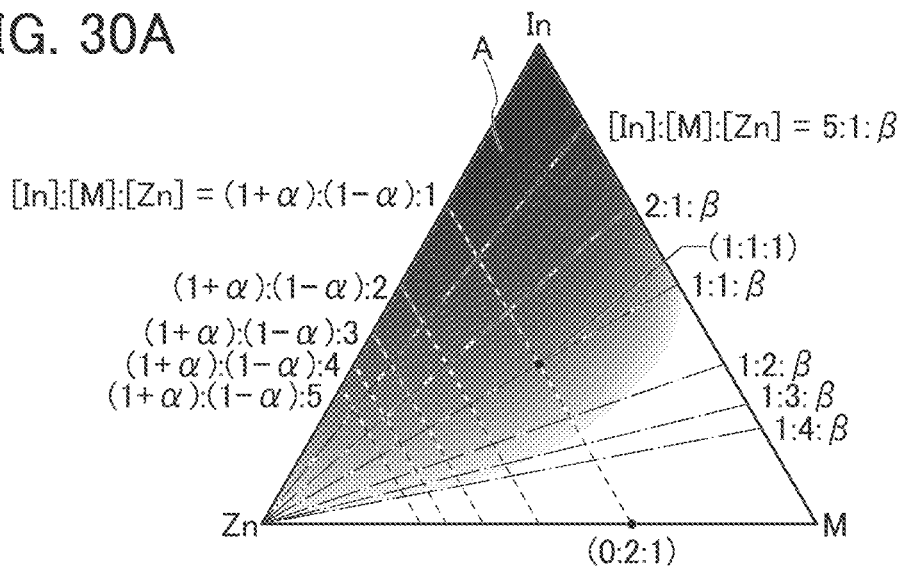
FIG. 30 Diagrams illustrating atomic ratio ranges of a metal oxide.
Figure 30B:
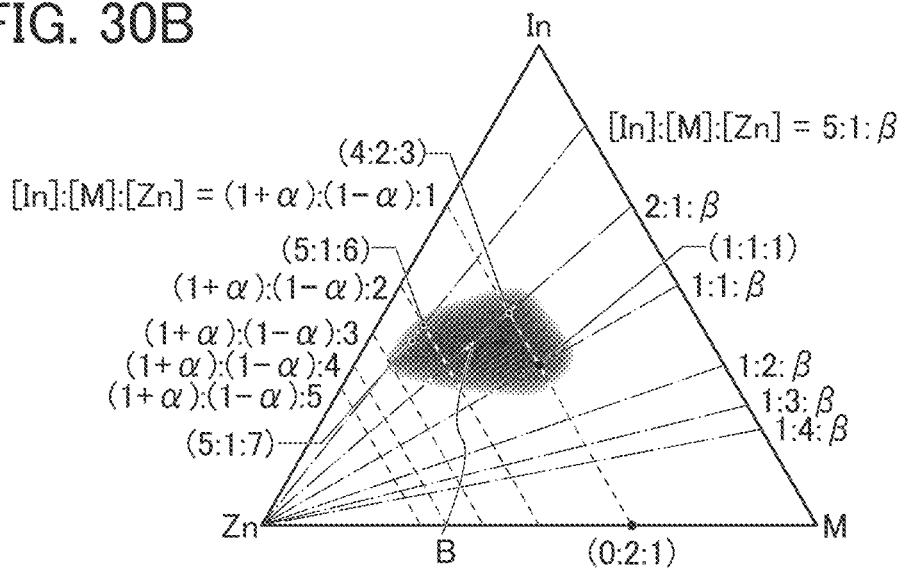
Figure 30C:
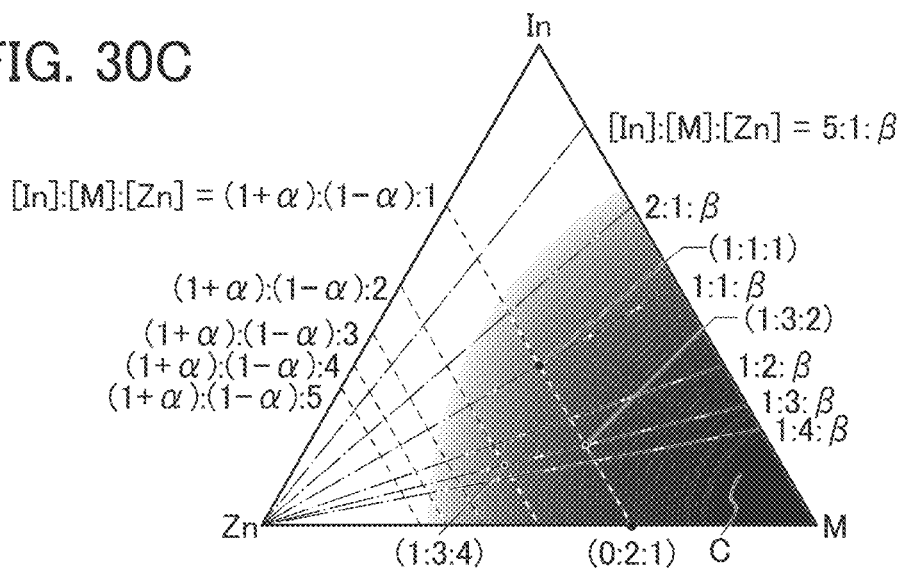

In FIGS. 30(A), 30(B), and 30(C), broken lines indicate a line representing the atomic ratio of $[In]:[M]:[Zn]=(1+\alpha):(1-\alpha):1$ $(-1 \leq \alpha \leq 1)$, a line representing the atomic ratio of $[In]:[M]:[Zn]=(1+\alpha):(1-\alpha):2$, a line representing the atomic ratio of $[In]:[M]:[Zn]=(1+\alpha):(1-\alpha):3$, a line representing the atomic ratio of $[In]:[M]:[Zn]=(1+\alpha):(1-\alpha):4$, and a line representing the atomic ratio of $[In]:[M]:[Zn]=(1+\alpha):(1-\alpha):5$.

Furthermore, dashed-dotted lines indicate a line representing the atomic ratio of $[In]:[M]:[Zn]=5:1:\beta(\beta \geq 0)$, a line representing the atomic ratio of $[In]:[M]:[Zn]=2:1:\beta$, a line representing the atomic ratio of $[In]:[M]:[Zn]=1:1:\beta$, a line representing the atomic ratio of $[In]:[M]:[Zn]=1:2:\beta$, a line representing the atomic ratio of $[In]:[M]:[Zn]=1:3:\beta$, and a line representing the atomic ratio of $[In]:[M]:[Zn]=1:4:\beta$.

Furthermore, a metal oxide with an atomic ratio of $[In]:[M]:[Zn]=0:2:1$ and a value in the vicinity thereof illustrated in FIGS. 30(A), 30(B), and 30(C) tends to have a spinel crystal structure.

In addition, a plurality of phases coexist in the metal oxide in some cases (two-phase coexistence, three-phase coexistence, or the like). For example, with an atomic ratio having a value in the vicinity of $[In]:[M]:[Zn]=0:2:1$, two phases of a spinel crystal structure and a layered crystal structure are likely to coexist. In addition, with an atomic ratio having a value in the vicinity of $[In]:[M]:[Zn]=1:0:0$, two phases of a bixbyite crystal structure and a layered crystal structure are likely to coexist. In the case where a plurality of phases coexist in the metal oxide, a crystal grain boundary might be formed between different crystal structures.

A region A illustrated in FIG. 30(A) represents an example of the preferred range of the atomic ratio of indium, the element M, and zinc contained in the metal oxide 406.

When the metal oxide has a higher content of indium, the carrier mobility (electron mobility) of the metal oxide can be increased. Thus, a metal oxide having a high content of indium has higher carrier mobility than a metal oxide having a low content of indium.

By contrast, when the content of indium and zinc in a metal oxide becomes lower, carrier mobility becomes lower. Thus, with an atomic ratio of [In]:[M]:[Zn]=0:1:0 and a value in the vicinity thereof (for example, a region C illustrated in FIG. 30(C)), high insulating properties are obtained.

For example, the metal oxide used as the metal oxide 406b preferably has an atomic ratio represented by the region A in FIG. 30(A), with which high carrier mobility is obtained. The metal oxide used as the metal oxide 406b may have an atomic ratio of In:Ga:Zn=4:2:3 to 4.1 and approximately a value in the vicinity thereof, for example. By contrast, the metal oxide used as the metal oxide 406a preferably has an atomic ratio represented by the region C in FIG. 30(C), with which relatively high insulating properties are obtained. The metal oxide used as the metal oxide 406a may have an atomic ratio of In:Ga:Zn=approximately 1:3:4.

In the region A, particularly in a region B illustrated in FIG. 30(B), an excellent metal oxide having high carrier mobility and high reliability can be obtained.

Note that the region B includes [In]:[M]:[Zn]=4:2:3 to 4.1 and a value in the vicinity thereof. The value in the vicinity includes [In]:[M]:[Zn]=5:3:4. In addition, the region B includes [In]:[M]:[Zn]=5:1:6 and a value in the vicinity thereof and [In]:[M]:[Zn]=5:1:7 and a value in the vicinity thereof.

Furthermore, in the case where an In-M-Zn oxide is used as the metal oxide 406, it is preferable to use a target including a polycrystalline In-M-Zn oxide as the sputtering target. Note that the atomic ratio of the deposited metal oxide varies from the above atomic ratios of metal elements contained in the sputtering targets in a range of ±40%. For example, when the composition ratio of a sputtering target used for the metal oxide 406 is In:Ga:Zn=4:2:4.1 [atomic ratio], the composition ratio of the deposited metal oxide may be In:Ga:Zn=4:2:3 [atomic ratio] or in the vicinity thereof. Moreover, when the composition ratio of a sputtering target used for the metal oxide 406 is In:Ga:Zn=5:1:7 [atomic ratio], the composition ratio of the deposited metal oxide may be In:Ga:Zn=5:1:6 [atomic ratio] or in the vicinity thereof.

Note that the property of a metal oxide is not uniquely determined by an atomic ratio. Even with the same atomic ratio, the property of a metal oxide might be different depending on a formation condition. For example, in the case where the metal oxide 406 is deposited with a sputtering apparatus, a film having an atomic ratio deviated from the atomic ratio of the target is formed. In addition, [Zn] in the film might be smaller than [Zn] in the target depending on the substrate temperature in deposition. Thus, the illustrated regions are each a region representing an atomic ratio with which a metal oxide tends to have specific characteristics, and boundaries of the region A to the region C are not clear.

<Composition of Metal Oxide>

The composition of a CAC (Cloud-Aligned Composite)-OS that can be used in an OS transistor will be described below.

Note that in this specification and the like, CAC refers to an example of a function or a material composition and CAAC (c-axis aligned crystal) to be described later refers to an example of a crystal structure.

A CAC-OS or a CAC-metal oxide has a conducting function in a part of the material and has an insulating function in a part of the material, and has a function of a semiconductor as the whole material. Note that in the case where the CAC-OS or the CAC-metal oxide is used in an active layer of a transistor, the conducting function is a function of allowing electrons (or holes) serving as carriers to flow, and the insulating function is a function of not allowing electrons serving as carriers to flow. By the complementary action of the conducting function and the insulating function, the CAC-OS or the CAC-metal oxide can have a switching function (On/Off function). In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm and are dispersed in the material, in some cases.

The CAC-OS or the CAC-metal oxide is formed of components having different bandgaps. For example, the CAC-OS or the CAC-metal oxide is formed of a component having a wide gap due to the insulating region and a component having a narrow gap due to the conductive region. When carriers flow in such a structure, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current drive capability in the on state of the transistor, that is, high on-state current and high field-effect mobility, can be obtained.

In other words, the CAC-OS or the CAC-metal oxide can also be called a matrix composite or a metal matrix composite.

<Structure of Metal Oxide>

An oxide semiconductor is classified into a single crystal oxide semiconductor and a non-single crystal oxide semiconductor. Examples of a non-single crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the plurality of nanocrystals are connected.

The nanocrystal is basically a hexagon but is not always a regular hexagon and is a non-regular hexagon in some cases. Furthermore, a pentagonal lattice arrangement, a heptagonal lattice arrangement, and the like are included in the distortion in some cases. Note that a clear crystal grain boundary (also referred to as a grain boundary) cannot be observed even in the vicinity of distortion in the CAAC-OS. That is, formation of a crystal grain boundary is inhibited by the distortion of a lattice arrangement. This is probably because the CAAC-OS can tolerate distortion owing to a low density of oxygen atom arrangement in an a-b plane direction, a change in interatomic bond distance by replacement of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M of the (M,Zn) layer is replaced by indium, the layer can also be referred to as an (In,M,Zn) layer. Furthermore, when indium of the In layer is replaced by the element M, the layer can also be referred to as an (In,M) layer.

The CAAC-OS is an oxide semiconductor with high crystallinity. By contrast, in the CAAC-OS, it can be said that a reduction in electron mobility due to the crystal grain boundary is less likely to occur because a clear crystal grain boundary cannot be observed. Moreover, since the crystallinity of an oxide semiconductor might be decreased by entry of impurities, formation of defects, or the like, the CAAC-OS can be regarded as an oxide semiconductor that has small amounts of impurities and defects (oxygen vacancies or the like). Thus, an oxide semiconductor including a CAAC-OS is physically stable. Therefore, the oxide semiconductor including a CAAC-OS is resistant to heat and has high reliability.

The nc-OS has a periodic atomic arrangement in a microscopic region (for example, a region with a size greater than or equal to 1 nm and less than or equal to 10 nm, in particular, a region with a size greater than or equal to 1 nm and less than or equal to 3 nm). In addition, no regularity of crystal orientation is observed between different nanocrystals in the nc-OS. Thus, the orientation is not observed in the whole film. Accordingly, in some cases, the nc-OS cannot be distinguished from an a-like OS or an amorphous oxide semiconductor depending on an analysis method.

The a-like OS is an oxide semiconductor that has a structure between those of the nc-OS and the amorphous oxide semiconductor. The a-like OS has a void or a low-density region. That is, the a-like OS has low crystallinity as compared with the nc-OS and the CAAC-OS.

An oxide semiconductor has various structures with different properties. Two or more kinds among the amorphous oxide semiconductor, the polycrystalline oxide semiconductor, the a-like OS, the nc-OS, and the CAAC-OS may be included in an oxide semiconductor of one embodiment of the present invention.

<Transistor Including Metal Oxide>

Next, the case where the metal oxide is used for a transistor will be described.

Note that when the metal oxide is used for a transistor, the transistor having high field-effect mobility can be obtained. In addition, the transistor having high reliability can be obtained.

Moreover, the carrier density in the region 426a of the metal oxide 406b in the transistor is preferably low. In the case of reducing the carrier density of the metal oxide, the concentration of impurities in the metal oxide is reduced so that the density of defect states is reduced. In this specification and the like, a state with a low impurity concentration and a low density of defect states is referred to as highly purified intrinsic or substantially highly purified intrinsic. For example, the carrier density of the region 426a of the metal oxide 406b is lower than $8\times10^{11}/cm^3$, preferably lower than $1\times10^{11}/cm^3$, further preferably lower than $1\times10^{10}/cm^3$, and higher than or equal to $1\times10^{-9}/cm^3$.

The highly purified intrinsic or substantially highly purified intrinsic metal oxide has a low density of defect states and accordingly has a low density of trap states in some cases.

Electric charge trapped by the trap states in the metal oxide takes a long time to be released and may behave like fixed electric charge. Thus, the transistor whose channel formation region is formed in the oxide semiconductor having a high density of trap states has unstable electrical characteristics in some cases.

In order to stabilize electrical characteristics of the transistor, it is effective to reduce the concentration of impurities in the region 426a of the metal oxide 406b. In addition, in order to reduce the concentration of impurities in the region 426a of the metal oxide 406b, the concentration of impurities in an adjacent film is also preferably reduced. As examples of the impurities, hydrogen, nitrogen, alkali metal, alkaline earth metal, iron, nickel, silicon, and the like are given.

<Impurities>

Here, the influence of each impurity in the metal oxide will be described.

When silicon or carbon that is one of Group 14 elements is contained in the metal oxide, defect states are formed in the metal oxide. Thus, the concentration of silicon or carbon (the concentration measured by SIMS) in the region 426a of the metal oxide 406b is set to be lower than or equal to $2\times10^{18}$ atoms/cm$^3$, preferably lower than or equal to $2\times10^{17}$ atoms/cm$^3$.

When the metal oxide contains an alkali metal or an alkaline earth metal, defect states are formed and carriers are generated, in some cases. Thus, a transistor including a metal oxide that contains an alkali metal or an alkaline earth metal is likely to have normally-on characteristics. Therefore, it is preferable to reduce the concentration of an alkali metal or an alkaline earth metal in the region 426a of the metal oxide 406b. Specifically, the concentration of an alkali metal or an alkaline earth metal in the region 426a of the metal oxide 406b, which is measured by SIMS, is lower than or equal to $1\times10^{18}$ atoms/cm$^3$, preferably lower than or equal to $2\times10^{16}$ atoms/cm$^3$.

Moreover, the metal oxide containing nitrogen easily becomes n-type by generation of electrons serving as carriers and an increase of carrier density. Thus, the transistor containing nitrogen in the region 426a of the metal oxide 406b tends to have normally-on characteristics. For this reason, nitrogen in the region 426a of the metal oxide 406b is preferably reduced as much as possible; for example, the concentration of nitrogen in the region 426a of the metal oxide 406b, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in a metal oxide reacts with oxygen bonded to a metal atom to be water, and thus forms an oxygen vacancy, in some cases. Entry of hydrogen into the oxygen vacancy generates an electron serving as a carrier in some cases. Furthermore, in some cases, bonding of part of hydrogen to oxygen bonded to a metal atom generates an electron serving as a carrier. Thus, the transistor containing much hydrogen in the region 426a of the metal oxide 406b tends to have normally-on characteristics. For this reason, hydrogen in the region 426a of the metal oxide 406b is preferably reduced as much as possible. Specifically, the hydrogen concentration of the metal oxide, which is measured by SIMS, is lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

By reducing impurities in the region 426a of the metal oxide 406b sufficiently, the transistor can have stable electrical characteristics.

<<Transistor 201>>

Next, the details of the transistor 201 illustrated in FIG. 27 will be described.

Figure 31A:
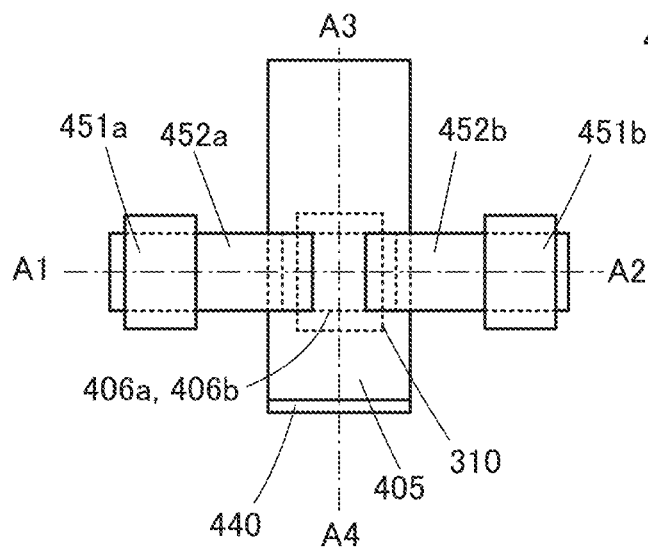
FIG. 31 A top view and cross-sectional views illustrating a structure example of a transistor.
Figure 31C:
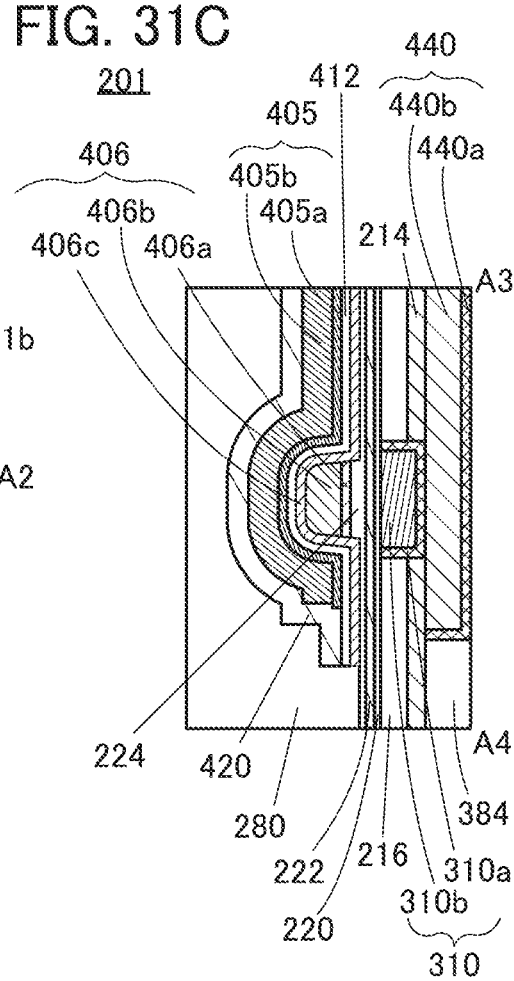
Figure 31B:
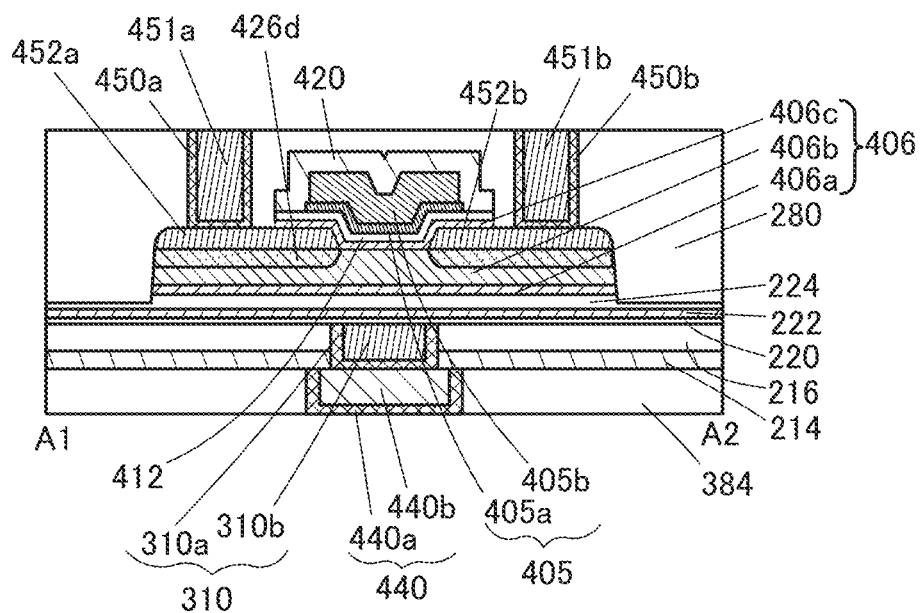

FIG. 31(A) is a top view of the transistor 201. Moreover, FIG. 31(B) is a cross-sectional view of a portion indicated by a dashed-dotted line A1-A2 in FIG. 31(A), and is also a cross-sectional view of the transistor 201 in a channel length direction. Furthermore, FIG. 31(C) is a cross-sectional view of a portion indicated by a dashed-dotted line A3-A4 in FIG. 31(A), and is also a cross-sectional view of the transistor 201 in a channel width direction. In the top view of FIG. 31(A), some components are not illustrated for simplification of the drawing. In addition, the components common to the transistor 201 and the transistor 200 are denoted by the same reference numerals.

As illustrated in FIGS. 31(A), 31(B), and 31(C), the transistor 201 includes the insulator 224 located over a substrate (not illustrated), the metal oxide 406a located over the insulator 224, the metal oxide 406b located in contact with at least part of the top surface of the metal oxide 406a, a conductor 452a and a conductor 452b located in contact with at least part of the top surface of the metal oxide 406b, a metal oxide 406c located in contact with at least part of the top surface of the metal oxide 406b and over the conductor 452a and the conductor 452b, the insulator 412 located over the metal oxide 406c, a conductor 405a located over the insulator 412, a conductor 405b located over the conductor 405a, and an insulator 420 located over the conductor 405b.

A conductor 405 (the conductor 405a and the conductor 405b) can function as a top gate, and the conductor 310 can function as a back gate. The potential of the back gate may be the same as the potential of the top gate, or may be the ground potential or a given potential. Moreover, by changing the potential of the back gate not in synchronization with but independently of the potential of the top gate, the threshold voltage of the transistor can be changed.

The conductor 405a can be provided using a material similar to that for the conductor 404a in FIG. 28. The conductor 405b can be provided using a material similar to that for the conductor 404b in FIG. 28.

The conductor 452a has a function of one of a source electrode and a drain electrode, and the conductor 452b has a function of the other of the source electrode and the drain electrode.

A metal such as aluminum, titanium, chromium, nickel, copper, yttrium, zirconium, molybdenum, silver, tantalum, or tungsten, or an alloy containing the metal selected from these as its main component can be used for each of the conductors 452a and 452b. Although a single-layer structure is illustrated in the drawings, a stacked-layer structure of two or more layers may be used. Furthermore, a transparent conductive material containing indium oxide, tin oxide, or zinc oxide may be used.

In the transistor 201, a channel is preferably formed in the metal oxide 406b. Therefore, for the metal oxide 406c, a material having a higher insulating property than the metal oxide 406b is preferably used. For the metal oxide 406c, a material similar to that for the metal oxide 406a is preferably used.

By providing the metal oxide 406c for the transistor 201, the transistor 201 can be a buried-channel transistor. Moreover, oxidation of end portions of the conductor 452a and the conductor 452b can be prevented. Furthermore, a leakage current between the conductor 405 and the conductor 452a (or the conductor 405 and the conductor 452b) can be prevented. Note that the metal oxide 406c may be omitted depending on the case.

In addition, the metal oxide 406b includes regions 426d. As illustrated in FIG. 31(B), the regions 426d are positioned in regions where the metal oxide 406b is in contact with the conductor 452a and the conductor 452b. The regions 426d are formed because of damage caused when the conductor 452a and the conductor 452b are deposited and the addition of an impurity such as nitrogen contained in the deposition atmosphere. Therefore, an oxygen vacancy is formed because of the added impurity element and the impurity element enters the oxygen vacancy, thereby increasing the carrier density and reducing resistance in the regions 426d of the metal oxide 406b. Note that in some cases, the regions 426d are formed only at the interface of the metal oxide 406b depending on the deposition conditions of the conductor 452a and the conductor 452b.

For the insulator 420, an insulating material having a function of inhibiting the passage of oxygen and impurities such as water or hydrogen is preferably used. For example, for the insulator 420, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride may be used.

Provision of the insulator 420 in the transistor 201 can prevent oxidation of the conductor 405. Furthermore, impurities such as water or hydrogen can be prevented from entering the metal oxide 406.

The transistor 201 can have a larger contact area between the metal oxide 406b and the electrode (the source electrode or the drain electrode) than the transistor 200. Furthermore, a step for forming the region 426b and the region 426c illustrated in FIG. 28 is not necessary. Thus, the transistor 201 can have a larger on-state current than the transistor 200. In addition, the manufacturing process can be simplified.

For the details of the other components of the transistor 201, the description of the transistor 200 can be referred to.

Note that this embodiment can be combined with the other embodiment described in this specification as appropriate.

Embodiment 6

In this embodiment, an example of the imaging device of one embodiment of the present invention will be described with reference to drawings.

Figure 32A:
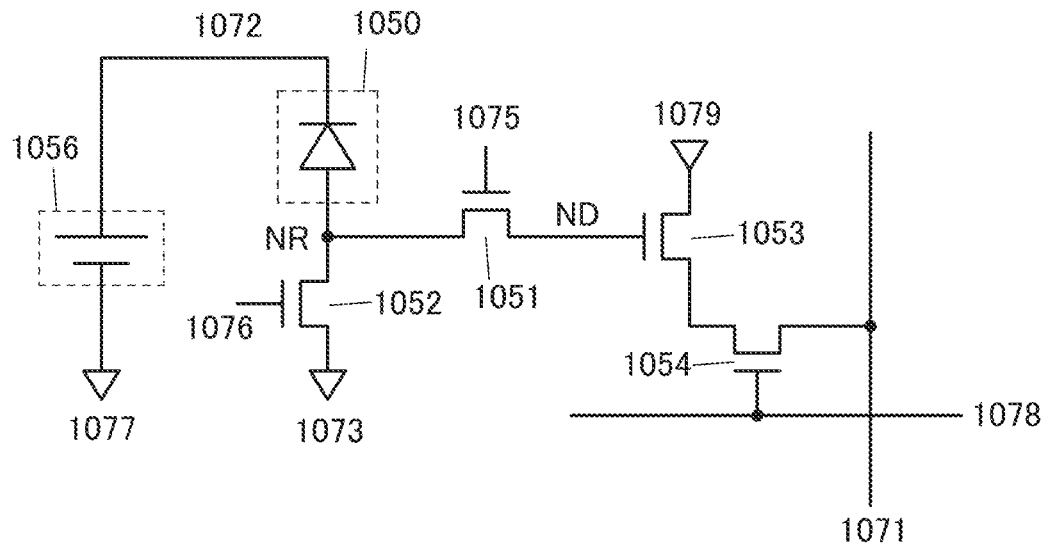
FIG. 32 A diagram illustrating a pixel circuit and a timing chart showing imaging operation.

FIG. 32(A) is a diagram illustrating a pixel circuit of the imaging device. The pixel circuit includes a photoelectric conversion element 1050, a transistor 1051, a transistor 1052, a transistor 1053, and a transistor 1054.

One electrode (anode) of the photoelectric conversion element 1050 is electrically connected to one of a source and a drain of the transistor 1051. One electrode of the photoelectric conversion element 1050 is electrically connected to one of a source and a drain of the transistor 1052. The other of the source and the drain of the transistor 1051 is electrically connected to a gate of the transistor 1053. One of a source and a drain of the transistor 1053 is electrically connected to one of a source and a drain of the transistor 1054. Note that a capacitor electrically connected to the gate of the transistor 1053 may be provided.

The other electrode (cathode) of the photoelectric conversion element 1050 is electrically connected to a wiring 1072. A gate of the transistor 1051 is electrically connected to a wiring 1075. The other of the source and the drain of the transistor 1053 is electrically connected to a wiring 1079. A gate of the transistor 1052 is electrically connected to a wiring 1076. The other of the source and the drain of the transistor 1052 is electrically connected to a wiring 1073. The other of the source and the drain of the transistor 1054 is electrically connected to a wiring 1071. A gate of the transistor 1054 is electrically connected to a wiring 1078. The wiring 1072 is electrically connected to one terminal of a power source 1056, and the other terminal of the power source 1056 is electrically connected to a wiring 1077.

Here, the wiring 1071 can have a function of an output line that outputs a signal from a pixel. The wiring 1073, the wiring 1077, and the wiring 1079 can have functions of power supply lines. For example, the wiring 1073 and the wiring 1077 can function as low potential power supply lines, and the wiring 1079 can function as a high potential power supply line. The wiring 1075, the wiring 1076, and the wiring 1078 can function as signal lines that control the on/off of the respective transistors.

To increase light detection sensitivity in low illuminance, it is preferable to use a photoelectric conversion element that causes an avalanche multiplication effect as the photoelectric conversion element 1050. To cause the avalanche multiplication effect, a relatively high potential HVDD is needed. Thus, the power source 1056 has a function of being capable of supplying the potential HVDD, and the potential HVDD is supplied to the other electrode of the photoelectric conversion element 1050 through the wiring 1072. Note that the photoelectric conversion element 1050 can be used by applying a potential that does not cause the avalanche multiplication effect.

The transistor 1051 can have a function of transferring the potential of a charge accumulation portion (NR) that changes in response to the output of the photoelectric conversion element 1050 to a charge detection portion (ND). The transistor 1052 can have a function of initializing the potentials of the charge accumulation portion (NR) and the charge detection portion (ND). The transistor 1053 can have a function of outputting a signal corresponding to the potential of the charge detection portion (ND). The transistor 1054 can have a function of selecting a pixel from which a signal is read.

In the case where high voltage is applied to the other electrode of the photoelectric conversion element 1050, a high withstand voltage transistor that can withstand high voltage needs to be used as the transistor connected to the photoelectric conversion element 1050. As the high withstand voltage transistor, for example, an OS transistor or the like can be used. Specifically, OS transistors are preferably applied to the transistor 1051 and the transistor 1052.

Although the transistor 1051 and the transistor 1052 are desired to have excellent switching characteristics, the transistor 1053 is desired to have excellent amplifying characteristics; thus, a transistor with high on-state current is preferably used. Therefore, a transistor using silicon in an active layer or an active region (hereinafter referred to as a Si transistor) is preferably applied to the transistor 1053 and the transistor 1054.

When the transistor 1051 to the transistor 1054 have the above structures, it is possible to fabricate an imaging device that has high light detection sensitivity in low illuminance and can output a signal with little noise. Owing to the high light detection sensitivity, light capturing time can be shortened and imaging can be performed at high speed.

Note that the structure is not limited to the above; an OS transistor may be applied to the transistor 1053 and the transistor 1054. Alternatively, a Si transistor may be applied to the transistor 1051 and the transistor 1052. In either case, imaging operation of the pixel circuit is possible.

Figure 32B:
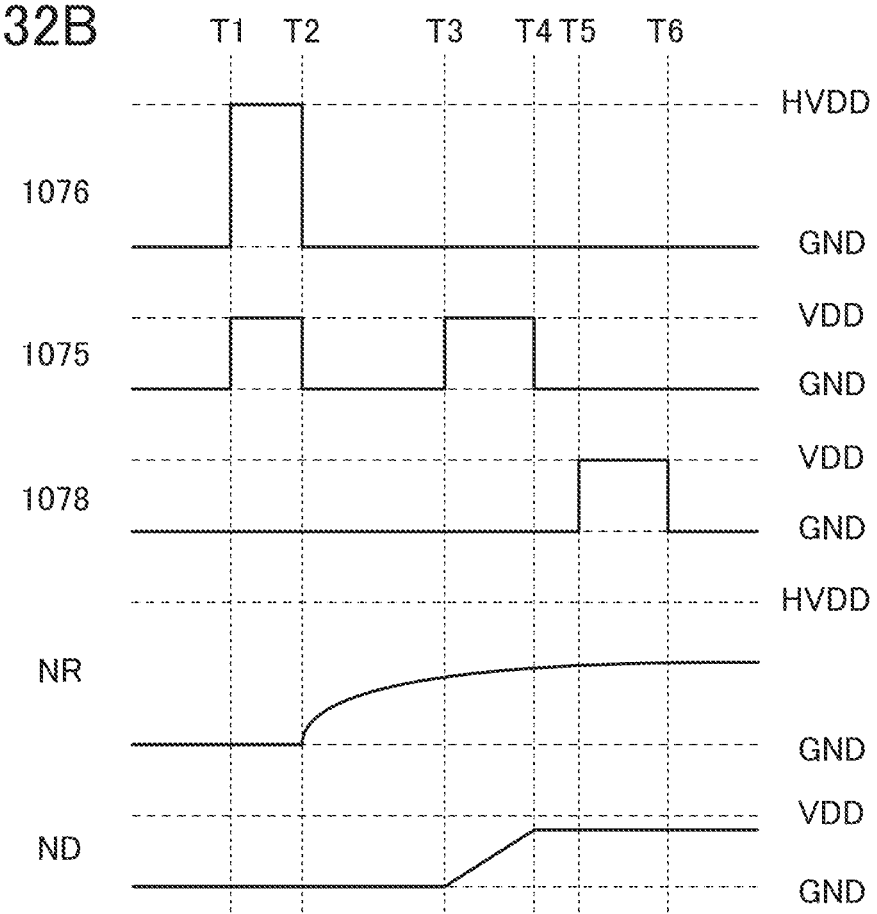

Next, operation of a pixel is described with reference to a timing chart in FIG. 32(B). Note that in an operation example described below, potentials HVDD and GND are supplied to the wiring 1076 connected to the gate of the transistor 1052 as "H" and "L," respectively. Potentials VDD and GND are supplied to the wiring 1075 connected to the gate of the transistor 1051 and the wiring 1078 connected to the gate of the transistor 1054 as "H" and "L," respectively. Furthermore, a potential VDD is supplied to the wiring 1079 connected to the source of the transistor 1053. Note that an embodiment can be employed in which potentials other than the above are supplied to the wirings.

In a period from Time T1 to Time T2, the wiring 1076 is set at "H" and the wiring 1075 is set at "H," and the potentials of the charge accumulation portion (NR) and the charge detection portion (ND) are each set to a reset potential (GND) (reset operation). Note that in reset operation, the potential VDD may be supplied to the wiring 1076 as "H."

In a period from Time T2 to Time T3, the wiring 1076 is set at "L" and the wiring 1075 is set at "L," whereby the potential of the charge accumulation portion (NR) changes (accumulation operation). The potential of the charge accumulation portion (NR) is changed from GND up to HVDD depending on the intensity of light that enters the photoelectric conversion element 1050.

In a period from Time T3 to Time T4, the wiring 1075 is set at "H," and charge in the charge accumulation portion (NR) is transferred to the charge detection portion (ND) (transfer operation).

In a period from Time T4 to Time T5, the wiring 1076 is set at "L" and the wiring 1075 is set at "L" to terminate the transfer operation. At this time, the potential of the charge detection portion (ND) is determined.

In a period from Times T5 to T6, the wiring 1076 is set at "L," the wiring 1075 is set at "L," and the wiring 1078 is set at "H," and a signal corresponding to the potential of the charge detection portion (ND) is output to the wiring 1071. In other words, an output signal corresponding to the intensity of light that enters the photoelectric conversion element 1050 in the accumulation operation can be obtained.

Figure 33A:
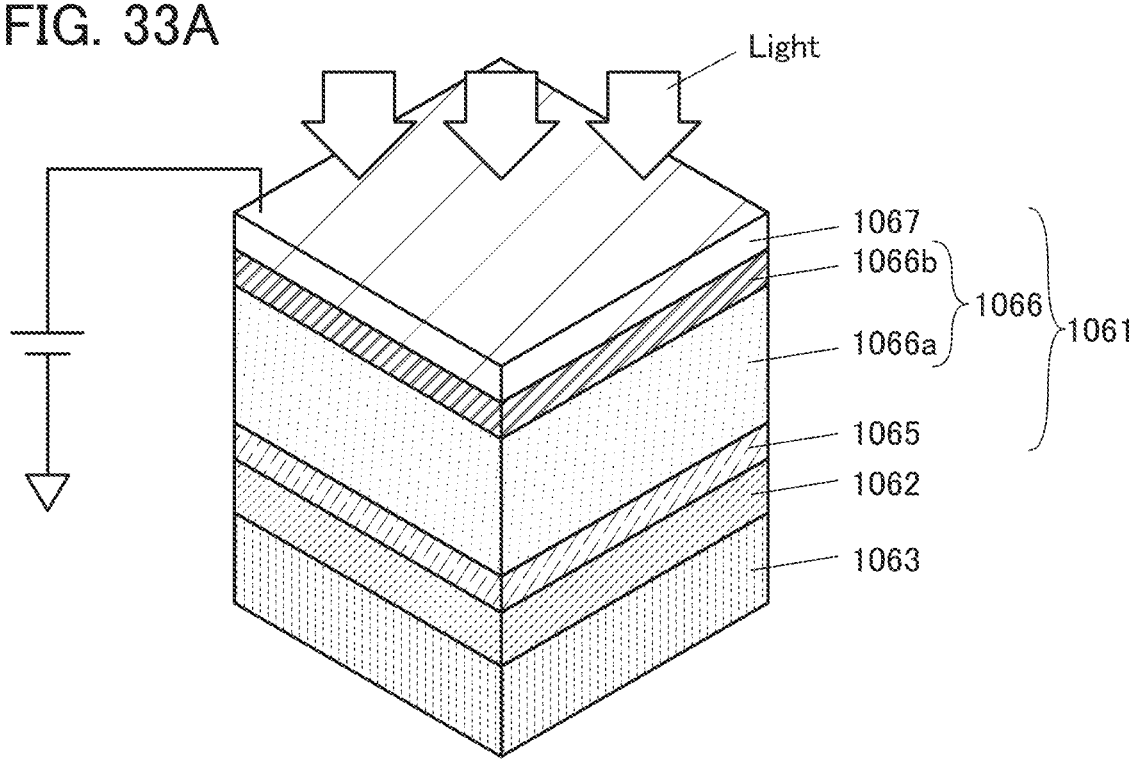
FIG. 33 A diagram illustrating a structure of a pixel in an imaging device and a block diagram of the imaging device.

FIG. 33(A) illustrates a structure example of a pixel of an imaging device including the above-described pixel circuit. The pixel can have a structure in which a layer 1061, a layer 1062, and a layer 1063 are included and a region where the layers overlap with one another is included.

The layer 1061 includes the components of the photoelectric conversion element 1050. The photoelectric conversion element 1050 includes an electrode 1065 corresponding to a pixel electrode, a photoelectric conversion portion 1066, and an electrode 1067 corresponding to a common electrode.

A low-resistance metal layer or the like is preferably used for the electrode 1065. For the metal layer, for example, a metal such as aluminum, titanium, tungsten, tantalum, or silver, or a stacked layer of a plurality of kinds of metal selected from these can be used.

A conductive layer having a high light-transmitting property with respect to visible light (Light) is preferably used for the electrode 1067. For example, an indium oxide, a tin oxide, a zinc oxide, an indium tin oxide, a gallium zinc oxide, an indium gallium zinc oxide, graphene, or the like can be used for the conductive layer. Note that a structure in which the electrode 1067 is omitted can be employed.

A pn-junction photodiode or the like containing a selenium-based material in a photoelectric conversion layer can be used for the photoelectric conversion portion 1066, for example. A selenium-based material, which is a p-type semiconductor, is preferably used for a layer 1066a, and a gallium oxide or the like, which is an n-type semiconductor, is preferably used for a layer 1066b.

A photoelectric conversion element containing a selenium-based material has characteristics of high external quantum efficiency with respect to visible light. The photoelectric conversion element can be a highly sensitive sensor in which electrons are greatly amplified with respect to the amount of incident light by utilizing the avalanche multiplication effect. A selenium-based material has a high light-absorption coefficient and thus has advantages in production; for example, a photoelectric conversion layer can be formed using a thin film. A thin film of a selenium-based material can be formed by a vacuum evaporation method, a sputtering method, or the like.

As a selenium-based material, crystalline selenium such as single crystal selenium or polycrystalline selenium, amorphous selenium, a compound of copper, indium, and selenium (CIS), a compound of copper, indium, gallium, and selenium (CIGS), or the like can be used.

An n-type semiconductor is preferably formed using a material with a wide band gap and a light-transmitting property with respect to visible light. For example, a zinc oxide, a gallium oxide, an indium oxide, a tin oxide, or a mixed oxide thereof can be used. In addition, these materials have a function of a hole injection blocking layer, so that a dark current can be decreased.

Note that the layer 1061 is not limited to the above structure; a pn-junction photodiode may be employed in which one of a p-type silicon semiconductor and an n-type silicon semiconductor is used for the layer 1066a and the other of a p-type silicon semiconductor and an n-type silicon semiconductor is used for the layer 1066b. Alternatively, a pin-junction photodiode may be employed in which an i-type silicon semiconductor layer is provided between the layer 1066a and the layer 1066b.

The pn-junction photodiode or the pin-junction photodiode can be formed using single crystal silicon. In that case, electrical bonding between the layer 1061 and the layer 1062 is preferably obtained through a bonding process. The pin-junction photodiode can be formed using a thin film of amorphous silicon, microcrystalline silicon, polycrystalline silicon, or the like.

The layer 1062 can be, for example, a layer including OS transistors (the transistor 1051 and the transistor 1052). In the circuit configuration of the pixel illustrated in FIG. 32(A), the potential of the charge detection portion (ND) becomes low when the intensity of light entering the photoelectric conversion element 1050 is low. Since the OS transistor has extremely low off-state current, current corresponding to a gate potential can be accurately output even when the gate potential is extremely low. Thus, it is possible to widen the range of illuminance that can be detected, i.e., a dynamic range.

A period during which charge can be held at the charge detection portion (ND) and the charge accumulation portion (NR) can be extremely long owing to the low off-state current characteristics of the transistor 1051 and the transistor 1052. Therefore, a global shutter system in which charge accumulation operation is performed in all the pixels at the same time can be employed without a complicated circuit configuration and operation method.

The layer 1063 can be a support substrate or a layer including Si transistors (the transistor 1053 and the transistor 1054). The Si transistor can have a structure in which a single-crystal silicon substrate has an active region or a structure in which a crystalline silicon active layer is provided on an insulating surface. In the case where a single-crystal silicon substrate is used as the layer 1063, a pn-junction photodiode or a pin-junction diode may be formed in the single-crystal silicon substrate. In this case, the layer 1061 can be omitted.

Figure 33B:
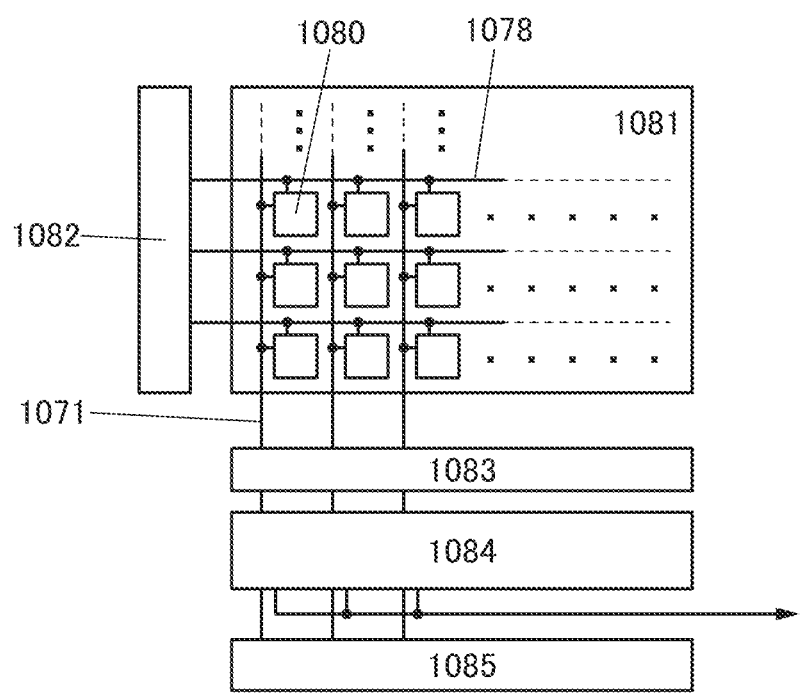

FIG. 33(B) is a block diagram illustrating a circuit configuration of the imaging device of one embodiment of the present invention. The imaging device includes a pixel array 1081 including pixels 1080 arranged in a matrix, a circuit 1082 (row driver) having a function of selecting a row of the pixel array 1081, a circuit 1083 (CDS circuit) for performing correlated double sampling on an output signal of the pixel 1080, a circuit 1084 (e.g., A/D converter circuit) having a function of converting analog data output from the circuit 1083 to digital data, and a circuit 1085 (column driver) having a function of selecting and reading data converted in the circuit 1084. Note that a configuration in which the circuit 1083 is not provided can be employed.

For example, components of the pixel array 1081 except the photoelectric conversion element can be provided in the layer 1062 illustrated in FIG. 33(A). Components such as the circuit 1082 to the circuit 1085 can be provided in the layer 1063. These circuits can be formed of CMOS circuits using silicon transistors.

With this structure, transistors suitable for their respective circuits can be used, and the area of the imaging device can be made small.

Figure 34A:
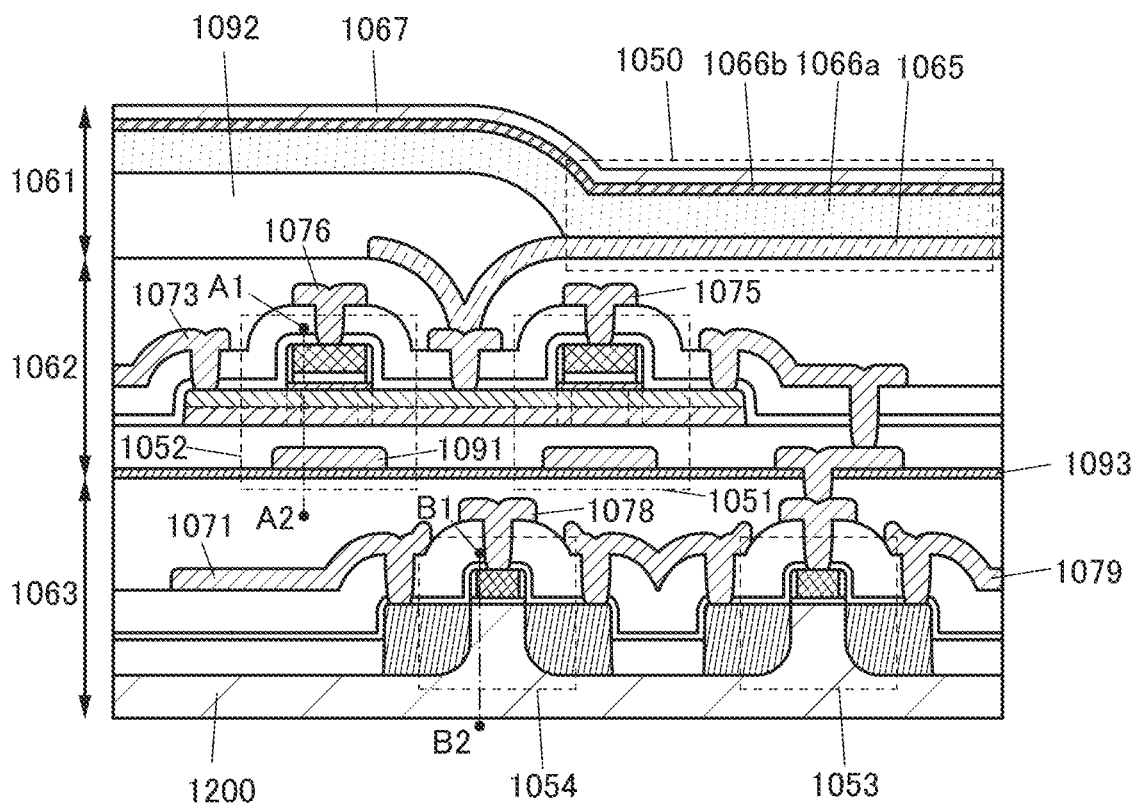
FIG. 34 Cross-sectional views illustrating a structure of an imaging device.
Figure 34B:
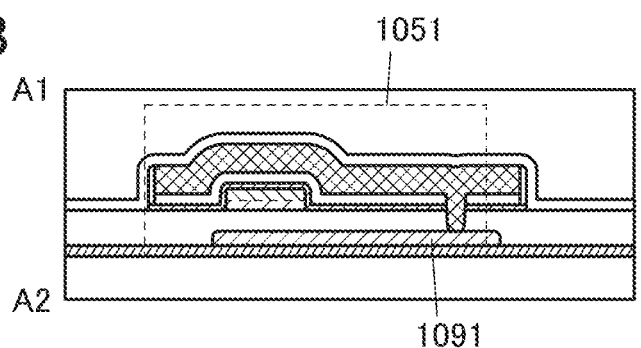
Figure 34C:
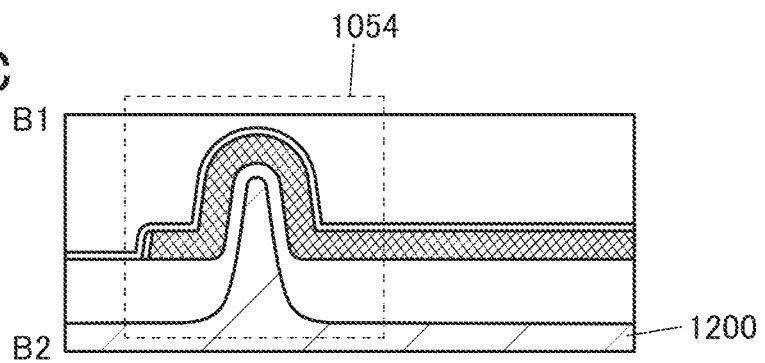

FIGS. 34(A), 34(B), and 34(C) are diagrams illustrating a specific structure of the imaging device illustrated in FIG. 33(A). FIG. 34(A) is a cross-sectional view of the transistors 1051, 1052, 1053, and 1054 in the channel length direction. FIG. 34(B) is a cross-sectional view taken along dashed-dotted line A1-A2, illustrating a cross section of the transistor 1052 in the channel width direction. FIG. 34(C) is a cross-sectional view taken along dashed-dotted line B1-B2, illustrating a cross section of the transistor 1054 in the channel width direction.

The imaging device can be a stacked layer of the layer 1061 to the layer 1063. The layer 1061 can have a structure including a partition wall 1092 in addition to the photoelectric conversion element 1050 including a selenium layer. The partition wall 1092 is provided so as to cover a step due to the electrode 1065. The selenium layer used for the photoelectric conversion element 1050 has high resistance and has a structure not being divided between pixels.

The transistors 1051 and 1052, which are OS transistors, are provided in the layer 1062. Although the structure in which both the transistors 1051 and 1052 have a back gate 1091 is illustrated, an embodiment may be employed in which either of the transistors includes the back gate. As illustrated in FIG. 34(B), the back gate 1091 might be electrically connected to a front gate of the transistor, which is provided to face the back gate. Alternatively, a structure may be employed in which a fixed potential that is different from that for the front gate can be supplied to the back gate 1091.

Figure 35A:
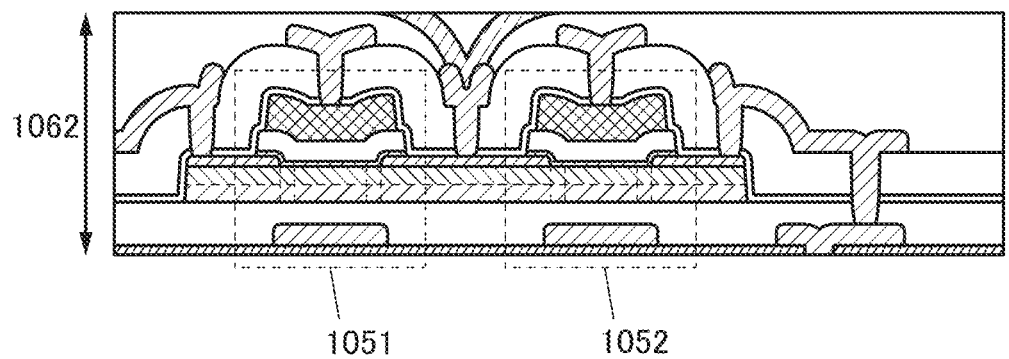
FIG. 35 Cross-sectional views illustrating structures of imaging devices.

Although FIG. 34(A) illustrates an example in which an OS transistor is a self-aligned top-gate transistor, a non-self-aligned transistor may be used as illustrated in FIG. 35(A).

Figure 35B:
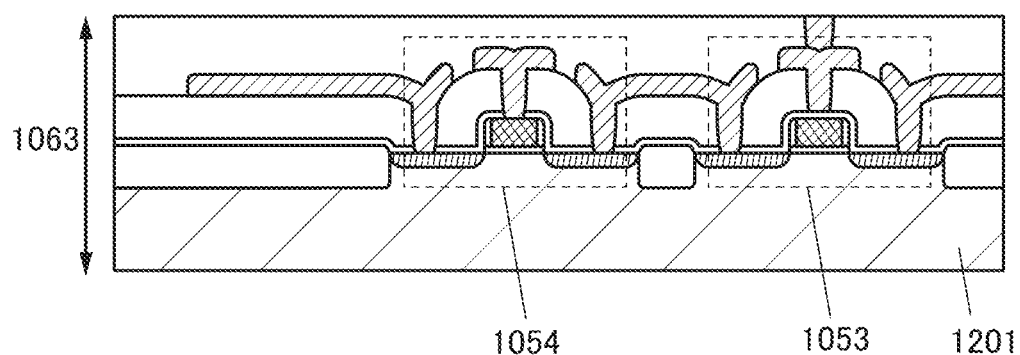
Figure 35C:
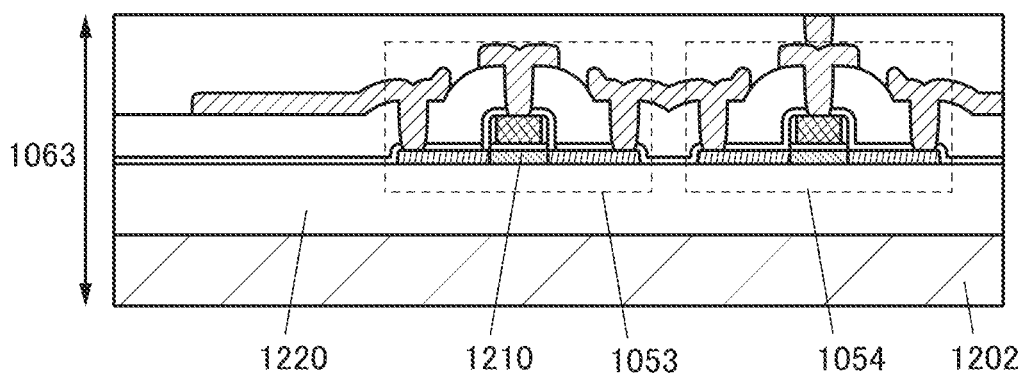

The transistor 1053 and the transistor 1054, which are Si transistors, are provided in the layer 1063. Although FIG. 34(A) illustrates, as an example, a structure in which the Si transistor includes a fin-type semiconductor layer provided in a silicon substrate 1200, a planar type including an active region in a silicon substrate 1201 may be used as illustrated in FIG. 35(B). Alternatively, as illustrated in FIG. 35(C), transistors each including a semiconductor layer 1210 of a silicon thin film may be used. The semiconductor layer 1210 can be, for example, single crystal silicon formed over an insulating layer 1220 over a silicon substrate 1202 (SOI (Silicon on Insulator)). Alternatively, polycrystalline silicon formed on an insulating surface of a glass substrate or the like may be used. In addition, a circuit for driving a pixel can be provided in the layer 1063.

An insulating layer 1093 that has a function of inhibiting diffusion of hydrogen is provided between a region where OS transistors are formed and a region where Si transistors are formed. Dangling bonds of silicon are terminated with hydrogen in insulating layers provided in the vicinities of the active regions of the transistors 1053 and 1054. Meanwhile, hydrogen in the insulating layers provided in the vicinity of oxide semiconductor layers, which are the active layers of the transistors 1051 and 1052, is one factor of generation of carriers in the oxide semiconductor layers.

Hydrogen is confined in one layer by the insulating layer 1093, so that the reliability of the transistors 1053 and 1054 can be improved. Furthermore, diffusion of hydrogen from one layer to the other layer is inhibited, so that the reliability of the transistors 1051 and 1052 can also be improved.

For the insulating layer 1093, for example, aluminum oxide, aluminum oxynitride, gallium oxide, gallium oxynitride, yttrium oxide, yttrium oxynitride, hafnium oxide, hafnium oxynitride, yttria-stabilized zirconia (YSZ), or the like can be used.

Figure 36A:
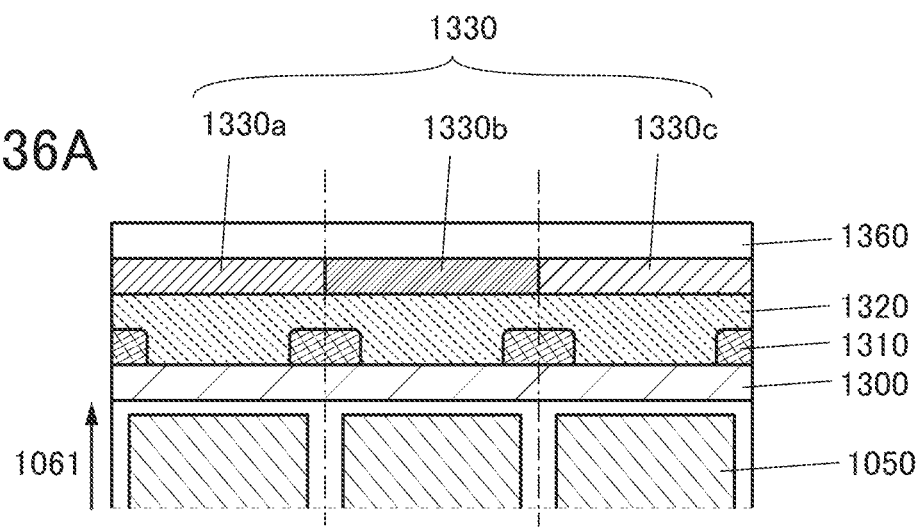
FIG. 36 Cross-sectional views illustrating structures of imaging devices.

FIG. 36(A) is a cross-sectional view illustrating an example in which a color filter and the like are added to the imaging device of one embodiment of the present invention. The cross-sectional view illustrates part of a region including pixel circuits for three pixels. An insulating layer 1300 is formed over the layer 1061 where the photoelectric conversion element 1050 is formed. As the insulating layer 1300, for example, a silicon oxide film with a high visible-light transmitting property can be used. In addition, a silicon nitride film may be stacked as a passivation film. Furthermore, a dielectric film of hafnium oxide or the like may be stacked as an anti-reflection film.

A light-blocking layer 1310 may be formed over the insulating layer 1300. The light-blocking layer 1310 has a function of inhibiting color mixing of light passing through the upper color filter. As the light-blocking layer 1310, a metal layer of aluminum, tungsten, or the like can be used. The metal layer and a dielectric film having a function of an anti-reflection film may be stacked.

An organic resin layer 1320 can be provided as a planarization film over the insulating layer 1300 and the light-blocking layer 1310. A color filter 1330 (a color filter 1330*a*, a color filter 1330*b*, or a color filter 1330*c*) is formed in each pixel. For example, the color filter 1330*a*, the color filter 1330*b*, and the color filter 1330*c* each have a color of R (red), G (green), B (blue), Y (yellow), C (cyan), M (magenta), or the like, so that a color image can be obtained.

An insulating layer 1360 having a light-transmitting property with respect to visible light can be provided over the color filter 1330, for example.

Figure 36B:
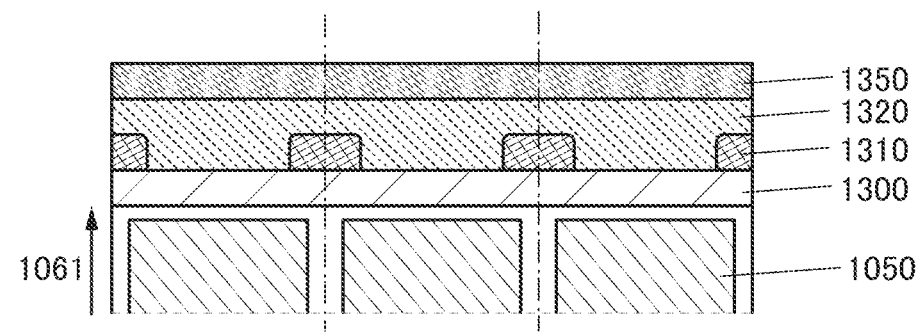

As illustrated in FIG. 36(B), an optical conversion layer 1350 may be used instead of the color filter 1330. Such a structure enables the imaging device to obtain images in various wavelength regions.

For example, when a filter that blocks light having a wavelength shorter than or equal to that of visible light is used as the optical conversion layer 1350, an infrared imaging device can be obtained. When a filter that blocks light having a wavelength shorter than or equal to that of near infrared light is used as the optical conversion layer 1350, a far-infrared imaging device can be obtained. When a filter that blocks light having a wavelength longer than or equal to that of visible light is used as the optical conversion layer 1350, an ultraviolet imaging device can be obtained.

Furthermore, when a scintillator is used as the optical conversion layer 1350, an imaging device that obtains an image visualizing the intensity of radiation, which is used for an X-ray imaging device or the like, can be obtained. Radiation such as X-rays passes through an object and enters the scintillator, and then is converted into light (fluorescence) such as visible light or ultraviolet light owing to a photoluminescence phenomenon. Then, the photoelectric conversion element 1050 detects the light to obtain image data. Furthermore, the imaging device having this structure may be used in a radiation detector or the like.

A scintillator contains a substance that, when irradiated with radiation such as X-rays or gamma-rays, absorbs energy of the radiation to emit visible light or ultraviolet light. For example, a resin or ceramics in which $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, ZnO, or the like is dispersed can be used.

In the photoelectric conversion element 1050 containing a selenium-based material, radiation such as X-rays can be directly converted into charge; thus, a structure that does not require a scintillator can be employed.

Figure 36C:
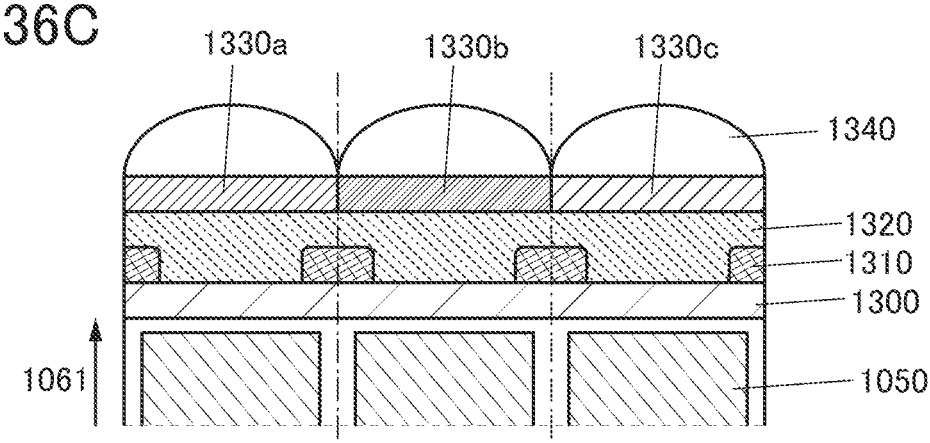

As illustrated in FIG. 36(C), a microlens array 1340 may be provided over the color filter 1330*a*, the color filter 1330*b*, and the color filter 1330*c*. Light passing through lenses included in the microlens array 1340 goes through the color filters positioned thereunder to enter the photoelectric conversion element 1050. The microlens array 1340 may be provided over the optical conversion layer 1350 illustrated in FIG. 36(B).

Examples of a package and a camera module in each of which an image sensor chip is placed will be described below. For the image sensor chip, the structure of the above imaging device can be used.

FIG. 37(A1) is an external perspective view of the top surface side of a package in which an image sensor chip is placed. The package includes a package substrate 1410 to which an image sensor chip 1450 (illustrated in FIG. 37(A3)) is fixed, a cover glass 1420, an adhesive 1430 for bonding them, and the like.

FIG. 37(A2) is an external perspective view of the bottom surface side of the package. A BGA (Ball grid array) structure in which solder balls are used as bumps 1440 on the bottom surface of the package is employed. Note that, without being limited to the BGA, an LGA (Land grid array), a PGA (Pin Grid Array), or the like may be employed.

FIG. 37(A3) is a perspective view of the package, in which parts of the cover glass 1420 and the adhesive 1430 are not illustrated. Electrode pads 1460 are formed over the package substrate 1410, and the electrode pads 1460 and the bumps 1440 are electrically connected to each other via through-holes. The electrode pads 1460 are electrically connected to the image sensor chip 1450 through wires 1470.

FIG. 37(B1) is an external perspective view of the top surface side of a camera module in which an image sensor chip is placed in a package with a built-in lens. The camera module includes a package substrate 1411 to which an image sensor chip 1451 (illustrated in FIG. 37(B3)) is fixed, a lens cover 1421, a lens 1435, and the like. Furthermore, an IC chip 1490 having a function of a driver circuit, a signal conversion circuit, or the like of an imaging device is provided between the package substrate 1411 and the image sensor chip 1451; thus, the structure as an SiP (System in package) is formed.

FIG. 37(B2) is an external perspective view of the bottom surface side of the camera module. A QFN (Quad flat no-lead package) structure in which lands 1441 for mounting are provided on the bottom surface and side surfaces of the package substrate 1411 is employed. Note that this structure is only an example, and a QFP (Quad flat package), the above-mentioned BGA, or the like may also be employed.

FIG. 37(B3) is a perspective view of the module, in which parts of the lens cover 1421 and the lens 1435 are not illustrated. The lands 1441 are electrically connected to electrode pads 1461, and the electrode pads 1461 are electrically connected to the image sensor chip 1451 or the IC chip 1490 through wires 1471.

The image sensor chip placed in a package having the above form can be easily mounted on a printed substrate or the like, and the image sensor chip can be incorporated into a variety of semiconductor devices and electronic devices.

Note that this embodiment can be combined with the other embodiment described in this specification as appropriate.

Embodiment 7

As electronic devices that can include an imaging device of one embodiment of the present invention, display devices, personal computers, image memory devices or image reproducing devices provided with storage media, mobile phones, game machines including portable game machines, portable data terminals, e-book readers, cameras such as video cameras and digital still cameras, goggle-type displays (head mounted displays), navigation systems, audio reproducing devices (car audio players, digital audio players, and the like), copiers, facsimiles, printers, multifunction printers, automated teller machines (ATM), vending machines, and the like are given. Specific examples of these electronic devices are illustrated in FIG. 38.

Figure 38A:
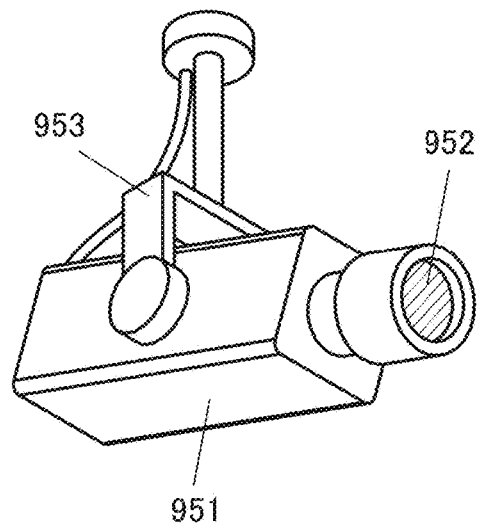
FIG. 38 Diagrams illustrating structure examples of electronic devices.

FIG. 38(A) is a surveillance camera, which includes a housing 951, a lens 952, a support portion 953, and the like. The imaging device of one embodiment of the present invention can be included, as a component for obtaining an image, in the surveillance camera. Note that a surveillance camera is a name in common use and does not limit the use thereof. A device that has a function of a surveillance camera can also be called a camera or a video camera, for example.

Figure 38B:
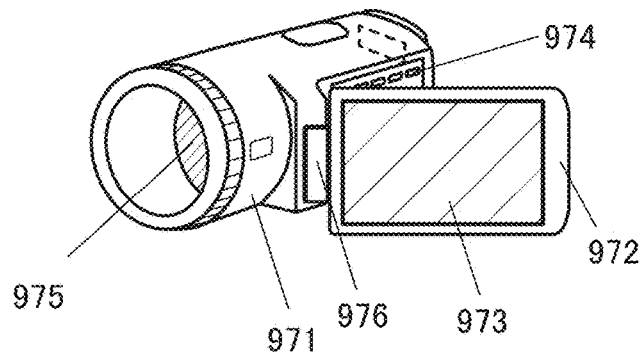

FIG. 38(B) is a video camera, which includes a first housing 971, a second housing 972, a display portion 973, an operation key 974, a lens 975, a connection portion 976, and the like. The operation key 974 and the lens 975 are provided on the first housing 971, and the display portion 973 is provided on the second housing 972. The imaging device of one embodiment of the present invention can be included, as a component for obtaining an image, in the video camera.

Figure 38C:
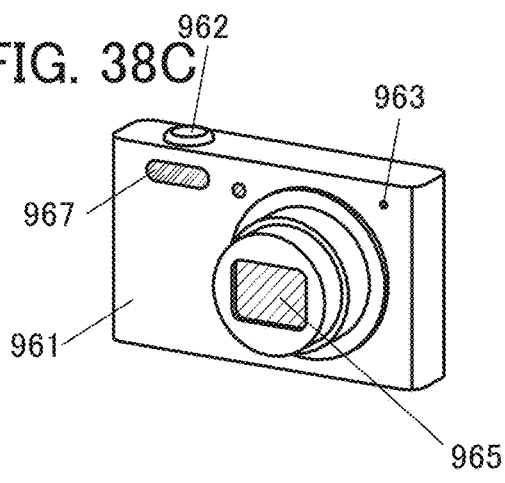

FIG. 38(C) is a digital camera, which includes a housing 961, a shutter button 962, a microphone 963, a light-emitting portion 967, a lens 965, and the like. The imaging device of one embodiment of the present invention can be included, as a component for obtaining an image, in the digital camera.

Figure 38D:
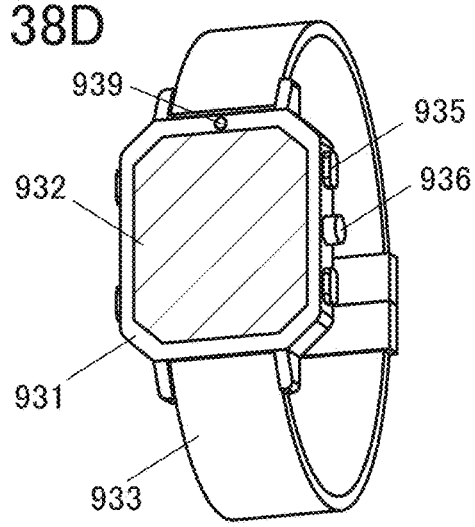

FIG. 38(D) is a wrist-watch-type information terminal, which includes a housing 931, a display portion 932, a wristband 933, an operation button 935, a crown 936, a camera 939, and the like. The display portion 932 may be a touch panel. The imaging device of one embodiment of the present invention can be included, as a component for obtaining an image, in the information terminal.

Figure 38E:
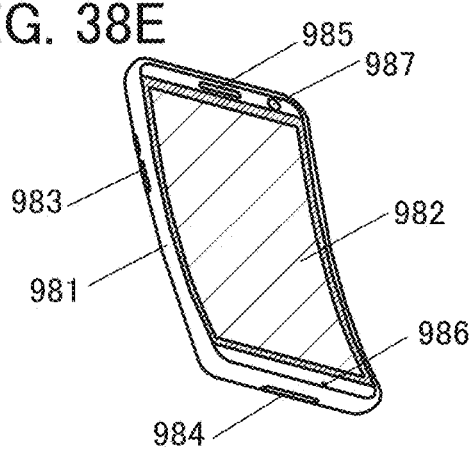

FIG. 38(E) is an example of a mobile phone, which includes a housing 981, a display portion 982, an operation button 983, an external connection port 984, a speaker 985, a microphone 986, a camera 987, and the like. The display portion 982 of the mobile phone includes a touch sensor. A variety of operations such as making a call and inputting text can be performed by touch on the display portion 982 with a finger, a stylus, or the like. The imaging device of one embodiment of the present invention can be included, as a component for obtaining an image, in the mobile phone.

Figure 38F:
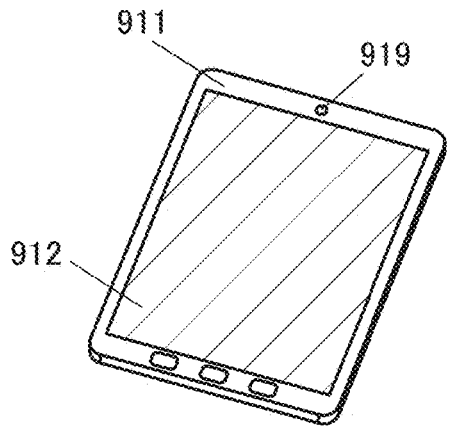

FIG. 38(F) is a portable data terminal, which includes a housing 911, a display portion 912, a camera 919, and the like. A touch panel function of the display portion 912 enables input and output of information. The imaging device of one embodiment of the present invention can be included, as a component for obtaining an image, in the portable data terminal.

In this specification and the like, a display element, a display device which is a device including a display element, a light-emitting element, and a light-emitting device which is a device including a light-emitting element can employ various modes or can include various elements. The display element, the display device, the light-emitting element, or the light-emitting device includes, for example, at least one of an EL (electroluminescence) element (an EL element including an organic material and an inorganic material, an organic EL element, or an inorganic EL element), an LED chip (e.g., a white LED chip, a red LED chip, a green LED chip, or a blue LED chip), a transistor (a transistor that emits light depending on a current), a plasma display panel (PDP), an electron emitter, a display element including a carbon nanotube, a liquid crystal element, electronic ink, an electrowetting element, an electrophoretic element, a display element using MEMS (micro electro mechanical systems) (e.g., a grating light valve (GLV), a digital micromirror device (DMD), a DMS (digital micro shutter), MIRASOL (registered trademark), an IMOD (interferometric modulation) element, a MEMS shutter display element, an opticalinterference-type MEMS display element, or a piezoelectric ceramic display), quantum dots, and the like. Other than the above, the display element, the display device, the light-emitting element, or the light-emitting device may include a display medium whose contrast, luminance, reflectivity, transmittance, or the like changes by an electrical or magnetic effect. Examples of a display device including an EL element include an EL display and the like. Examples of a display device including an electron emitter include a field emission display (FED), an SED-type flat panel display (SED: Surface-conduction Electron-emitter Display), and the like. Examples of a display device including a liquid crystal element include a liquid crystal display (a transmissive liquid crystal display, a transflective liquid crystal display, a reflective liquid crystal display, a direct-view liquid crystal display, or a projection liquid crystal display) and the like. Examples of a display device including electronic ink, electronic liquid powder (registered trademark), or an electrophoretic element include electronic paper and the like. Examples of a display device using quantum dots in each pixel include a quantum dot display and the like. Note that quantum dots may be provided not as display elements but as part of a backlight. The use of quantum dots enables display with high color purity. Note that in the case of achieving a transflective liquid crystal display or a reflective liquid crystal display, some or all of pixel electrodes function as reflective electrodes. For example, some or all of pixel electrodes contain aluminum, silver, or the like. Moreover, in such a case, a memory circuit such as an SRAM can be provided under the reflective electrodes. Thus, the power consumption can be further reduced. Note that in the case where an LED chip is used, graphene or graphite may be provided under an electrode or a nitride semiconductor of the LED chip. Graphene or graphite may be a multilayer film in which a plurality of layers are stacked. Providing graphene or graphite as described above facilitates deposition of a nitride semiconductor, such as an n-type GaN semiconductor layer containing crystals, thereover. Furthermore, a p-type GaN semiconductor layer containing crystals or the like can be provided thereover to form the LED chip. Note that an AlN layer may be provided between graphene or graphite and the n-type GaN semiconductor layer containing crystals. The GaN semiconductor layer included in the LED chip may be formed by MOCVD. Note that when graphene is provided, the GaN semiconductor layer included in the LED chip can be deposited by a sputtering method. As for a display element including microelectromechanical systems (MEMS), a drying agent may be provided in a space where the display element is sealed (e.g., space between an element substrate over which the display element is provided and a counter substrate provided to face the element substrate). Providing a drying agent can prevent MEMS or the like from becoming difficult to move or deteriorating easily because of moisture.

Note that this embodiment can be combined with the other embodiment described in this specification as appropriate.

(Notes on the Description in this Specification and the Like)

The following are notes on the description of the structures in the above embodiments.

<Notes on one Embodiment of the Present Invention Described in Embodiments>

One embodiment of the present invention can be constituted by appropriately combining the structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments.

Note that in each embodiment, a content described in the embodiment is a content described with reference to a variety of diagrams or a content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

<Notes on Ordinal Numbers>

Ordinal numbers such as "first," "second," and "third" in this specification and the like are used in order to avoid confusion among components. Thus, the ordinal numbers do not limit the number of components. Furthermore, the ordinal numbers do not limit the order of components. In this specification and the like, for example, a "first" component in one embodiment can be referred to as a "second" component in other embodiments or claims. Furthermore, in this specification and the like, for example, a "first" component in one embodiment can be omitted in other embodiments or the scope of claims.

<Notes on Description for Drawings>

Embodiments are described with reference to drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted.

Moreover, in this specification and the like, terms for describing arrangement, such as "over" and "under," are used for convenience for describing the positional relation between components with reference to drawings. The positional relation between components is changed as appropriate in accordance with a direction in which the components are described. Thus, terms for describing arrangement are not limited to those described in this specification and can be rephrased as appropriate according to circumstances.

Furthermore, the term "over" or "under" does not necessarily mean that a component is placed directly above or directly below and in direct contact with another component. For example, the expression "electrode B over insulating layer A" does not necessarily mean that the electrode B is formed on and in direct contact with the insulating layer A and does not exclude the case where another component is provided between the insulating layer A and the electrode B.

In drawings, the size, the layer thickness, or the region is shown arbitrarily for description convenience. Therefore, they are not limited to the scale. Note that the drawings are schematically shown for clarity, and embodiments of the present invention are not limited to shapes or values shown in the drawings. For example, variation in signal, voltage, or current due to noise or variation in signal, voltage, or current due to difference in timing can be included.

In drawings such as a perspective view, illustration of some components might be omitted for clarity of the drawings.

Moreover, the same components or components having similar functions, components formed using the same material, components formed at the same time, or the like in the drawings are denoted by the same reference numerals in some cases, and the repeated description thereof is omitted in some cases.

<Notes on Expressions that can be Rephrased>

In this specification and the like, one of a source and a drain is denoted by "one of a source and a drain" (or a first electrode or a first terminal) and the other of the source and the drain is denoted by "the other of the source and the drain" (or a second electrode or a second terminal) in the description of the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate according to circumstances. In this specification and the like, the two terminals other than the gate may be referred to as a first terminal and a second terminal or as a third terminal and a fourth terminal. Furthermore, in the case where a transistor described in this specification and the like has two or more gates (such a structure is referred to as a multi-gate structure in some cases), these gates are referred to as a first gate and a second gate or as a front gate and a back gate in some cases. In particular, the term "front gate" can be replaced with a simple term "gate." The term "back gate" can be replaced with a simple term "gate." Note that a bottom gate is a terminal that is formed before a channel formation region in manufacture of a transistor, and a "top gate" is a terminal that is formed after a channel formation region in manufacture of a transistor.

A transistor has three terminals referred to as a gate, a source, and a drain. A gate is a terminal that functions as a control terminal that controls the conduction state of a transistor. Depending on the type of the transistor or levels of potentials supplied to the terminals, one of two input/output terminals functions as a source and the other functions as a drain. Therefore, the terms "source" and "drain" can be interchanged in this specification and the like.

In addition, in this specification and the like, the term "electrode" or "wiring" does not functionally limit a component. For example, an "electrode" is used as part of a "wiring" in some cases, and vice versa. Furthermore, the term "electrode" or "wiring" can also mean the case where a plurality of "electrodes" or "wirings" are formed in an integrated manner.

In this specification and the like, voltage and potential can be replaced with each other as appropriate. Voltage refers to a potential difference from a reference potential, and when the reference potential is a ground potential, for example, voltage can be replaced with potential. The ground potential does not necessarily mean 0 V. Note that potentials are relative, and the potential supplied to a wiring or the like is changed depending on the reference potential, in some cases.

Note that in this specification and the like, the terms "film," "layer," and the like can be interchanged with each other depending on the case or according to circumstances. For example, the term "conductive layer" can be changed into the term "conductive film" in some cases. Moreover, the term "insulating film" can be changed into the term "insulating layer" in some cases. Alternatively, the term "film," "layer," or the like is not used and can be interchanged with another term depending on the case or according to circumstances. For example, the term "conductive layer" or "conductive film" can be changed into the term "conductor" in some cases. Furthermore, for example, the term "insulating layer" or "insulating film" can be changed into the term "insulator" in some cases.

Note that in this specification and the like, the terms "wiring," "signal line," "power source line," and the like can be interchanged with each other depending on the case or according to circumstances. For example, the term "wiring" can be changed into the term "signal line" in some cases. Also, for example, the term "wiring" can be changed into the term "power source line" in some cases. Inversely, the term "signal line," "power source line," or the like can be changed into the term "wiring" in some cases. The term "power source line" or the like can be changed into the term "signal line" or the like in some cases. Inversely, the term "signal line" or the like can be changed into the term "power source line" or the like in some cases. The term "potential" that is applied to a wiring can be changed into the term "signal" or the like depending on the case or according to circumstances. Inversely, the term "signal" or the like can be changed into the term "potential" in some cases.

<Notes on Definitions of Terms>

Definitions of the terms mentioned in the above embodiments will be explained below.

<<Impurity in Semiconductor>>

An impurity in a semiconductor refers to, for example, an element other than the main components of a semiconductor layer. For example, an element with a concentration of lower than 0.1 atomic % is an impurity. If a semiconductor contains an impurity, formation of the DOS (Density of States) in the semiconductor, decrease in the carrier mobility, or decrease in the crystallinity may occur, for example. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components; specifically, there are hydrogen (contained also in water), lithium, sodium, silicon, boron, phosphorus, carbon, and nitrogen, for example. In the case of an oxide semiconductor, oxygen vacancies may be formed by entry of impurities such as hydrogen. Moreover, in the case where the semiconductor is a silicon layer, examples of an impurity which changes characteristics of the semiconductor include oxygen, Group 1 elements except hydrogen, Group 2 elements, Group 13 elements, and Group 15 elements.

<<Transistor>>

In this specification, a transistor is an element having at least three terminals including a gate, a drain, and a source. In addition, the transistor includes a channel formation region between the drain (a drain terminal, a drain region, or a drain electrode) and the source (a source terminal, a source region, or a source electrode). When a voltage higher than the threshold voltage is applied between the gate and the source, a channel is formed in the channel formation region and thus current can flow between the source and the drain.

Furthermore, functions of a source and a drain are sometimes interchanged with each other when transistors having different polarities are used or when the direction of current is changed in circuit operation, for example. Therefore, the terms "source" and "drain" can be interchanged in this specification and the like.

<<Switch>>

In this specification and the like, a switch is in a conduction state (on state) or in a non-conduction state (off state) to determine whether a current flows or not. Alternatively, a switch has a function of selecting and changing a current path.

Examples of the switch that can be used are an electrical switch, a mechanical switch, and the like. That is, a switch can be any element capable of controlling current, and is not limited to a certain element.

Examples of the electrical switch are a transistor (for example, a bipolar transistor or a MOS transistor), a diode (for example, a PN diode, a PIN diode, a Schottky diode, a MIM (Metal Insulator Metal) diode, a MIS (Metal Insulator Semiconductor) diode, or a diode-connected transistor), and a logic circuit in which such elements are combined.

Note that in the case of using a transistor as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of the mechanical switch is a switch formed using a MEMS (micro electro mechanical system) technology, such as a digital micromirror device (DMD). Such a switch includes an electrode which can be moved mechanically, and operates by controlling conduction and non-conduction with movement of the electrode.

<<Connection>>

In this specification and the like, a description X and Y are connected includes the case where X and Y are electrically connected, the case where X and Y are functionally connected, and the case where X and Y are directly connected. Accordingly, without being limited to a predetermined connection relation, for example, a connection relation shown in drawings or text, a connection relation other than the connection relation shown in drawings or text is also included.

Note that X, Y, and the like used here each denote an object (for example, a device, an element, a circuit, a wiring, an electrode, a terminal, a conductive film, or a layer).

For example, in the case where X and Y are electrically connected, one or more elements that enable electrical connection between X and Y (for example, a switch, a transistor, a capacitor, an inductor, a resistor, a diode, a display element, a light-emitting element, or a load) can be connected between X and Y. Note that the switch has a function of being controlled to be turned on or off. That is, the switch has a function of being in a conduction state (on state) or a non-conduction state (off state) to determine whether a current flows or not.

For example, in the case where X and Y are functionally connected, one or more elements that enable functional connection between X and Y (for example, a logic circuit (an inverter, a NAND circuit, a NOR circuit, or the like); a signal converter circuit (a DA converter circuit, an AD converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. Note that, for example, even when another circuit is interposed between X and Y, X and Y are functionally connected if a signal output from X is transmitted to Y.

Note that an explicit description, X and Y are electrically connected, includes the case where X and Y are electrically connected (that is, the case where X and Y are connected with another element or another circuit provided therebetween), the case where X and Y are functionally connected (that is, the case where X and Y are functionally connected with another circuit provided therebetween), and the case where X and Y are directly connected (that is, the case where X and Y are connected without another element or another circuit provided therebetween). That is, the explicit expression "X and Y are electrically connected" is the same as the explicit simple expression "X and Y are connected."

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y can be expressed as follows.

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order." Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order." Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order." When the connection order in a circuit configuration is defined by using an expression similar to these examples, a source (or a first terminal or the like) and a drain (or a second terminal or the like) of a transistor can be distinguished from each other to specify the technical scope. Note that these expressions are examples and expressions are not limited to these expressions. Here, each of X, Y, Z1, and Z2 denotes an object (for example, a device, an element, a circuit, a wiring, an electrode, a terminal, a conductive film, or a layer).

Note that even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes in its category such a case where one conductive film has functions of a plurality of components.

<<Parallel and Perpendicular>>

In this specification, "parallel" indicates a state where the angle formed between two straight lines is greater than or equal to −10° and less than or equal to 10°. Accordingly, the case where the angle is greater than or equal to −5° and less than or equal to 5° is also included. In addition, "substantially parallel" indicates a state where the angle formed between two straight lines is greater than or equal to −30° and less than or equal to 30°. In addition, "perpendicular" indicates a state where the angle formed between two straight lines is greater than or equal to 80° and less than or equal to 100°. Accordingly, the case where the angle is greater than or equal to 85° and less than or equal to 95° is also included. In addition, "substantially perpendicular" indicates a state where the angle formed between two straight lines is greater than or equal to 60° and less than or equal to 120°.

REFERENCE NUMERALS

AIE: encoder, AID: decoder, INL: input layer, OUL: output layer, ML1: intermediate layer, ML2: intermediate layer, ML3: intermediate layer, ML4: intermediate layer, IPT: input terminal, PT[1]: output terminal, PT[2]: output terminal, PT[s]: output terminal, PT[s+1]: output terminal, PT[s+2]: output terminal, PT[2s]: output terminal, PT[(t−1)m+1]: output terminal, PT[(t−1)m+2]: output terminal, PT[ts]: output terminal, RW[1]: wiring, RW[2]: wiring, RW[s]: wiring, RW[s+1]: wiring, RW[s+2]: wiring, RW[2s]: wiring, RW[(t−1)m+1]: wiring, RW[(t−1)m+2]: wiring, RW[ts]: wiring, HC[1]: retention circuit, HC[s]: retention circuit, HC[m]: retention circuit, HC[m+1]: retention circuit, HC[m+s]: retention circuit, HC[2m]: retention circuit, HC[(t−1)m+1]: retention circuit, HC[(t−1)m+s]: retention circuit, HC[tm]: retention circuit, PDL[1]: input terminal, PDL[l]: input terminal, PDR[1]: output terminal, PDR[n]: output terminal, PLE[1]: programmable logic element, PLE[m]: programmable logic element, SWC: switch circuit, PSW1: programmable switch, PSW2: programmable switch, PSW3: programmable switch, L[1]: wiring, L[2]: wiring, L[l]: wiring, R[1]: wiring, R[2]: wiring, R[m]: wiring, P[1]: wiring, P[2]: wiring, P[m]: wiring, Q[1]: wiring, Q[2]: wiring, Q[m]: wiring, In[1]: terminal, In[2]: terminal, In[s]: terminal, MLT[1]: multiplier circuit, MLT[s]: multiplier circuit, CMW[1]: configuration memory, CMW[s]: configuration memory, CMF: configuration memory, AD: adder circuit, FC: activation function circuit, KC: retention circuit, TA1: terminal, TA2: terminal, CKT: terminal, GNDL: wiring, TrA: transistor, TrB: transistor, CP: capacitor, AMP: amplifier, NL: NOT circuit, N: node, OUT: output terminal, q[1]: wiring, q[s]: wiring, r[1]: wiring, r[t]: wiring, OW: terminal, O[t]: terminal, SW: switch, X: wiring, CMS: configuration memory, MAC: product-sum operation circuit, CS: current supply circuit, CM: current mirror circuit, CA: memory cell array, AM[1]: memory cell, AM[2]: memory cell, AMref[1]: memory cell, AMref[2]: memory cell, WDD: circuit, CLD: circuit, WLD: circuit, OFST: offset circuit, ACTV: activation function circuit, BL: wiring, BLref: wiring, WD: wiring, WDref: wiring, IL: wiring, ILref: wiring, WL[1]: wiring, WL[2]: wiring, CL[1]: wiring, CL[2]: wiring, OL: wiring, NIL: , VR: wiring, VaL: wiring, VbL: wiring, VrefL: wiring, VDDL: wiring, VSSL: wiring, RST: wiring, Tr11: transistor, Tr12: transistor, Tr21: transistor, Tr22: transistor, Tr23: transistor, C1: capacitor, C2: capacitor, NM[1]: node, NM[2]: node, NMref[1]: node, NMref[2]: node, Na: node, Nb: node, T1: Time, T2: Time, T3: Time, T4: Time, T5: Time, T6: Time, T7: Time, T8: Time, T9: Time, 10: electronic device, 20: imaging device, 21: imaging portion, 22: interface, 22a: circuit, 24: control portion, 30: peripheral circuit, 31: GPU, 33: memory portion, 34: memory portion, 40: NN circuit, 50: display device, 71: circuit, 73: circuit, 74: circuit, 75: circuit, 80: NN circuit, 80A: NN circuit, 80B: NN circuit, 90: arithmetic processing circuit, 100: semiconductor device, 110: conductor, 112: conductor, 120: conductor, 130: insulator, 140: capacitor, 150: insulator, 156: conductor, 160: insulator, 166: conductor, 200: transistor, 201: transistor, 214: insulator, 216: insulator, 218: conductor, 220: insulator, 222: insulator, 224: insulator, 225: insulator, 246: conductor, 248: conductor, 280: insulator, 282: insulator, 286: insulator, 300: transistor, 310: conductor, 310a: conductor, 310b: conductor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 404: conductor, 404a: conductor, 404b: conductor, 405: conductor, 405a: conductor, 405b: conductor, 406: metal oxide, 406a: metal oxide, 406b: metal oxide, 406c: metal oxide, 412: insulator, 413: insulator, 418: insulator, 419: insulator, 420: insulator, 426a: region, 426b: region, 426c: region, 440: conductor, 440a: conductor, 440b: conductor, 450a: conductor, 450b: conductor, 451a: conductor, 451b: conductor, 452a: conductor, 452b: conductor, 911: housing, 912: display portion, 919: camera, 931: housing, 932: display portion, 933: wristband, 935: button, 936: crown, 939: camera, 951: housing, 952: lens, 953: support portion, 961: housing, 962: shutter button, 963: microphone, 965: lens, 967: light-emitting portion, 971: first housing, 972: second housing, 973: display portion, 974: operation key, 975: lens, 976: connection portion, 981: housing, 982: display portion, 983: operation button, 984: external connection port, 985: speaker, 986: microphone, 987: camera, 1050: photoelectric conversion element, 1051: transistor, 1052: transistor, 1053: transistor, 1054: transistor, 1056: power source, 1061: layer, 1062: layer, 1063: layer, 1065: electrode, 1066: photoelectric conversion portion, 1066a: layer, 1066b: layer, 1067: electrode, 1071: wiring, 1072: wiring, 1073: wiring, 1075: wiring, 1076: wiring, 1077: wiring, 1078: wiring, 1079: wiring, 1080: pixel, 1082: circuit, 1081: pixel array, 1083: circuit, 1084: circuit, 1085: circuit, 1091: back gate, 1092: partition, 1093: insulating layer, 1200: silicon substrate, 1201: silicon substrate, 1202: silicon substrate, 1210: semiconductor layer, 1220: insulating layer, 1300: insulating layer, 1310: light-blocking layer, 1320: organic resin layer, 1330: color filter, 1330a: color filter, 1330b: color filter, 1330c: color filter, 1340: microlens array, 1350: optical conversion layer, 1360: insulating layer, 1410: package substrate, 1411: package substrate, 1420: cover glass, 1421: lens cover, 1430: adhesive, 1435: lens, 1440: bump, 1441: land, 1450: image sensor chip, 1451: image sensor chip, 1460: electrode pad, 1461: electrode pad, 1470: wire, 1471: wire, 1490: IC chip

The invention claimed is:
1. An electronic device comprising:
an imaging device; and
a peripheral circuit, wherein the imaging device comprises:
an imaging portion comprising pixels arranged in n rows and m columns, wherein n and m are each an integer greater than or equal to 1;

a circuit including a shift register, the shift register comprising a plurality of retention circuits, an input terminal, and a plurality of output terminals; and
an encoder comprising a memory cell array and a first circuit that forms a first neural network,
wherein the peripheral circuit comprises:
a decoder comprising a second circuit that forms a second neural network; and
an image processing circuit,
wherein the imaging portion is configured to generate first image data by imaging and input the first image data to the input terminal of the shift register pixel by pixel,
wherein the output terminals of the shift register are electrically connected to the memory cell array,
wherein the first circuit comprises a plurality of first programmable logic elements and a plurality of first programmable switches,
wherein the first circuit is configured to conduct feature extraction on the first image data to generate second image data by sequentially switching connection state between the plurality of first programmable logic elements and the plurality of first programmable switches,
wherein the second circuit is electrically connected to the first circuit and configured to conduct decompression processing on the second image data to generate third image data,
wherein the image processing circuit is electrically connected to the second circuit,
wherein a number of wirings electrically connecting the first circuit and the second circuit is smaller than a number of wirings electrically connecting the second circuit and the image processing circuit,
wherein the first neural network is configured to perform convolution processing using a weight filter and the first image data, and
wherein the memory cell array is configured to store a filter value of the weight filter.

2. The electronic device according to claim 1,
wherein the shift register is configured to output the first image data to the memory cell array sequentially for every pixel region of the imaging portion,
wherein the pixel region comprises pixels arranged in t rows and s columns, and
wherein t is an integer greater than or equal to 1 and less than or equal to n, and s is an integer greater than or equal to 1 and less than or equal to m.

3. The electronic device according to claim 1,
wherein the memory cell array comprises a first transistor, and
wherein the first transistor comprises a metal oxide in a channel formation region.

4. The electronic device according to claim 1, further comprising a display device electrically connected to the image processing circuit.

5. The electronic device according to claim 1, wherein the image processing circuit is configured to perform at least one of dimming processing and toning processing on the third image data.

6. An electronic device comprising:
an imaging device; and
a peripheral circuit,
wherein the imaging device comprises:
an imaging portion comprising pixels arranged in n rows and m columns, wherein n and m are each an integer greater than or equal to 1;
a circuit including a shift register, the shift register comprising a plurality of retention circuits; and
an encoder comprising a memory cell array and a first circuit that forms a first neural network,
wherein the peripheral circuit comprises:
a decoder comprising a second circuit that forms a second neural network; and
an image processing circuit,
wherein the imaging portion is configured to generate first image data by imaging and input the first image data to the shift register pixel by pixel,
wherein a plurality of output terminals of the shift register are electrically connected to the memory cell array,
wherein the first circuit is configured to conduct feature extraction on the first image data to generate second image data,
wherein the second circuit is electrically connected to the first circuit and configured to conduct decompression processing on the second image data to generate third image data,
wherein the image processing circuit is electrically connected to the second circuit,
wherein a number of wirings electrically connecting the first circuit and the second circuit is smaller than a number of wirings electrically connecting the second circuit and the image processing circuit,
wherein the first neural network is configured to perform convolution processing using a weight filter and the first image data, and
wherein the memory cell array is configured to store a filter value of the weight filter.

7. The electronic device according to claim 6,
wherein the shift register is configured to output the first image data to the memory cell array sequentially for every pixel region of the imaging portion,
wherein the pixel region comprises pixels arranged in t rows and s columns, and
wherein t is an integer greater than or equal to 1 and less than or equal to n, and s is an integer greater than or equal to 1 and less than or equal to m.

8. The electronic device according to claim 6,
wherein the memory cell array comprises a first transistor, and
wherein the first transistor comprises a metal oxide in a channel formation region.

9. The electronic device according to claim 6, further comprising a display device electrically connected to the peripheral circuit.

* * * * *